US012736874B2

(12) United States Patent
Kanakasabapathy et al.

(10) Patent No.: US 12,736,874 B2
(45) Date of Patent: Sep. 15, 2026

(54) APPARATUS AND PROCESS FOR EUV DRY RESIST SENSITIZATION BY GAS PHASE INFUSION OF A SENSITIZER

(71) Applicant: Lam Research Corporation, Fremont, CA (US)

(72) Inventors: Sivananda Krishnan Kanakasabapathy, Pleasanton, CA (US); Samantha S.H. Tan, Newark, CA (US); Jengyi Yu, San Ramon, CA (US); Younghee Lee, Pleasanton, CA (US); Alan J. Jensen, Mountain House, CA (US); Da Li, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 756 days.

(21) Appl. No.: 17/905,754

(22) PCT Filed: Mar. 24, 2021

(86) PCT No.: PCT/US2021/023901
§ 371 (c)(1),
(2) Date: Sep. 6, 2022

(87) PCT Pub. No.: WO2021/202198
PCT Pub. Date: Oct. 7, 2021

(65) Prior Publication Data

US 2024/0192590 A1 Jun. 13, 2024

Related U.S. Application Data

(60) Provisional application No. 63/003,100, filed on Mar. 31, 2020.

(51) Int. Cl.
*G03F 7/004* (2006.01)
*G03F 7/16* (2006.01)
(Continued)

(52) U.S. Cl.
CPC ............ *G03F 7/0042* (2013.01); *G03F 7/167* (2013.01); *G03F 7/2004* (2013.01); *H10P 76/2041* (2026.01)

(58) Field of Classification Search
CPC ..................................................... G03F 7/0042
See application file for complete search history.

(56) References Cited

U.S. PATENT DOCUMENTS 3,513,010 A 5/1970 Notley et al.
3,529,963 A 9/1970 Marchese et al.
(Continued)

FOREIGN PATENT DOCUMENTS

CN 1495861 A 5/2004
CN 1841201 A 10/2006
(Continued)

OTHER PUBLICATIONS

Waard et al, Observations on Implanted Xenon-133 Sources, Proceedings of the Royal Society of London. Series A, Mathematical and Physical Sciences, vol. 311, No. 1504, A Discussion on Ion Implantation and Hyperfine Interactions (Jun. 24, 1969), pp. 139-150 (Year: 1969).*

(Continued)

*Primary Examiner* — Amanda C. Walke
(74) *Attorney, Agent, or Firm* — Weaver Austin Villeneuve & Sampson LLP

(57) ABSTRACT

The present disclosure relates to stacks having a sensitized resist film, as well as methods and apparatuses for applying such sensitized films. In particular embodiments, the sensitizer can be provided in gas form, and unreacted sensitizer precursors can be recovered after a deposition step.

3 Claims, 9 Drawing Sheets

(51) Int. Cl.
*G03F 7/20* (2006.01)
*H10P 76/20* (2026.01)

(56) References Cited

U.S. PATENT DOCUMENTS 3,576,755 A 4/1971 Patella et al.
3,720,515 A 3/1973 Stanley
4,241,165 A 12/1980 Hughes et al.
4,314,022 A 2/1982 Fisch
4,328,298 A 5/1982 Nester
4,590,149 A 5/1986 Nakane et al.
4,806,456 A 2/1989 Katoh
4,814,243 A 3/1989 Ziger
4,834,834 A 5/1989 Ehrlich et al.
4,842,989 A 6/1989 Taniguchi et al.
4,845,053 A 7/1989 Zajac
4,940,854 A 7/1990 Debe
4,956,204 A 9/1990 Amazawa et al.
5,077,085 A 12/1991 Schnur et al.
5,079,600 A 1/1992 Schnur et al.
5,108,875 A 4/1992 Thackeray et al.
5,322,765 A 6/1994 Clecak et al.
5,399,464 A 3/1995 Lee
5,534,312 A 7/1996 Hill et al.
5,761,023 A 6/1998 Lue et al.
5,798,203 A 8/1998 Haraguchi et al.
5,925,494 A 7/1999 Horn
6,017,553 A 1/2000 Burrell et al.
6,045,877 A 4/2000 Gleason et al.
6,162,577 A 12/2000 Felter et al.
6,171,758 B1 1/2001 Bhateja et al.
6,179,922 B1 1/2001 Ishikawa et al.
6,183,934 B1 2/2001 Kawamonzen
6,245,650 B1 6/2001 Watanabe
6,261,938 B1 7/2001 Beauvais et al.
6,290,779 B1 9/2001 Saleh et al.
6,348,239 B1 2/2002 Hill et al.
6,410,421 B1 6/2002 Ghandehari et al.
6,566,276 B2 5/2003 Maloney et al.
6,573,030 B1 6/2003 Fairbairn et al.
6,607,867 B1 8/2003 Kim et al.
6,797,439 B1 9/2004 Alpay
6,833,306 B2 12/2004 Lyding et al.
6,841,341 B2 1/2005 Fairbairn et al.
7,223,526 B2 5/2007 Fairbairn et al.
7,232,742 B1 6/2007 Maekawa
7,307,695 B2 12/2007 Hazenberg et al.
7,335,462 B2 2/2008 Fairbairn et al.
7,608,367 B1 10/2009 Aigeldinger et al.
7,797,367 B1 9/2010 Gelvin et al.
8,383,316 B2 2/2013 Cooper et al.
8,465,903 B2 6/2013 Weidman et al.
8,536,068 B2 9/2013 Weidman et al.
8,664,124 B2 3/2014 Graff
8,664,513 B2 3/2014 Pfenninger et al.
8,703,386 B2 4/2014 Bass et al.
9,023,731 B2 5/2015 Ji et al.
9,261,784 B2 2/2016 Wuister et al.
9,310,684 B2 4/2016 Meyers et al.
9,551,924 B2 1/2017 Burkhardt et al.
9,632,411 B2 4/2017 Michaelson et al.
9,719,169 B2 8/2017 Mohn et al.
9,778,561 B2 10/2017 Marks et al.
9,823,564 B2 11/2017 Stowers et al.
9,996,004 B2 6/2018 Smith et al.
10,025,179 B2 7/2018 Meyers et al.
10,228,618 B2 3/2019 Meyers et al.
10,416,554 B2 9/2019 Meyers et al.
10,461,229 B1 10/2019 West et al.
10,514,598 B2 12/2019 Marks et al.
10,580,585 B2 3/2020 Snaith et al.
10,627,719 B2 4/2020 Waller et al.
10,642,153 B2 5/2020 Meyers et al.
10,649,328 B2 5/2020 Stowers et al.
10,732,505 B1 8/2020 Meyers et al.
10,775,696 B2 9/2020 Meyers et al.
10,782,610 B2 9/2020 Stowers et al.
10,787,466 B2 9/2020 Edson et al.
10,831,096 B2 11/2020 Marks et al.
11,209,729 B2 12/2021 Marks et al.
11,314,168 B2 4/2022 Tan et al.
11,358,975 B2 6/2022 Ermert et al.
11,921,427 B2 3/2024 Weidman et al.
11,988,965 B2 5/2024 Tan et al.
12,105,422 B2 10/2024 Tan et al.
12,436,464 B2 10/2025 Weidman et al.
2002/0015855 A1 2/2002 Sajoto et al.
2002/0017243 A1 2/2002 Pyo
2002/0018855 A1 2/2002 Damrau
2002/0123221 A1 9/2002 Jost et al.
2002/0180372 A1 12/2002 Yamazaki
2003/0008246 A1 1/2003 Cheng et al.
2003/0049571 A1 3/2003 Hallock et al.
2003/0183244 A1 10/2003 Rossman
2004/0113087 A1 6/2004 Ikeda et al.
2004/0121264 A1 6/2004 Liegl et al.
2004/0175631 A1 9/2004 Crocker et al.
2004/0191423 A1 9/2004 Ruan et al.
2004/0203256 A1 10/2004 Yang et al.
2004/0209201 A1 10/2004 Nakano et al.
2004/0213563 A1 10/2004 Irie
2004/0241561 A1 12/2004 Chen et al.
2005/0120955 A1 6/2005 Yamasaki et al.
2005/0167617 A1 8/2005 Derra et al.
2005/0208389 A1 9/2005 Ishibashi et al.
2005/0250052 A1 11/2005 Nguyen
2005/0253077 A1 11/2005 Ikeda et al.
2005/0257747 A1 11/2005 Wakabayashi et al.
2006/0001064 A1 1/2006 Hill et al.
2006/0068173 A1 3/2006 Kajiyama et al.
2006/0128127 A1 6/2006 Seo et al.
2006/0147818 A1 7/2006 Lee
2006/0151462 A1 7/2006 Lee et al.
2006/0166537 A1 7/2006 Thompson et al.
2006/0175558 A1 8/2006 Bakker et al.
2007/0017386 A1 1/2007 Kamei
2007/0037357 A1 2/2007 Culp
2007/0074541 A1 4/2007 Badding et al.
2007/0109989 A1 5/2007 Nakagawa et al.
2007/0181816 A1 8/2007 Ikeda et al.
2007/0287073 A1 12/2007 Goodwin
2008/0004203 A1 1/2008 Scheuing et al.
2008/0131616 A1 6/2008 Besson et al.
2008/0157011 A1 7/2008 Nagai et al.
2008/0236620 A1 10/2008 Shih et al.
2009/0041650 A1 2/2009 Watanabe et al.
2009/0130859 A1 5/2009 Itatani et al.
2009/0134119 A1 5/2009 Matsumaru et al.
2009/0153826 A1 6/2009 Sewell et al.
2009/0208880 A1 8/2009 Nemani et al.
2009/0239155 A1 9/2009 Levinson et al.
2009/0305174 A1 12/2009 Shiobara et al.
2009/0325387 A1 12/2009 Chen et al.
2010/0051446 A1 3/2010 Wang et al.
2010/0075508 A1 3/2010 Seino et al.
2010/0099267 A1 4/2010 Wang et al.
2010/0131093 A1 5/2010 Yokoyama et al.
2010/0197135 A1 8/2010 Ishizaka
2010/0209855 A1 8/2010 Tanaka
2010/0266969 A1 10/2010 Shiraishi et al.
2010/0304027 A1 12/2010 Lee et al.
2010/0310790 A1 12/2010 Chang et al.
2011/0028000 A1 2/2011 Rogojina et al.
2011/0104595 A1 5/2011 Hayashi et al.
2011/0117702 A1 5/2011 Rietzler et al.
2011/0174606 A1 7/2011 Funk et al.
2011/0184139 A1 7/2011 Malik et al.
2011/0195362 A1 8/2011 Watanabe et al.
2011/0198756 A1 8/2011 Thenappan et al.
2011/0209725 A1 9/2011 Kim et al.
2011/0244402 A1 10/2011 Carcasi et al.
2011/0244681 A1 10/2011 Blasco et al.
2011/0308942 A1 12/2011 Liu et al.
2012/0024388 A1 2/2012 Burrows et al.

(56) References Cited

U.S. PATENT DOCUMENTS

2012/0088193 A1 4/2012 Weidman et al.
2012/0088369 A1 4/2012 Weidman et al.
2012/0090547 A1 4/2012 Wang et al.
2012/0161405 A1 6/2012 Mohn et al.
2012/0183689 A1 7/2012 Suzuki et al.
2012/0202357 A1 8/2012 Sato et al.
2012/0208125 A1 8/2012 Hatakeyama
2012/0215874 A1 8/2012 Sequeira et al.
2012/0223418 A1 9/2012 Stowers et al.
2012/0322011 A1 12/2012 Wu et al.
2013/0129995 A1 5/2013 Ouattara et al.
2013/0157177 A1 6/2013 Yu et al.
2013/0164691 A1 6/2013 Shiobara
2013/0183609 A1 7/2013 Seon et al.
2013/0224652 A1 8/2013 Bass et al.
2013/0273733 A1 10/2013 Tang et al.
2014/0014745 A1 1/2014 Burrows et al.
2014/0170563 A1 6/2014 Hatakeyama
2014/0170853 A1 6/2014 Shamma et al.
2014/0206200 A1 7/2014 Nelson
2014/0209015 A1 7/2014 Yamada et al.
2014/0220495 A1 8/2014 Bozano et al.
2014/0239462 A1 8/2014 Shamma et al.
2014/0263172 A1 9/2014 Xie et al.
2014/0268082 A1 9/2014 Michaelson et al.
2014/0272726 A1 9/2014 Chang
2015/0056542 A1 2/2015 Meyers et al.
2015/0079393 A1 3/2015 Freedman et al.
2015/0096494 A1 4/2015 Nishiura et al.
2015/0125679 A1 5/2015 Ishikawa
2015/0152551 A1 6/2015 Yamaguchi et al.
2015/0160965 A1 6/2015 Archer et al.
2015/0167170 A1 6/2015 Ranade et al.
2015/0194343 A1 7/2015 Chi et al.
2015/0221519 A1 8/2015 Marks et al.
2015/0303064 A1 10/2015 Singer et al.
2016/0011505 A1 1/2016 Stowers et al.
2016/0011516 A1 1/2016 Devilliers
2016/0035631 A1 2/2016 Lee et al.
2016/0086864 A1 3/2016 Fischer et al.
2016/0116839 A1 4/2016 Meyers et al.
2016/0216606 A1 7/2016 Meyers et al.
2016/0284559 A1 9/2016 Kikuchi et al.
2016/0357103 A1 12/2016 Nagahara et al.
2016/0357107 A1 12/2016 Buchberger, Jr. et al.
2017/0010535 A1 1/2017 Fujitani et al.
2017/0066225 A1 3/2017 Chen et al.
2017/0068174 A1 3/2017 Michaelson et al.
2017/0084475 A1 3/2017 Wagner et al.
2017/0092495 A1 3/2017 Chen et al.
2017/0097569 A1 4/2017 Yang et al.
2017/0097570 A1 4/2017 Tagawa
2017/0102612 A1 4/2017 Meyers et al.
2017/0146909 A1* 5/2017 Smith .................. G03F 7/0042
2017/0154766 A1 6/2017 Ogihara et al.
2017/0167024 A1 6/2017 Wiltse et al.
2017/0168398 A1 6/2017 Zi et al.
2017/0176858 A1 6/2017 Hirano
2017/0184961 A1 6/2017 Nakagawa et al.
2017/0261850 A1 9/2017 Stowers et al.
2017/0330787 A1 11/2017 Mitsunaga et al.
2018/0004083 A1 1/2018 Marks et al.
2018/0012759 A1 1/2018 Smith et al.
2018/0039172 A1 2/2018 Stowers et al.
2018/0039182 A1 2/2018 Zi et al.
2018/0046086 A1 2/2018 Waller et al.
2018/0096840 A1 4/2018 Jeong et al.
2018/0122648 A1 5/2018 Kim et al.
2018/0149976 A1 5/2018 Liu et al.
2018/0164689 A1 6/2018 Sano et al.
2018/0166278 A1 6/2018 Belyansky et al.
2018/0173096 A1 6/2018 Zi et al.
2018/0204727 A1 7/2018 Hee et al.
2018/0224744 A1 8/2018 Bae et al.
2018/0233362 A1 8/2018 Glodde et al.
2018/0233398 A1 8/2018 Van Cleemput et al.
2018/0294155 A1 10/2018 Soppera et al.
2018/0307137 A1 10/2018 Meyers et al.
2018/0308687 A1 10/2018 Smith et al.
2018/0314167 A1 11/2018 Chang et al.
2018/0337243 A1 11/2018 Li et al.
2018/0354804 A1 12/2018 Venkatasubramanian et al.
2018/0356731 A1 12/2018 Tagawa
2019/0056914 A1 2/2019 Ma et al.
2019/0088521 A1 3/2019 Chua et al.
2019/0094685 A1 3/2019 Marks et al.
2019/0129307 A1 5/2019 Kwon et al.
2019/0137870 A1 5/2019 Meyers et al.
2019/0146337 A1 5/2019 Zi et al.
2019/0153001 A1 5/2019 Cardineau et al.
2019/0163056 A1* 5/2019 Maes .................... G03F 7/0042
2019/0163065 A1 5/2019 Hatakeyama et al.
2019/0172714 A1 6/2019 Bobek et al.
2019/0187556 A1 6/2019 Park et al.
2019/0258160 A1* 8/2019 Satoh .................... G03F 7/0757
2019/0259601 A1 8/2019 De Silva et al.
2019/0308998 A1 10/2019 Cardineau et al.
2019/0315781 A1 10/2019 Edson et al.
2019/0315782 A1 10/2019 Edson et al.
2019/0333777 A1 10/2019 Hsieh et al.
2019/0348292 A1 11/2019 Dutta et al.
2019/0352776 A1 11/2019 Parikh
2019/0369489 A1 12/2019 Meyers et al.
2019/0382890 A1 12/2019 Lerner et al.
2019/0391486 A1 12/2019 Jiang et al.
2020/0041901 A1 2/2020 Namgung et al.
2020/0050109 A1 2/2020 Ho et al.
2020/0064733 A1 2/2020 Meyers et al.
2020/0066536 A1 2/2020 Yaegashi
2020/0089102 A1 3/2020 Chen et al.
2020/0089104 A1 3/2020 Marks et al.
2020/0096870 A1* 3/2020 Ma ........................ G03F 7/2004
2020/0124970 A1 4/2020 Kocsis et al.
2020/0133131 A1 4/2020 Ouyang
2020/0157683 A1 5/2020 Kato et al.
2020/0174374 A1 6/2020 Liao et al.
2020/0176246 A1 6/2020 Huotari et al.
2020/0209756 A1 7/2020 Waller et al.
2020/0239498 A1 7/2020 Clark et al.
2020/0241413 A1 7/2020 Clark et al.
2020/0257196 A1 8/2020 Meyers et al.
2020/0292937 A1 9/2020 Stowers et al.
2020/0326627 A1 10/2020 Jiang et al.
2021/0013034 A1 1/2021 Wu et al.
2021/0013037 A1 1/2021 Sun et al.
2021/0041784 A1 2/2021 Chen et al.
2021/0063871 A1* 3/2021 Kobayashi ............ G03F 7/0042
2021/0111025 A1 4/2021 Zyulkov et al.
2021/0216016 A1 7/2021 Tagawa
2021/0271170 A1 9/2021 Telecky et al.
2021/0302833 A1 9/2021 Weng et al.
2021/0349390 A1 11/2021 De Schepper et al.
2021/0397085 A1 12/2021 Weidman et al.
2022/0020584 A1 1/2022 Volosskiy et al.
2022/0035247 A1 2/2022 Tan et al.
2022/0037152 A1 2/2022 Raley et al.
2022/0043334 A1 2/2022 Tan et al.
2022/0075260 A1 3/2022 Marks et al.
2022/0244645 A1 8/2022 Tan et al.
2022/0299877 A1* 9/2022 Weidman ................ G03F 7/168
2022/0308454 A1 9/2022 Weidman et al.
2022/0308462 A1 9/2022 Berney et al.
2022/0317572 A1* 10/2022 Meijer .................. G03F 7/2004
2022/0342301 A1 10/2022 Weidman et al.
2022/0365434 A1 11/2022 Nardi et al.
2023/0031955 A1 2/2023 Yu et al.
2023/0107357 A1 4/2023 Dictus et al.
2023/0152705 A1 5/2023 Grzeskowiak et al.
2023/0185196 A1 6/2023 Weidman et al.
2023/0230811 A1 7/2023 Yu et al.
2023/0259025 A1 8/2023 Hansen et al.
2023/0266662 A1 8/2023 Marks et al.
2023/0266664 A1 8/2023 Hansen et al.
2023/0266670 A1 8/2023 Hansen et al.

(56) References Cited

U.S. PATENT DOCUMENTS

2023/0273516 A1 8/2023 Marks et al.
2023/0288798 A1 9/2023 Hansen et al.
2023/0314946 A1 10/2023 Hansen et al.
2023/0341781 A1 10/2023 Han et al.
2024/0036474 A1 2/2024 Peter et al.
2024/0045332 A1* 2/2024 Tapily .................... G03F 7/038
2024/0231224 A9 7/2024 Weidman et al.
2024/0302739 A1 9/2024 Kanakasabapathy et al.
2024/0329539 A1 10/2024 Tan et al.
2025/0053080 A1 2/2025 Marks et al.
2025/0053084 A1 2/2025 Hansen et al.
2025/0093781 A1 3/2025 Peter et al.
2025/0201553 A1 6/2025 Wu et al.
2025/0244678 A1 7/2025 Lee et al.
2025/0271766 A1 8/2025 Hansen et al.
2025/0291253 A1 9/2025 Berney et al.
2025/0346767 A1 11/2025 Vrtis et al.

FOREIGN PATENT DOCUMENTS

CN 101098575 A 1/2008
CN 101828266 A 9/2010
CN 102610516 A 7/2012
CN 104637792 A 5/2015
CN 105047541 A 11/2015
CN 105489635 A 4/2016
CN 105579906 A 5/2016
CN 106558477 A 4/2017
CN 106876251 A 6/2017
CN 107153326 A 9/2017
CN 108351594 A 7/2018
CN 108388079 A 8/2018
CN 109154777 A 1/2019
CN 109521657 A 3/2019
CN 109976097 A 7/2019
CN 110609441 A 12/2019
CN 111258190 A 6/2020
CN 112327577 A 2/2021
CN 113039486 A 6/2021
CN 116009357 A 4/2023
EP 0819780 A2 1/1998
EP 1253629 A2 10/2002
EP 1123423 B1 8/2007
EP 3230294 A1 10/2017
EP 3451059 A1 3/2019
EP 3596155 B1 8/2022
JP S52144972 A 12/1977
JP S5883847 A 5/1983
JP S6347364 A 2/1988
JP H01220829 A 9/1989
JP H03228327 A 10/1991
JP H04284620 A 10/1992
JP H0572747 A 3/1993
JP H0745580 A 2/1995
JP H0757995 A 3/1995
JP H07106224 A 4/1995
JP H07244386 A 9/1995
JP H0831781 A 2/1996
JP H08330288 A 12/1996
JP H08339950 A 12/1996
JP H10172957 A 6/1998
JP H10301298 A 11/1998
JP 2000223461 A 8/2000
JP 2001203170 A 7/2001
JP 2001235875 A 8/2001
JP 2001250813 A 9/2001
JP 2002030445 A 1/2002
JP 2002231603 A 8/2002
JP 2003213001 A 7/2003
JP 2003532303 A 10/2003
JP 2004006798 A 1/2004
JP 2005504146 A 2/2005
JP 2005123651 A 5/2005
JP 2005317652 A 11/2005
JP 2006253282 A 9/2006
JP 2007114255 A 5/2007
JP 2008091215 A 4/2008
JP 2009192350 A 8/2009
JP 2010074065 A 4/2010
JP 2010531931 A 9/2010
JP 2010239087 A 10/2010
JP 2010245327 A 10/2010
JP 2011511476 A 4/2011
JP 2011099956 A 5/2011
JP 2011520242 A 7/2011
JP 2011253185 A 12/2011
JP 2011529126 A 12/2011
JP 2012173315 A 9/2012
JP 2012185485 A 9/2012
JP 5055743 B2 10/2012
JP 2013096011 A 5/2013
JP 2013135066 A 7/2013
JP 2013542944 A 11/2013
JP 2014512458 A 5/2014
JP 2014146767 A 8/2014
JP 2014521111 A 8/2014
JP 2014159625 A 9/2014
JP 2015513540 A 5/2015
JP 2015105405 A 6/2015
JP 2015108781 A 6/2015
JP 2015201622 A 11/2015
JP 2016037656 A 3/2016
JP 2016517633 A 6/2016
JP 2016529330 A 9/2016
JP 2016530565 A 9/2016
JP 2017014602 A 1/2017
JP 2017016069 A 1/2017
JP 2017500448 A 1/2017
JP 2017108053 A 6/2017
JP 2017116923 A 6/2017
JP 2017208374 A 11/2017
JP 2017532407 A 11/2017
JP 2017228596 A 12/2017
JP 2018006742 A 1/2018
JP 2018502173 A 1/2018
JP 2018017780 A 2/2018
JP 2018098229 A 6/2018
JP 2018518688 A 7/2018
JP 2019500490 A 1/2019
JP 2019506730 A 3/2019
JP 2019095794 A 6/2019
JP 2019532182 A 11/2019
JP 2020021071 A 2/2020
JP 2020129607 A 8/2020
JP 2021005737 A 1/2021
JP 2021523403 A 9/2021
JP 2021528676 A 10/2021
JP 2022502714 A 1/2022
KR 910001190 B1 2/1991
KR 920016947 A 9/1992
KR 100398312 B1 9/2003
KR 20060066602 A 6/2006
KR 20090042059 A 4/2009
KR 20110132288 A 12/2011
KR 20120093781 A 8/2012
KR 20130093038 A 8/2013
KR 20140047120 A 4/2014
KR 20140106442 A 9/2014
KR 20140121826 A 10/2014
KR 20150008065 A 1/2015
KR 20150129781 A 11/2015
KR 20160082969 A 7/2016
KR 20170000361 A 1/2017
KR 20170066225 A 6/2017
KR 20180054917 A 5/2018
KR 20190003528 A 1/2019
KR 20190060678 A 6/2019
KR 20190074018 A 6/2019
KR 20190134327 A 12/2019
KR 20190139594 A 12/2019
KR 20200014185 A 2/2020
KR 20200022046 A 3/2020
KR 20200079731 A 7/2020
KR 20200144580 A 12/2020

(56) References Cited

FOREIGN PATENT DOCUMENTS

| | | | | |
|---|---|---|---|---|
| KR | 20210128796 A | | 10/2021 | |
| KR | 20220155111 A | * | 11/2022 | ............. H10P 50/71 |
| TW | 200947117 A | | 11/2009 | |
| TW | 201140230 A | | 11/2011 | |
| TW | 1365354 B | | 6/2012 | |
| TW | 201222144 A | | 6/2012 | |
| TW | 201224190 A | | 6/2012 | |
| TW | 201241555 A | | 10/2012 | |
| TW | 201305736 A | | 2/2013 | |
| TW | 201327057 A | | 7/2013 | |
| TW | 201330093 A | | 7/2013 | |
| TW | 201348492 A | | 12/2013 | |
| TW | 201430164 A | | 8/2014 | |
| TW | 201502696 A | | 1/2015 | |
| TW | I494689 B | | 8/2015 | |
| TW | 201539538 A | | 10/2015 | |
| TW | 201539539 A | | 10/2015 | |
| TW | 201631377 A | | 9/2016 | |
| TW | 201721711 A | | 6/2017 | |
| TW | 201729006 A | | 8/2017 | |
| TW | 201734025 A | | 10/2017 | |
| TW | 201734667 A | | 10/2017 | |
| TW | 201811876 A | | 4/2018 | |
| TW | 201826034 A | | 7/2018 | |
| TW | 201835226 A | | 10/2018 | |
| TW | 201903191 A | | 1/2019 | |
| TW | 201903886 A | | 1/2019 | |
| TW | 201907445 A | | 2/2019 | |
| TW | 201930323 A | | 8/2019 | |
| TW | 201931011 A | | 8/2019 | |
| TW | 201937545 A | | 9/2019 | |
| TW | 202001993 A | | 1/2020 | |
| TW | 202006168 A | | 2/2020 | |
| TW | 202117468 A | | 5/2021 | |
| WO | WO-03029015 A2 | | 4/2003 | |
| WO | WO-2004007797 A1 | | 1/2004 | |
| WO | WO-2004095551 A1 | | 11/2004 | |
| WO | WO-2007058120 A1 | | 5/2007 | |
| WO | WO-2007123539 A1 | | 11/2007 | |
| WO | WO-2008139621 A1 | | 11/2008 | |
| WO | WO-2011081151 A1 | | 7/2011 | |
| WO | WO-2012048094 A3 | | 7/2012 | |
| WO | WO-2013119134 A1 | * | 8/2013 | ........... G03F 7/2053 |
| WO | WO-2013128313 A1 | | 9/2013 | |
| WO | WO-2013146595 A1 | | 10/2013 | |
| WO | WO-2014152023 A1 | | 9/2014 | |
| WO | WO-2015088613 A1 | | 6/2015 | |
| WO | WO-2016043200 A1 | | 3/2016 | |
| WO | WO-2016065120 A1 | | 4/2016 | |
| WO | WO-2016144960 A1 | | 9/2016 | |
| WO | WO-2016158864 A1 | | 10/2016 | |
| WO | WO-2017002497 A1 | | 1/2017 | |
| WO | WO-2017066319 A2 | | 4/2017 | |
| WO | WO-2017169440 A1 | | 10/2017 | |
| WO | WO-2017198418 A1 | | 11/2017 | |
| WO | WO-2017207452 A1 | | 12/2017 | |
| WO | WO-2018004551 A1 | | 1/2018 | |
| WO | WO-2018061670 A1 | | 4/2018 | |
| WO | WO-2018173446 A1 | | 9/2018 | |
| WO | WO-2019023797 A1 | | 2/2019 | |
| WO | WO-2019059074 A1 | | 3/2019 | |
| WO | WO-2019125952 A1 | | 6/2019 | |
| WO | WO-2019199467 A1 | | 10/2019 | |
| WO | WO-2019217749 A1 | | 11/2019 | |
| WO | WO-2020030855 A2 | | 2/2020 | |
| WO | WO-2020050035 A1 | | 3/2020 | |
| WO | WO-2020102085 A1 | | 5/2020 | |
| WO | WO-2020132281 A1 | | 6/2020 | |
| WO | WO-2020190941 A1 | | 9/2020 | |
| WO | WO-2020263750 A1 | | 12/2020 | |
| WO | WO-2020264158 A1 | | 12/2020 | |
| WO | WO-2020264556 A1 | | 12/2020 | |
| WO | WO-2020264571 A1 | | 12/2020 | |
| WO | WO-2021072042 A1 | | 4/2021 | |
| WO | WO-2021202681 A1 | | 10/2021 | |
| WO | WO-2021262529 A1 | | 12/2021 | |
| WO | WO-2022006349 A1 | | 1/2022 | |
| WO | WO-2022016128 A1 | | 1/2022 | |
| WO | WO-2022173632 A1 | | 8/2022 | |

OTHER PUBLICATIONS

Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.

Chinese First Office Action dated May 24, 2017 issued in Application No. CN 201510053668.7.

Chinese Second Office Action dated Feb. 28, 2018 issued in Application No. CN 201510053668.7.

CN Office Action dated Jun. 8, 2022 in Application No. CN202180002531.2 With English Translation.

Coons et al., (2010) "Comparison of EUV spectral and ion emission features from laser- produced Sn and Li plasmas," Extreme Ultraviolet (EUV) Lithography, Proc. Of SPIE, 7636:763636-1 to 763636-7.

Co-pending U.S. Appl. No. 17/596,858, filed Dec. 20, 2021.

Co-pending U.S. Appl. No. 17/596,928, filed Dec. 21, 2021.

Co-pending U.S. Appl. No. 17/754,019, filed Mar. 21, 2022.

European Search Report dated Feb. 15, 2022, in Application No. EP21741104.

European Office Action dated Feb. 25, 2022 in Application No. 21741104.

Extended European Search Report dated Dec. 23, 2021, in Application No. EP19800353.5.

Gerritsen et al., (Apr. 1, 1986) "Laser-generated plasma as soft x-ray source," J. Appl. Phys., 59(7):2337-2344.

Hamley, I.W., "Nanostructure fabrication using block copolymers", Nanotechnology. Sep. 2003. 17;14(10):R39-R54.

Hench, L.L. and West, J.K., "The sol-gel process," Chemical reviews, Jan. 1, 1990; 90(1) pp. 33-72.

International Preliminary Report on Patentability dated Oct. 13, 2022, in PCT Application No. PCT/US2021/023493.

International Search Report and Written Opinion dated Aug. 4, 2021, in PCT Application No. PCT/US2021/023493.

International Search Report and Written Opinion dated Mar. 4, 2022, in Application No. PCT/US2021/058647.

International Search Report and Written Opinion dated Oct. 8, 2020 in Application No. WO2020US38968.

International Preliminary Report on Patentability dated Jul. 1, 2021 issued in Application No. PCT/US2019/067540.

International Preliminary Report on Patentability dated May 27, 2021 issued in Application No. PCT/US2019/060742.

International Search Report and Written Opinion dated May 17, 2021 issued in Application No. PCT/US2021/015656.

International Preliminary Report on Patentability dated Apr. 14, 2022 issued in Application No. PCT/US2020/053856.

International Preliminary Report on Patentability dated Aug. 18, 2022 in PCT Application No. PCT/US2021/015656.

International Preliminary Report on Patentability dated Jan. 27, 2021 in Application PCT/US2020/054730.

International Preliminary Report on Patentability dated Jan. 6, 2022 in PCT Application No. PCT/US2020/038968.

International Preliminary Report on Patentability dated Jan. 6, 2022 in PCT Application No. PCT/US2020/039615.

International Preliminary Report on Patentability dated Jan. 6, 2022 in PCT Application No. PCT/US2020/070171.

International Preliminary Report on Patentability dated Jan. 6, 2022 in PCT Application No. PCT/US2020/070172.

International Preliminary Report on Patentability dated Jan. 6, 2022 in PCT Application No. PCT/US2020/070187.

International Preliminary Report on Patentability dated Jul. 28, 2022 in PCT Application No. PCT/US2021/012953.

International Preliminary Report on Patentability dated Sep. 22, 2022, in PCT Application No. PCT/US2021/021833.

International Search Report and Written Opinion dated May 12, 2021 issued in Application No. PCT/US2021/012953.

(56) References Cited

OTHER PUBLICATIONS

International Search Report and Written Opinion dated Apr. 10, 2020 issued in Application No. PCT/US2019/060742.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Mar. 23, 2021 issued in Application No. PCT/US2020/053856.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
JP Office Action dated Jul. 26, 2022 in Application No. JP2021102822 With English translation.
JP Office Action dated Jun. 28, 2022 in Application No. JP2021560945.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
KR Office Action dated Feb. 8, 2022, in Application No. KR10-2021-7030794 with English Translation.
KR Office Action dated May 9, 2022, in Application No. KR1020217030794 with English translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Taiwanese First Office Action dated Aug. 10, 2020 issued in Application No. TW 105137362.
Taiwanese First Office Action dated May 31, 2018 issued in Application No. TW 104103153.
Taiwanese Second Office Action dated Nov. 18, 2020 issued in Application No. TW 105137362.
TW Office Action dated Sep. 5, 2022, in Application No. TW110101388 with English translation.
TW Office Action dated Apr. 29, 2022 in Application No. TW110118172 with English translation.
TW Office Action dated Jun. 3, 2022, in Application No. TW110143913.
TW Office Action dated Mar. 7, 2022, in Application No. TW110101388 with English translation.
US Final Office Action, dated May 11, 2017, issued in U.S. Appl. No. 14/610,038.
US Final Office Action, dated Sep. 10, 2018, issued in U.S. Appl. No. 15/691,659.
US Notice of Allowance, dated Apr. 25, 2018 issued in U.S. Appl. No. 14/948,109.
US Notice of Allowance, dated Aug. 22, 2017, issued in U.S. Appl. No. 14/610,038.
U.S. Notice of Allowance dated Feb. 22, 2022 in U.S. Appl. No. 17/310,635.
US Notice of Allowance, dated Jul. 28, 2020, issued in U.S. Appl. No. 16/206,959.
US Notice of Allowance dated Sep. 15, 2021, issued in U.S. Appl. No. 16/691,508.
US Notice of Allowance, dated Sep. 19, 2019, issued in U.S. Appl. No. 15/691,659.
US Notice of Allowance dated Sep. 9, 2021, issued in U.S. Appl. No. 16/691,508.
US Office Action, dated Apr. 9, 2019, issued in U.S. Appl. No. 15/691,659.
US Office Action, dated Jan. 23, 2017, issued in U.S. Appl. No. 14/610,038.
US Office Action, dated Mar. 5, 2020, issued in U.S. Appl. No. 16/206,959.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 19/948,109.
U.S. Appl. No. 17/596,651, filed Dec. 15, 2021.
U.S. Appl. No. 17/596,722, filed Dec. 16, 2021.
U.S. Appl. No. 17/758,125, Inventors Yu et al., filed Jun. 28, 2022.
U.S. Appl. No. 17/758,567, Inventors Yu et al., filed Jul. 8, 2022.
U.S. Appl. No. 17/759,281, inventors Dictus et al., filed on Jul. 21, 2022.
U.S. Appl. No. 17/905,632, inventor Kanakasabapathy., filed Sep. 2, 2022.
Xu, et al., "Underlayer designs to enhance the performance of EUV resists," Proceedings of SPIE, vol. 7273, 2009, pp. 727311-1-727311-11.
Alf, M.E., et al., "Chemical Vapor Deposition of Conformal, Functional, and Responsive Polymer Films," Advanced Materials, 2010, vol. 22(18), pp. 1993-2027.
Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
Chiang C L., et al., "Secondary Electron Emission Characteristics of Oxide Electrodes In Flat Electron Emission Lamp," AIP Advances, 2016, vol. 6, 015317, 9 Pages.
CN Office Action dated Apr. 24, 2024 in CN Application No. 201980075389.7 with English translation.

(56) References Cited

OTHER PUBLICATIONS

CN Office Action dated Aug. 31, 2024 in CN Application No. 201980028279.5 with English translation.
CN Office Action dated Dec. 13, 2023 in CN Application No. 201810783756.6 with English translation.
CN Office Action dated Dec. 26, 2023 in CN Application No. 201980028279.5, with English Translation.
CN Office Action dated Jan. 22, 2024 in CN Application No. 202080047683.X, with English Translation.
CN Office Action dated Jul. 23, 2024 in CN Application No. 201810783756.6 with English translation.
CN Office Action dated Jul. 26, 2024 in CN Application No. 202080047683.X with English translation.
CN Office Action dated Jun. 1, 2023, in application No. CN201810783756 with English translation.
CN Office Action dated Mar. 14, 2024 in CN Application No. 201810783756.6, with English Translation.
CN Office Action dated May 6, 2025 in CN Application No. 202080081121.7, with English Translation.
CN Office Action dated May 6, 2025 in CN Application No. 202080060616.1, with English Translation.
CN Office Action dated Nov. 18, 2022, in Application No. CN201810783756.6 with English Translation.
CN Office Action dated Sep. 28, 2024 in CN Application No. 202080059412.6 with English translation.
Cui L F., et al., "Endohedral Stannaspherenes M@Sn12: A Rich Class of Stable Molecular Cage Clusters," Endohedral Tin Cages, 2007, vol. 46, pp. 742-745.
Dahuang, D., et al., Functional Thin Films and Their Deposition Preparation Techniques, Metallurgy Industrial Press, Jan. 31, 2013, pp. 450-454. [with English translation].
EP Extended European Search report dated Apr. 15, 2025 in EP Application No. 22782195.6.
EP Extended European Search report dated Jun. 26, 2023, in Application No. 20831242.1.
EP Extended European Search Report dated Jun. 26, 2023, in Application No. 20831343.7.
EP Extended European Search report dated Jun. 28, 2023, in Application No. EP 20832501.9.
EP Extended European Search report dated Sep. 25, 2023, in Application No. EP20870849.5.
Fitzgerald C B., et al., "Magnetism in Dilute Magnetic Oxide Thin Films Based on SnO2," The American Physical Society, 2006, vol. 74, 115307, 10 Pages.
International Search Report and Written Opinion dated Jul. 13, 2021, in PCT Application No. PCT/US2021/023901.
International Search Report and Written Opinion dated May 18, 2022, in International Application No. PCT/US2022/014984.
International Preliminary Report on Patentability and Written Opinion dated Dec. 26, 2024 in PCT Application No. PCT/US2023/068419.
International Preliminary Report on Patentability and Written Opinion dated Feb. 8, 2024 in PCT Application No. PCT/US2022/037393.
International Preliminary Report on Patentability and Written Opinion dated Feb. 8, 2024 in PCT Application No. PCT/US2022/037733.
International Preliminary Report on Patentability and Written Opinion dated Jun. 27, 2024 in PCT Application No. PCT/US2022/081376.
International Preliminary Report on Patentability and Written Opinion dated Nov. 14, 2024 in PCT Application No. PCT/US2023/019871.
International Preliminary Report on Patentability dated Aug. 24, 2023, in PCT Application No. PCT/US2022/014984.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Oct. 12, 2023, in PCT Application No. PCT/US2022/022790.
International Preliminary Report on Patentability dated Oct. 13, 2022, in PCT Application No. PCT/US2021/023901.
International Preliminary Report on Patentability dated Sep. 7, 2023, in PCT Application No. PCT/US2022/014281.
International Search Report and Written Opinion dated Apr. 17, 2023 in PCT Application No. PCT/US2022/081376.
International Search Report and Written Opinion dated Aug. 17, 2023, in Application No. PCT/US2023/019871.
International Search Report and Written Opinion dated Aug. 28, 2024 in PCT Application No. PCT/US2024/028046.
International Search Report and Written Opinion dated Feb. 20, 2025 in PCT Application No. PCT/US2024/054806.
International Search Report and Written Opinion dated Jul. 22, 2022 in Application No. PCT/US2022/022790.
International Search Report and Written Opinion dated May 16, 2022, In International Application No. PCT/US2022/014281.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 7, 2022 in PCT Application No. PCT/US2022/037393.
International Search Report and Written Opinion dated Nov. 10, 2021, in PCT Application No. PCT/US2021/042104.
International Search Report and Written Opinion dated Oct. 6, 2023 in PCT Application No. PCT/US2023/068419.
Jalife S., et al., "Noble Gas Endohedral Fullerenes," Chemical Science, 2020, vol. 11, pp. 6642-6652.
JP Office Action dated Apr. 15, 2025 in JP Application No. 2023502908, with English Translation.
JP Office Action dated Apr. 30, 2024 in JP Application No. 2021-577241 with English translation.
JP Office Action dated Apr. 30, 2025 in JP Application No. 2022547251, with English Translation.
JP Office Action dated Aug. 6, 2024 in JP Application No. 2023-558732, with English Translation.
JP Office Action dated Dec. 3, 2024 in JP Application No. 2023-558732 with English translation.
JP Office Action dated Dec. 24, 2024 in JP Application No. 2021-576792, with English Translation.
JP Office Action dated Dec. 26, 2023 in JP Application No. 20210576241, with English Translation.
JP Office Action dated Dec. 26, 2023 in JP Application No. 2021-526240, with English Translation.
JP Office Action dated Feb. 18, 2025 in JP Application No. 2022-557680, with English Translation.
JP Office Action dated Feb. 18, 2025 in JP Application No. 2023-502905, with English Translation.
JP Office Action dated Feb. 28, 2023 in Application No. JP2020-562160 with English translation.
JP Office Action dated Mar. 4, 2025 in JP Application No. 2022-577244, with English Translation.
JP Office Action dated Mar. 22, 2024 in JP Application No. 2020-562160, with English Translation.
JP Office Action dated Mar. 26, 2024 in JP Application No. 2023-558732 with English translation.
JP Office Action dated May 13, 2025 in JP Application No. 2023-502906, with English Translation.
JP Office Action dated May 14, 2024 in JP Application No. 2021-576241 with English translation.

(56) References Cited

OTHER PUBLICATIONS

JP Office Action dated May 14, 2024 in JP Application No. 2021-576792 with English translation.
JP Office Action dated Oct. 8, 2024 in JP Application No. 2020-562160 with English translation.
JP Office Action dated Oct. 22, 2024 in JP Application No. 2022-547251 with English translation.
JP Office Action dated Sep. 17, 2024 in JP Application No. 2023-502905 with English translation.
JP Office Action dated Sep. 17, 2024 in JP Application No. 2023-502907, with English Translation.
JP Office Action dated Sep. 19, 2023 in Application No. JP2020-562160 with English translation.
JP Office Action dated Sep. 24, 2024 in JP Application No. 2021-526240 with English translation.
Komen C V., et al., "Structure-Magnetic Property Relationship Intransition Metal (M = V,Cr, Mn, Fe, Co, Ni) Doped Sno2 Nanoparticles," Journal of Applied Physics, 2008, vol. 103, 5 Pages.
KR Notice of Allowance dated Dec. 12, 2024 in KR Application No. 10-2016-0152489, with English Translation.
KR Notice of Allowances dated Jul. 8, 2024, in KR Application No. 10-2024-7006338 with English Translation.
KR Office Action dated Apr. 14, 2025 in KR Application No. 10-2022-7030615, with English Translation.
KR Office Action dated Apr. 17, 2025 in KR Application No. 10-2022-7003086, with English Translation.
KR Office Action dated Apr. 23, 2024 in KR Application No. 10-2016-0152489 with English translation.
KR Office Action dated Jan. 24, 2025 in KR Application No. 10-2020-7035732, with English Translation.
KR Office Action dated Mar. 13, 2025 in KR Application No. 10-2023-7004801, with English Translation.
KR Office Action dated Mar. 19, 2025 in KR Application No. 10-2022-7038020, with English Translation.
KR Office Action dated Mar. 24, 2025 in KR Application No. 10-2023-7005613, with English Translation.
KR Office Action dated Mar. 27, 2025 in KR Application No. 10-2022-7003371, with English Translation.
KR Office Action dated May 24, 2024 in KR Application No. 10-2020-7035732 with English translation.
KR Office Action dated Nov. 7, 2024 in KR Application No. 10-2023-7005181 with English Translation.
KR Office Action dated Nov. 7, 2024 in KR Application No. 10-2023-7005318, with English Translation.
KR Office Action dated Nov. 28, 2024 in KR Application No. 10-2022-7014447, with English Translation.
KR Office Action dated Nov. 28, 2024 in KR Application No. 10-2022-7014896, with English Translation.
KR Office Action dated Oct. 31, 2024 in KR Application No. 10-2022-7003353 with English Translation.
Kvon V., et al., "Secondary Electron Emission Of Tin And Tin-Lithium Under Low Energy Helium Plasma Exposure," Nuclear Materials and Energy, 2017, vol. 13, pp. 21-27.
Lin Y., et al., "A New Examination Of Secondary Electron Yield Data," Surface And Interface Analysis, 2005, vol. 37, pp. 895-900.
Molloy, K. C., "Precursors for the Formation of Tin (IV) Oxide and Related Materials", Journal of Chemical Research, 2008, vol. 2008, No. 10, pp. 549-554.
Ogale S B., et al., "High Temperature Ferromagnetism with Giant Magnetic Moment in Transparent Co-doped SnO2-δ," Physical Review Letters, 2003, 17 Pages.
Pedersen A., et al., "Lithiation of Tin Oxide: A Computational Study," Integrated Systems Laboratory, 2014, 20 Pages.
Saunders M., et al., "Noble Gas Atoms Inside Fullerenes," Science, 1996, vol. 271, pp. 1693-1697.
SG Search Report and Written Opinion dated Jul. 3, 2024 in SG Application No. 11202114196U.
SG Search Report and Written Opinion dated May 14, 2024 in SG Application No. 11202251864Y.
SG Written Opinion dated Apr. 16, 2024 in SG Application No. 11202114197Y.
SG Written Opinion dated Jul. 31, 2024 in SG Application No. 11202307119P.
SG Written Opinion dated Sep. 2, 2024 in SG Application No. 11202114260T.
Singapore Search Report and Written Opinion dated Mar. 17, 2023 issued in Application No. SG11202114197Y.
Singh R ., "Unexpected Magnetism In Nanomaterials," Journal of Magnetism and Magnetic Materials, 2013, vol. 346, pp. 58-73.
Taiwanese Office Action dated Apr. 10, 2023 in TW Application No. TW108140940 with English translation.
Tian Y F., et al., "Oxide Magnetic Semiconductors: Materials, Properties, And Devices," Magnetism, Magnetic Materials, And Interdisciplinary Research, 2013, vol. 22(8), 2 Pages.
TW Office Action dated Jan. 9, 2023 In Application No. TW20190116155 with English translation.
TW Office Action and Search Report dated Apr. 24, 2025 in TW Application No. 108116155, with English Translation.
TW Office Action and Search Report dated Dec. 25, 2024 in TW Application No. 111112111, with English Translation.
TW Office Action dated Apr. 17, 2024 in TW Application No. 111112111 with English translation.
TW Office Action dated Aug. 6, 2024 in TW Application No. 110122525, with English Translation.
TW Office Action dated Aug. 8, 2024 in TW Application No. 111112111, with English Translation.
TW Office Action dated Feb. 21, 2024 in TW Application No. 109121664 with English translation.
TW Office Action dated Feb. 29, 2024 in TW Application No. 109134377, with English Translation.
TW Office Action dated Jan. 2, 2024 in TW Application No. 109121639, with English Translation.
TW Office Action dated Jul. 2, 2024 in TW Application No. 109134940 with English translation.
TW Office Action dated Jul. 23, 2024 in TW Application No. 110111878, with English Translation.
TW Office Action dated Jun. 27, 2024 in TW Application No. 110103944, with English Translation.
TW Office Action dated Mar. 11, 2024 in TW Application No. 109121649, with English Translation.
TW Office Action dated Mar. 11, 2025 in TW Application No. 110126445, with English Translation.
TW Office Action dated Nov. 7, 2024 in TW Application No. 111112111, with English Translation.
TW Office Action dated Nov. 25, 2024 in TW Application No. 110126458, with English Translation.
TW Office Action dated Nov. 26, 2024 in TW Application No. 110126445, with English Translation.
TW Office Action dated Oct. 4, 2024 in TW Application No. 109121649 with English translation.
TW Office Action dated Oct. 4, 2024 in TW Application No. 110126430 with English translation.
TW Office Action dated Oct. 7, 2024 in TW Application No. 109121639, with English translation.
TW Office Action dated Oct. 30, 2023, in application No. TW108116155 with English Translation.
TW Office Action dated Sep. 25, 2024 in TW Application No. 110111136 with English translation.
U.S. Corrected Notice of Allowance dated Jan. 31, 2024 in U.S. Appl. No. 17/309,247.
U.S. Final Office Action dated Apr. 10, 2024 in U.S. Appl. No. 15/733,598.
U.S. Final Office Action dated Apr. 21, 2025 in U.S. Appl. No. 17/596,858.
U.S. Final Office Action dated Apr. 23, 2024 in U.S. Appl. No. 17/596,928.
U.S. Final Office Action dated Feb. 27, 2024 in U.S. Appl. No. 18/298,003.
U.S. Final Office Action dated May 3, 2024 in U.S. Appl. No. 18/297,989.
U.S. Final Office Action dated May 12, 2023 in U.S. Appl. No. 17/455,185.

(56) References Cited

OTHER PUBLICATIONS

U.S. Final Office Action dated Nov. 9, 2023 in U.S. Appl. No. 17/455,185.
U.S. Final Office Action dated Sep. 16, 2024 in U.S. Appl. No. 18/550,733.
US Non-Final Office Action dated Apr. 23, 2025 in U.S. Appl. No. 18/550,733.
U.S. Non-Final Office Action dated Aug. 28, 2024 in U.S. Appl. No. 15/733,598.
U.S. Non-Final office Action dated Feb. 7, 2023 in U.S. Appl. No. 17/455,185.
U.S. Non-Final Office Action dated May 29, 2024 in U.S. Appl. No. 18/298,003.
U.S. Non-Final Office Action dated May 31, 2024 in U.S. Appl. No. 18/550,733.
U.S. Non-Final Office Action dated Nov. 21, 2024 in U.S. Appl. No. 17/596,858.
U.S. Non-Final Office Action dated Oct. 1, 2024 in U.S. Appl. No. 17/596,928.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,928.
U.S. Non-Final Office Action dated Sep. 17, 2024 in U.S. Appl. No. 17/596,722.
U.S. Non-Final Office Action dated Sep. 17, 2024 in U.S. Appl. No. 17/995,355.
U.S. Non-Final Office Action dated Sep. 28, 2023, in U.S. Appl. No. 15/733,598.
U.S. Notice of Allowance dated Apr. 9, 2025 in U.S. Appl. No. 17/995,355.
U.S. Notice of Allowance dated Oct. 18, 2023 in U.S. Appl. No. 17/309,247.
U.S. Appl. No. 18/855,026, inventors Lee Y, etal., filed Oct. 8, 2024.
U.S. Appl. No. 18/869,622, inventors Vrtis R.N et al., filed Nov. 26, 2024.
U.S. Appl. No. 19/064,426, inventors Wu C et al., filed Feb. 26, 2025.
U.S. Restriction Requirement dated Nov. 14, 2022 in U.S. Appl. No. 17/455,185.
U.S. Restriction Requirement dated Apr. 3, 2025 in U.S. Appl. No. 17/758,567.
U.S. Restriction Requirement dated Apr. 8, 2024 in U.S. Appl. No. 17/754,019.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Restriction requirement dated Feb. 14, 2024, in U.S. Appl. No. 18/550,733.
U.S. Restriction Requirement dated Mar. 20, 2025 in U.S. Appl. No. 17/753,110.
Barret M C., et al., "Copper, Zinc and Tin Hydroxypyridinones," Transition Metal Chemistry, Jan. 2015, vol. 40, pp. 241-254.
Cilibrizzi A., et al., "Hydroxypyridinone Journey into Metal Chelation," Chemical Review, Jul. 2018, vol. 118, pp. 7657-7701.
CN Office Action dated Oct. 14, 2025 in CN Application No. 202080060616.1, with English Translation.
Fitzgerald A., et al., "Determination of Trace Metals in Positive Photoresist," Journal of the Electrochemical Society, May 1992, vol. 139 (5), pp. 1413-1414.
JP Office Action dated Aug. 19, 2025 in JP Application No. 2022-557680, with English Translation.
JP Office Action dated Jul. 8, 2025 in JP Application No. 2023-502905, with English Translation.
JP Office Action dated Jun. 24, 2025 in JP Application No. 2022577244, with English Translation.
JP Office Action dated May 27, 2025 in JP Application No. 2023502903, with EnglishTranslation.
JP Office Action dated Oct. 7, 2025 in JP Application No. 2024-197800, with English Translation.
JP Office Action dated Sep. 9, 2025 in JP Application No. 2023-502906, with English Translation.
KR Notice of Allowance and Search Report dated Aug. 5, 2025 in KR Application No. 10-2022-7003353, with English translation.
KR Notice of Allowance and Search Report dated Jun. 4, 2025 in KR Application No. 10-2023-7005181, with English translation.
KR Notice of Allowance and Search Report dated Jun. 5, 2025 in KR Application No. 10-2023-7005318, with English translation.
KR Office Action dated Aug. 27, 2025 in KR Application No. 10-2022-7014896, with English Translation.
KR Office Action dated Jul. 31, 2025 in KR Application No. 10-2023-7005320 with English translation.
KR Office Action dated Jun. 12, 2025 in KR Application No. 10-2023-7001454, with English Translation.
KR Office Action dated May 29, 2025 in KR Application No. 10-2022-7038499, with English Translation.
KR Office Action dated Oct. 22, 2025 in KR Application No. 10-2023-7032772, with English Translation.
KR Office Action dated Oct. 27, 2025 in KR Application No. 10-2023-7028523, with English Translation.
TW Office Action and Search Report dated Aug. 4, 2025 in TW Application No. 114105681, with English Translation.
TW Office Action and Search Report dated Aug. 15, 2025 in TW Application No. 114123201, with English Translation.
TW Office Action and Search Report dated May 27, 2025 in TW Application No. 110126442, with English Translation.
TW Office Action and Search Report dated Oct. 23, 2025 in TW Application No. 111106161, with English Translation.
TW Office Action and Search Report dated Oct. 30, 2025 in TW Application No. 111127705, with English Translation.
TW Office Action and Search Report dated Oct. 30, 2025 in TW Application No. 113148851, with English Translation.
U.S. Advisory Action dated Jun. 27, 2025 in U.S. Appl. No. 17/596,858.
U.S. Final Office Action dated Aug. 11, 2025 in U.S. Appl. No. 18/550,733.
U.S. Final Office Action dated Jun. 17, 2025 in U.S. Appl. No. 17/596,722.
U.S. Non-Final Office Action dated Aug. 26, 2025 in U.S. Appl. No. 17/596,858.
US Non-Final Office Action dated Jul. 8, 2025 in U.S. Appl. No. 17/998,354.
U.S. Non-Final Office Action dated Jul. 11, 2025 in U.S. Appl. No. 18/005,328.
US Non-Final Office Action dated Jul. 14, 2025 in U.S. Appl. No. 18/005,571.
US Non-Final Office Action dated Jun. 5, 2025 in U.S. Appl. No. 17/758,567.
US Non-Final Office Action dated Jun. 18, 2025 in U.S. Appl. No. 17/753,110.
U.S. Appl. No. 19/482,119, inventors Demuth J.J et al., filed Nov. 6, 2025.
International Preliminary Report on Patentability and Written Opinion dated Nov. 20, 2025 in PCT Application No. PCT/US2024/028046.
KR Office Action dated Dec. 3, 2025 in KR Application No. 10-2022-7030615, with English Translation.
KR Office Action dated Nov. 12, 2025 in KR Application No. 10-2023-7004801, with English Translation.
KR Office Action dated Nov. 26, 2025 in KR Application No. 10-2022-7038020, with English Translation.
TW Office Action and Search Report dated Nov. 27, 2025 in TW Application No. 110126445, with English Translation.
U. S. Final Office Action dated Dec. 4, 2025 in U.S. Appl. No. 18/005,571.
U.S. Final Office Action dated Nov. 17, 2025 in U.S. Appl. No. 17/753,110.
U.S. Notice of Allowance dated Nov. 25, 2025 in U.S. Appl. No. 17/596,722.

(56) References Cited

OTHER PUBLICATIONS

KR Office Action dated Dec. 16, 2025 in KR Application No. 10-2025-7013726, with English Translation.
KR Office Action dated Dec. 28, 2025 in KR Application No. 10-2022-7003371, with English Translation.
KR Office Action dated Feb. 11, 2026 in KR Application No. 10-2025-7015615, with English Translation.
TW Office Action and Search Report dated Jan. 13, 2026 in TW Application No. 111104645, with English Translation.
U.S. Advisory Action dated Jan. 16, 2026 in U.S. Appl. No. 17/753,110.
U.S. Final Office Action dated Dec. 12, 2025 in U.S. Appl. No. 17/758,567.
U.S. Non-Final Office Action dated Dec. 18, 2025 in U.S. Appl. No. 18/580,334.
U.S. Non-Final Office Action dated Jan. 27, 2026 in U.S. Appl. No. 18/932,475.
U.S. Non-Final Office Action dated Jan. 28, 2026 in U.S. Appl. No. 18/550,733.
U.S. Notice of Allowance dated Dec. 11, 2025 in U.S. Appl. No. 17/998,354.
U.S. Notice of Allowance dated Dec. 30, 2025 in U.S. Appl. No. 17/596,858.

* cited by examiner

APPARATUS AND PROCESS FOR EUV DRY RESIST SENSITIZATION BY GAS PHASE INFUSION OF A SENSITIZER

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

FIELD

The present disclosure relates to stacks having a sensitized resist film, as well as methods and apparatuses for applying such sensitized films. In particular embodiments, the sensitizer can be provided in gas form, and unreacted sensitizer precursors can be recovered after a deposition step.

BACKGROUND

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. EUV radiation is strongly absorbed in a wide range of solid and fluid materials including quartz and water vapor, and so operates in a vacuum.

SUMMARY

The present disclosure relates to use of a sensitized film disposed within a stack. In one instance, the sensitized film employs an EUV resist material in combination with an EUV sensitizer. While the EUV resist material can include one or more EUV-sensitive materials (e.g., any described herein), the EUV sensitizer can include one or more compounds having enhanced EUV absorption, thus providing additional beneficial photoelectrons upon EUV radiation. In this way, an EUV dose of the film could be reduced, as compared to a dose for a stack lacking the EUV sensitizer.

In some embodiments, the EUV sensitizer includes one or more compounds that are EUV absorbing, thus providing beneficial photoelectrons upon EUV radiation that can be injected into the film to provide further EUV-mediated cleavage events. In this way, an EUV dose of the film could be reduced, as compared to a dose for a stack lacking the EUV sensitizer.

Accordingly, in a first aspect, the present disclosure features a stack including: a semiconductor substrate having a top surface; and a sensitized film disposed on the top surface of the semiconductor substrate. In some embodiments, the film includes an EUV resist material, in which an EUV sensitizer dispersed throughout the film. In particular embodiments, the EUV sensitizer is or includes iodine or xenon. In other embodiments, the EUV sensitizer is $I_2$, HI, or an organometallic precursor including an iodo-substituted alkyl group, or a precursor thereof, as well as any precursor described herein. In some embodiments, the EUV sensitizer is $R_1Sn(NR_2)_3$, wherein $R_1$ is an optionally substituted alkyl including one or more iodo and each R is independently alkyl. In other embodiments, the EUV sensitizer is $^{133}Xe$, $^{136}Xe$, $^{129}Xe$, or a combination of any of these isotopes.

In a second aspect, the present disclosure features a stack including: a semiconductor substrate having a top surface; and a sensitized film disposed on the top surface of the semiconductor substrate, wherein the film includes an EUV resist material and an EUV sensitizer including xenon. In some embodiments, the EUV sensitizer is $^{133}Xe$, $^{136}Xe$, $^{129}Xe$, or a combination of any of these isotopes.

In a third aspect, the present disclosure features a method for forming a sensitized film, the method including: providing a semiconductor substrate within a chamber; and delivering an EUV resist material or a precursor thereof and an EUV sensitizer to the chamber. In some embodiments, the method thereby forms the sensitized film on a top surface of the semiconductor substrate.

In some embodiments, the EUV resist material (or the precursor thereof) and the EUV sensitizer can be delivered sequentially in any order. In other embodiments, the EUV resist material (or the precursor thereof) and the EUV sensitizer are delivered simultaneously. In yet other embodiments, the EUV resist material (or the precursor thereof) and the EUV sensitizer are provided in gas form.

In other embodiments, the EUV sensitizer is provided as a push gas for a vapor including the EUV resist material or the precursor thereof.

In some embodiments, the delivering step further includes: delivering one or more counter-reactants to the chamber. In other embodiments, the EUV sensitizer is provided as a push gas for the one or more counter-reactants.

In some embodiments, the EUV sensitizer is provided as a bubbler gas for the EUV resist material or a precursor thereof. In other embodiments, the EUV sensitizer is provided as a dilutant that is delivered to the chamber.

In a fourth aspect, the present disclosure features a method for forming a sensitized film, the method including: depositing a film on a top surface of a semiconductor substrate, wherein the film includes an EUV resist material; and heating the film in a chamber and in the presence of an EUV sensitizer in gas form (e.g., thereby forming the sensitized film on the top surface of the semiconductor substrate). In particular embodiments, the sensitized film includes the EUV resist material and the EUV sensitizer.

In some embodiments, the depositing step includes thermal atomic layer deposition, spin coat deposition, electron beam vaporization, or a combination thereof In a fifth aspect, the present disclosure features a method for forming a sensitized film, the method including: providing a chamber including at least a residual level of an EUV sensitizer; providing a semiconductor substrate within the chamber; and delivering an EUV resist material or a precursor thereof to the chamber (e.g., thereby forming the sensitized film on the top surface of the semiconductor substrate). In some embodiments, the sensitized film includes the EUV resist material and the EUV sensitizer.

In a sixth aspect, the present disclosure features an apparatus for depositing a sensitized film, the apparatus including: a deposition module including a chamber for depositing an EUV resist material and an EUV sensitizer as a sensitized film, wherein the EUV resist material or a precursor thereof and the EUV sensitizer are provided in gas form. In some embodiments, the apparatus also includes: a patterning module including an EUV photolithography tool with a source of sub-30 nm wavelength radiation; and/or a development module including a chamber for developing the sensitized film.

In other embodiments, the apparatus can include a controller having one or more memory devices, one or more processors, and system control software coded with instructions for conducting film deposition. In some embodiments, the instructions including instructions for (e.g., in the deposition module): causing deposition of the sensitized film on a top surface of a semiconductor substrate, wherein the sensitized film includes the EUV resist material and the EUV sensitizer. In other embodiments, the instructions include (e.g., in the patterning module): causing patterning of the sensitized film with sub-30 nm resolution directly by EUV exposure having a wavelength in the range of about 10 nm to about 20 nm in a vacuum ambient (e.g., thereby forming a pattern within the sensitized film). In yet other embodiments, the instructions include (e.g., in the development module): causing development of the sensitized film to provide the pattern within the sensitized film.

In some embodiments, according to the instructions, the EUV resist material or the precursor thereof and the EUV sensitizer can be delivered sequentially in any order or delivered simultaneously.

In other embodiments, according to the instructions, the EUV sensitizer is provided as a push gas for the EUV resist material or the precursor thereof. In yet other embodiments, the instructions further include (e.g., in the deposition module): causing delivery of one or more counter-reactants to the chamber, wherein the EUV sensitizer is provided as a push gas for the one or more counter-reactants. In some embodiments, according to the instructions, the EUV sensitizer is provided as a bubbler gas for a vapor including the EUV resist material or the precursor thereof. In further embodiments, according to the instructions, the EUV sensitizer is provided as a dilutant that is delivered to the chamber in the deposition module.

In a seventh aspect, the present disclosure features an apparatus for depositing a sensitized film, the apparatus including: a deposition module including a heater and a chamber for depositing an EUV resist material as a film. In some embodiments, the apparatus also includes: a patterning module including an EUV photolithography tool with a source of sub-30 nm wavelength radiation; a development module including a chamber for developing the sensitized film; and/or a controller including one or more memory devices, one or more processors, and system control software coded with instructions for conducting film deposition.

In some embodiments, the instructions include instructions for (e.g., in the deposition module): causing deposition of the film on a top surface of a semiconductor substrate and heating the film with the heater in the presence of an EUV sensitizer in gas form, e.g., thereby forming the sensitized film on the top surface of the semiconductor substrate. In some embodiments, the sensitized film includes the EUV resist material and the EUV sensitizer.

In other embodiments, the instructions include (e.g., in the patterning module): causing patterning of the sensitized film with sub-30 nm resolution directly by EUV exposure having a wavelength in the range of about 10 nm to about 20 nm in a vacuum ambient, thereby forming a pattern within the sensitized film. In yet other embodiments, the instructions include (e.g., in the development module): causing development of the sensitized film to provide the pattern within the sensitized film.

In an eighth aspect, the present disclosure features an apparatus for depositing a sensitized film, the apparatus including: a deposition module including a chamber for depositing an EUV resist material as a film, wherein the chamber includes at least a residual level of an EUV sensitizer. In some embodiments, the apparatus can further include: a patterning module including an EUV photolithography tool with a source of sub-30 nm wavelength radiation; a development module including a chamber for developing the sensitized film; and/or a controller including one or more memory devices, one or more processors, and system control software coded with instructions for conducting film deposition.

In some embodiments, the instructions include (e.g., in the deposition module): causing deposition of the sensitized film on a top surface of a semiconductor substrate, wherein the sensitized film includes the EUV resist material and the EUV sensitizer. In other embodiments, the instructions include (e.g., in the patterning module): causing patterning of the sensitized film with sub-30 nm resolution directly by EUV exposure having a wavelength in the range of about 10 nm to about 20 nm in a vacuum ambient, thereby forming a pattern within the sensitized film. In yet other embodiments, the instructions include (e.g., in the development module): causing development of the sensitized film to provide the pattern within the sensitized film.

In any embodiment herein, the EUV exposure can have a wavelength of 13.5 nm.

In any embodiment herein, an apparatus can include a recovery module having a trap, wherein the recovery module can be fluidically connected to the deposition module. In some embodiments, the apparatus can include instructions, which in turn can further include (e.g., in the recovery module): causing capture of the EUV sensitizer present in gas form within the chamber of the deposition module.

In any embodiment herein, the EUV resist material includes an organometallic material (e.g., any described herein). In particular embodiments, the organometallic material includes tin. In other embodiments, the organometallic material further includes an iodo-substituted alkyl group in optionally combination with a dialkyl amino group (e.g., $-NR_2$, wherein each R can be an independently substituted alkyl, as described herein).

In any embodiment herein, the EUV resist material or the film can include any EUV-sensitive material described herein. In particular embodiments, the material or the film includes tin, an alloy thereof, an oxide thereof, or a complex oxide thereof.

In any embodiment herein, the EUV sensitizer can be provided in vapor form.

In any embodiment herein, the EUV sensitizer includes or can be xenon or iodine. In some embodiments, the EUV sensitizer can be $I_2$, HI, or an organometallic precursor including an iodo-substituted alkyl group (e.g., any described herein). In other embodiments, the EUV sensitizer can be $^{133}Xe$, $^{136}Xe$, $^{129}Xe$, or a combination of any of these isotopes.

In any embodiment herein, the counter-reactant is an oxygen-containing counter-reactant, such as $O_2$, $O_3$, water, peroxides (e.g., hydrogen peroxide), oxygen plasma, water plasma, alcohols, dihydroxy alcohols, polyhydroxy alcohols, fluorinated dihydroxy alcohol, fluorinated polyhydroxy alcohols, fluorinated glycols, formic acid, and other sources of hydroxyl moieties, as well as combinations thereof. Additional counter-reactants can include any described herein.

In any embodiment herein, the sensitized film includes a dry-deposited resist or a spin-on resist.

In any embodiment herein, the method further includes (e.g., after the delivering step): patterning the sensitized film by an EUV exposure having a wavelength in the range of about 10 nm to about 20 nm in a vacuum ambient. In some embodiments, the EUV exposure generates additional primary photoelectrons and/or secondary photoelectrons within the sensitized film, as a compared to a control film lacking the EUV sensitizer.

In any embodiment herein, the method can include (e.g., after the delivering step and/or before the patterning step, if present): capturing the EUV sensitizer present in gas form within the chamber. In some embodiments, the capturing step includes employing a cold trap to recover the EUV sensitizer in gas form.

Definitions

By "acyloxy" or "alkanoyloxy," as used interchangeably herein, is meant an acyl or alkanoyl group, as defined herein, attached to the parent molecular group through an oxy group. In particular embodiments, the alkanoyloxy is —O—C(O)-Ak, in which Ak is an alkyl group, as defined herein. In some embodiments, an unsubstituted alkanoyloxy is a $C_{2-7}$ alkanoyloxy group. Exemplary alkanoyloxy groups include acetoxy.

By "alkenyl" is meant an optionally substituted $C_{2-24}$ alkyl group having one or more double bonds. The alkenyl group can be cyclic (e.g., $C_{3-24}$ cycloalkenyl) or acyclic. The alkenyl group can also be substituted or unsubstituted. For example, the alkenyl group can be substituted with one or more substitution groups, as described herein for alkyl. Non-limiting unsubstituted alkenyl groups include allyl and vinyl.

By "alkenylene" is meant a multivalent (e.g., bivalent) form of an alkenyl group, which is an optionally substituted $C_{2-24}$ alkyl group having one or more double bonds. The alkenylene group can be cyclic (e.g., $C_{3-24}$ cycloalkenyl) or acyclic. The alkenylene group can be substituted or unsubstituted. For example, the alkenylene group can be substituted with one or more substitution groups, as described herein for alkyl. Exemplary, non-limiting alkenylene groups include —CH═CH— or —CH═$CHCH_2$—.

By "alkoxy" is meant —OR, where R is an optionally substituted alkyl group, as described herein. Exemplary alkoxy groups include methoxy, ethoxy, butoxy, trihaloalkoxy, such as trifluoromethoxy, etc. The alkoxy group can be substituted or unsubstituted. For example, the alkoxy group can be substituted with one or more substitution groups, as described herein for alkyl. Exemplary unsubstituted alkoxy groups include $C_{1-3}$, $C_{1-6}$, $C_{1-12}$, $C_{1-16}$, $C_{1-18}$, $C_{1-20}$, or $C_{1-24}$ alkoxy groups.

By "alkyl" and the prefix "alk" is meant a branched or unbranched saturated hydrocarbon group of 1 to 24 carbon atoms, such as methyl (Me), ethyl (Et), n-propyl (n-Pr), isopropyl (i-Pr), cyclopropyl, n-butyl (n-Bu), isobutyl (i-Bu), s-butyl (s-Bu), t-butyl (t-Bu), cyclobutyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic (e.g., $C_{3-24}$ cycloalkyl) or acyclic. The alkyl group can be branched or unbranched. The alkyl group can also be substituted or unsubstituted. For example, the alkyl group can include haloalkyl, in which the alkyl group is substituted by one or more halo groups, as described herein. In another example, the alkyl group can be substituted with one, two, three or, in the case of alkyl groups of two carbons or more, four substituents independently selected from the group consisting of: (1) $C_{1-6}$ alkoxy (e.g., —O-Ak, wherein Ak is optionally substituted $C_{1-6}$ alkyl); (2) amino (e.g., —$NR^{N1}R^{N2}$ where each of $R^{N1}$ and $R^{N2}$ is, independently, H or optionally substituted alkyl, or $R^{N1}$ and $R^{N2}$, taken together with the nitrogen atom to which each are attached, form a heterocyclyl group); (3) aryl; (4) arylalkoxy (e.g., —O-Lk-Ar, wherein Lk is a bivalent form of optionally substituted alkyl and Ar is optionally substituted aryl); (5) aryloyl (e.g., —C(O)—Ar, wherein Ar is optionally substituted aryl); (6) cyano (e.g., —CN); (7) carboxyaldehyde (e.g., —C(O)H); (8) carboxyl (e.g., —$CO_2H$); (9) $C_{3-8}$ cycloalkyl (e.g., a monovalent saturated or unsaturated non-aromatic cyclic $C_{3-8}$ hydrocarbon group); (10) halo (e.g., F, Cl, Br, or I); (11) heterocyclyl (e.g., a 5-, 6- or 7-membered ring, unless otherwise specified, containing one, two, three, or four non-carbon heteroatoms, such as nitrogen, oxygen, phosphorous, sulfur, or halo); (12) heterocyclyloxy (e.g., —O-Het, wherein Het is heterocyclyl, as described herein); (13) heterocyclyloyl (e.g., —C(O)—Het, wherein Het is heterocyclyl, as described herein); (14) hydroxyl (e.g., —OH); (15)N-protected amino; (16) nitro (e.g., —$NO_2$); (17) oxo (e.g., =O); (18) —$CO_2R^A$, where $R^A$ is selected from the group consisting of (a) $C_{1-6}$ alkyl, (b) $C_{4-18}$ aryl, and (c) ($C_{4-18}$ aryl) $C_{1-6}$ alkyl (e.g., -Lk-Ar, wherein Lk is a bivalent form of optionally substituted alkyl group and Ar is optionally substituted aryl); (19) —$C(O)NR^BR^C$, where each of $R^B$ and $R^C$ is, independently, selected from the group consisting of (a) hydrogen, (b) $C_{1-6}$ alkyl, (c) $C_{4-18}$ aryl, and (d) ($C_{4-18}$ aryl) $C_{1-6}$ alkyl (e.g., -Lk-Ar, wherein Lk is a bivalent form of optionally substituted alkyl group and Ar is optionally substituted aryl); and (20) —$NR^GR^H$, where each of $R^G$ and $R^H$ is, independently, selected from the group consisting of (a) hydrogen, (b) an N-protecting group, (c) $C_{1-6}$ alkyl, (d) $C_{2-6}$ alkenyl (e.g., optionally substituted alkyl having one or more double bonds), (e) $C_{2-6}$ alkynyl (e.g., optionally substituted alkyl having one or more triple bonds), (f) $C_{4-18}$ aryl, (g) ($C_{4-18}$ aryl) $C_{1-6}$ alkyl (e.g., Lk-Ar, wherein Lk is a bivalent form of optionally substituted alkyl group and Ar is optionally substituted aryl), (h) $C_{3-8}$ cycloalkyl, and (i) ($C_{3-8}$ cycloalkyl) $C_{1-6}$ alkyl (e.g., -Lk-Cy, wherein Lk is a bivalent form of optionally substituted alkyl group and Cy is optionally substituted cycloalkyl, as described herein), wherein in one embodiment no two groups are bound to the nitrogen atom through a carbonyl group. The alkyl group can be a primary, secondary, or tertiary alkyl group substituted with one or more substituents (e.g., one or more halo or alkoxy). In some embodiments, the unsubstituted alkyl group is a $C_{1-3}$, $C_{1-6}$, $C_{1-12}$, $C_{1-16}$, $C_{1-18}$, $C_{1-20}$, or $C_{1-24}$ alkyl group.

By "alkylene" is meant a multivalent (e.g., bivalent) form of an alkyl group, as described herein. Exemplary alkylene groups include methylene, ethylene, propylene, butylene, etc. In some embodiments, the alkylene group is a $C_{1-3}$, $C_{1-6}$, $C_{1-12}$, $C_{1-16}$, $C_{1-18}$, $C_{1-20}$, $C_{1-24}$, $C_{2-3}$, $C_{2-6}$, $C_{2-12}$, $C_{2-16}$, $C_{2-18}$, $C_{2-20}$, or $C_{2-24}$ alkylene group. The alkylene group can be branched or unbranched. The alkylene group can also be substituted or unsubstituted. For example, the alkylene group can be substituted with one or more substitution groups, as described herein for alkyl.

By "alkynyl" is meant an optionally substituted $C_{2-24}$ alkyl group having one or more triple bonds. The alkynyl group can be cyclic or acyclic and is exemplified by ethynyl, 1-propynyl, and the like. The alkynyl group can also be substituted or unsubstituted. For example, the alkynyl group can be substituted with one or more substitution groups, as described herein for alkyl.

By "alkynylene" is meant a multivalent (e.g., bivalent) form of an alkynyl group, which is an optionally substituted $C_{2-24}$ alkyl group having one or more triple bonds. The alkynylene group can be cyclic or acyclic. The alkynylene group can be substituted or unsubstituted. For example, the alkynylene group can be substituted with one or more substitution groups, as described herein for alkyl. Exemplary, non-limiting alkynylene groups include —C≡C— or —C≡$CH_2$—.

By "amino" is meant —$NR^{N1}R^{N2}$, where each of $R^{N1}$ and $R^{N2}$ is, independently, H, optionally substituted alkyl, or optionally substituted aryl, or $R^{N1}$ and $R^{N2}$, taken together with the nitrogen atom to which each are attached, form a heterocyclyl group, as defined herein.

By "aryl" is meant a group that contains any carbon-based aromatic group including, but not limited to, phenyl, benzyl, anthracenyl, anthryl, benzocyclobutenyl, benzocyclooctenyl, biphenylyl, chrysenyl, dihydroindenyl, fluoranthenyl, indacenyl, indenyl, naphthyl, phenanthryl, phenoxybenzyl, picenyl, pyrenyl, terphenyl, and the like, including fused benzo-$C_{4-8}$ cycloalkyl radicals (e.g., as defined herein) such as, for instance, indanyl, tetrahydronaphthyl, fluorenyl, and the like. The term aryl also includes heteroaryl, which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term non-heteroaryl, which is also included in the term aryl, defines a group that contains an aromatic group that does not contain a heteroatom. The aryl group can be substituted or unsubstituted. The aryl group can be substituted with one, two, three, four, or five substituents, such as any described herein for alkyl.

By "arylene" is meant a multivalent (e.g., bivalent) form of an aryl group, as described herein. Exemplary arylene groups include phenylene, naphthylene, biphenylene, triphenylene, diphenyl ether, acenaphthenylene, anthrylene, or phenanthrylene. In some embodiments, the arylene group is a $C_{4-18}$, $C_{4-14}$, $C_{4-12}$, $C_{4-10}$, $C_{6-18}$, $C_{6-14}$, $C_{6-12}$, or $C_{6-10}$ arylene group. The arylene group can be branched or unbranched. The arylene group can also be substituted or unsubstituted. For example, the arylene group can be substituted with one or more substitution groups, as described herein for alkyl or aryl.

By "(aryl)(alkyl)ene" is meant a bivalent form including an arylene group, as described herein, attached to an alkylene or a heteroalkylene group, as described herein. In some embodiments, the (aryl)(alkyl)ene group is -L-Ar- or -L-Ar-L- or -Ar-L-, in which Ar is an arylene group and each L is, independently, an optionally substituted alkylene group or an optionally substituted heteroalkylene group.

By "carbonyl" is meant a —C(O)— group, which can also be represented as >C═O, or a —CO group.

By "carboxyl" is meant a —$CO_2H$ group.

By "carboxyalkyl" is meant an alkyl group, as defined herein, substituted by one or more carboxyl groups, as defined herein.

By "carboxyaryl" is meant an aryl group, as defined herein, substituted by one or more carboxyl groups, as defined herein.

By "cyclic anhydride" is meant a 3-, 4-, 5-, 6- or 7-membered ring (e.g., a 5-, 6- or 7-membered ring), unless otherwise specified, having a —C(O)—O—C(O)— group within the ring. The term "cyclic anhydride" also includes bicyclic, tricyclic and tetracyclic groups in which any of the above rings is fused to one, two, or three rings independently selected from the group consisting of an aryl ring, a cyclohexane ring, a cyclohexene ring, a cyclopentane ring, a cyclopentene ring, and another monocyclic heterocyclic ring. Exemplary cyclic anhydride groups include a radical formed from succinic anhydride, glutaric anhydride, maleic anhydride, phthalic anhydride, isochroman-1,3-dione, oxepanedione, tetrahydrophthalic anhydride, hexahydrophthalic anhydride, pyromellitic dianhydride, naphthalic anhydride, 1,2-cyclohexanedicarboxylic anhydride, etc., by removing one or more hydrogen. Other exemplary cyclic anhydride groups include dioxotetrahydrofuranyl, dioxodihydroisobenzofuranyl, etc. The cyclic anhydride group can also be substituted or unsubstituted. For example, the cyclic anhydride group can be substituted with one or more groups including those described herein for heterocyclyl.

By "cycloalkenyl" is meant a monovalent unsaturated non-aromatic or aromatic cyclic hydrocarbon group of from three to eight carbons, unless otherwise specified, having one or more double bonds. The cycloalkenyl group can also be substituted or unsubstituted. For example, the cycloalkenyl group can be substituted with one or more groups including those described herein for alkyl.

By "cycloalkyl" is meant a monovalent saturated or unsaturated non-aromatic or aromatic cyclic hydrocarbon group of from three to eight carbons, unless otherwise specified, and is exemplified by cyclopropyl, cyclobutyl, cyclopentyl, cyclopentadienyl, cyclohexyl, cycloheptyl, bicyclo[2.2.1.]heptyl, and the like. The cycloalkyl group can also be substituted or unsubstituted. For example, the cycloalkyl group can be substituted with one or more groups including those described herein for alkyl.

By "halo" is meant F, Cl, Br, or I.

By "haloalkyl" is meant an alkyl group, as defined herein, substituted with one or more halo.

By "heteroalkyl" is meant an alkyl group, as defined herein, containing one, two, three, or four non-carbon heteroatoms (e.g., independently selected from the group consisting of nitrogen, oxygen, phosphorous, sulfur, selenium, or halo).

By "heteroalkylene" is meant a bivalent form of an alkylene group, as defined herein, containing one, two, three, or four non-carbon heteroatoms (e.g., independently selected from the group consisting of nitrogen, oxygen, phosphorous, sulfur, selenium, or halo). The heteroalkylene group can be substituted or unsubstituted. For example, the heteroalkylene group can be substituted with one or more substitution groups, as described herein for alkyl.

By “heterocyclyl” is meant a 3-, 4-, 5-, 6- or 7-membered ring (e.g., a 5-, 6- or 7-membered ring), unless otherwise specified, containing one, two, three, or four non-carbon heteroatoms (e.g., independently selected from the group consisting of nitrogen, oxygen, phosphorous, sulfur, selenium, or halo). The 3-membered ring has zero to one double bonds, the 4- and 5-membered ring has zero to two double bonds, and the 6- and 7-membered rings have zero to three double bonds. The term “heterocyclyl” also includes bicyclic, tricyclic and tetracyclic groups in which any of the above heterocyclic rings is fused to one, two, or three rings independently selected from the group consisting of an aryl ring, a cyclohexane ring, a cyclohexene ring, a cyclopentane ring, a cyclopentene ring, and another monocyclic heterocyclic ring, such as indolyl, quinolyl, isoquinolyl, tetrahydroquinolyl, benzofuryl, benzothienyl and the like. Heterocyclics include acridinyl, adenyl, alloxazinyl, azaadamantanyl, azabenzimidazolyl, azabicyclononyl, azacycloheptyl, azacyclooctyl, azacyclononyl, azahypoxanthinyl, azaindazolyl, azaindolyl, azecinyl, azepanyl, azepinyl, azetidinyl, azetyl, aziridinyl, azirinyl, azocanyl, azocinyl, azonanyl, benzimidazolyl, benzisothiazolyl, benzisoxazolyl, benzodiazepinyl, benzodiazocinyl, benzodihydrofuryl, benzodioxepinyl, benzodioxinyl, benzodioxanyl, benzodioxocinyl, benzodioxolyl, benzodithiepinyl, benzodithiinyl, benzodioxocinyl, benzofuranyl, benzophenazinyl, benzopyranonyl, benzopyranyl, benzopyrenyl, benzopyronyl, benzoquinolinyl, benzoquinolizinyl, benzothiadiazepinyl, benzothiadiazolyl, benzothiazepinyl, benzothiazocinyl, benzothiazolyl, benzothienyl, benzothiophenyl, benzothiazinonyl, benzothiazinyl, benzothiopyranyl, benzothiopyronyl, benzotriazepinyl, benzotriazinonyl, benzotriazinyl, benzotriazolyl, benzoxathiinyl, benzotrioxepinyl, benzoxadiazepinyl, benzoxathiazepinyl, benzoxathiepinyl, benzoxathiocinyl, benzoxazepinyl, benzoxazinyl, benzoxazocinyl, benzoxazolinonyl, benzoxazolinyl, benzoxazolyl, benzylsultamyl benzylsultimyl, bipyrazinyl, bipyridinyl, carbazolyl (e.g., 4H-carbazolyl), carbolinyl (e.g., O-carbolinyl), chromanonyl, chromanyl, chromenyl, cinnolinyl, coumarinyl, cytdinyl, cytosinyl, decahydroisoquinolinyl, decahydroquinolinyl, diazabicyclooctyl, diazetyl, diaziridinethionyl, diaziridinonyl, diaziridinyl, diazirinyl, dibenzisoquinolinyl, dibenzoacridinyl, dibenzocarbazolyl, dibenzofuranyl, dibenzophenazinyl, dibenzopyranonyl, dibenzopyronyl (xanthonyl), dibenzoquinoxalinyl, dibenzothiazepinyl, dibenzothiepinyl, dibenzothiophenyl, dibenzoxepinyl, dihydroazepinyl, dihydroazetyl, dihydrofuranyl, dihydrofuryl, dihydroisoquinolinyl, dihydropyranyl, dihydropyridinyl, dihydroypyridyl, dihydroquinolinyl, dihydrothienyl, dihydroindolyl, dioxanyl, dioxazinyl, dioxindolyl, dioxiranyl, dioxenyl, dioxinyl, dioxobenzofuranyl, dioxolyl, dioxotetrahydrofuranyl, dioxothiomorpholinyl, dithianyl, dithiazolyl, dithienyl, dithiinyl, furanyl, furazanyl, furoyl, furyl, guaninyl, homopiperazinyl, homopiperidinyl, hypoxanthinyl, hydantoinyl, imidazolidinyl, imidazolinyl, imidazolyl, indazolyl (e.g., 1H-indazolyl), indolenyl, indolinyl, indolizinyl, indolyl (e.g., 1H-indolyl or 3H-indolyl), isatinyl, isatyl, isobenzofuranyl, isochromanyl, isochromenyl, isoindazoyl, isoindolinyl, isoindolyl, isopyrazolonyl, isopyrazolyl, isoxazolidiniyl, isoxazolyl, isoquinolinyl, isoquinolinyl, isothiazolidinyl, isothiazolyl, morpholinyl, naphthindazolyl, naphthindolyl, naphthiridinyl, naphthopyranyl, naphthothiazolyl, naphthothioxolyl, naphthotriazolyl, naphthoxindolyl, naphthyridinyl, octahydroisoquinolinyl, oxabicycloheptyl, oxauracil, oxadiazolyl, oxazinyl, oxaziridinyl, oxazolidinyl, oxazolidonyl, oxazolinyl, oxazolonyl, oxazolyl, oxepanyl, oxetanonyl, oxetanyl, oxetyl, oxtenayl, oxindolyl, oxiranyl, oxobenzoisothiazolyl, oxochromenyl, oxoisoquinolinyl, oxoquinolinyl, oxothiolanyl, phenanthridinyl, phenanthrolinyl, phenazinyl, phenothiazinyl, phenothienyl (benzothiofuranyl), phenoxathiinyl, phenoxazinyl, phthalazinyl, phthalazonyl, phthalidyl, phthalimidinyl, piperazinyl, piperidinyl, piperidonyl (e.g., 4-piperidonyl), pteridinyl, purinyl, pyranyl, pyrazinyl, pyrazolidinyl, pyrazolinyl, pyrazolopyrimidinyl, pyrazolyl, pyridazinyl, pyridinyl, pyridopyrazinyl, pyridopyrimidinyl, pyridyl, pyrimidinyl, pyrimidyl, pyronyl, pyrrolidinyl, pyrrolidonyl (e.g., 2-pyrrolidonyl), pyrrolinyl, pyrrolizidinyl, pyrrolyl (e.g., 2H-pyrrolyl), pyrylium, quinazolinyl, quinolinyl, quinolizinyl (e.g., 4H-quinolizinyl), quinoxalinyl, quinuclidinyl, selenazinyl, selenazolyl, selenophenyl, succinimidyl, sulfolanyl, tetrahydrofuranyl, tetrahydrofuryl, tetrahydroisoquinolinyl, tetrahydroisoquinolyl, tetrahydropyridinyl, tetrahydropyridyl (piperidyl), tetrahydropyranyl, tetrahydropyronyl, tetrahydroquinolinyl, tetrahydroquinolyl, tetrahydrothienyl, tetrahydrothiophenyl, tetrazinyl, tetrazolyl, thiadiazinyl (e.g., 6H-1,2,5-thiadiazinyl or 2H,6H-1,5,2-dithiazinyl), thiadiazolyl, thianthrenyl, thianyl, thianaphthenyl, thiazepinyl, thiazinyl, thiazolidinedionyl, thiazolidinyl, thiazolyl, thienyl, thiepanyl, thiepinyl, thietanyl, thietyl, thiiranyl, thiocanyl, thiochromanonyl, thiochromanyl, thiochromenyl, thiodiazinyl, thiodiazolyl, thioindoxyl, thiomorpholinyl, thiophenyl, thiopyranyl, thiopyronyl, thiotriazolyl, thiourazolyl, thioxanyl, thioxolyl, thymidinyl, thyminyl, triazinyl, triazolyl, trithianyl, urazinyl, urazolyl, uretidinyl, uretinyl, uricyl, uridinyl, xanthenyl, xanthinyl, xanthionyl, and the like, as well as modified forms thereof (e.g., including one or more oxo and/or amino) and salts thereof. The heterocyclyl group can be substituted or unsubstituted. For example, the heterocyclyl group can be substituted with one or more substitution groups, as described herein for alkyl.

By “hydrocarbyl” is meant a univalent group formed by removing a hydrogen atom from a hydrocarbon. Non-limiting unsubstituted hydrocarbyl groups include alkyl, alkenyl, alkynyl, and aryl, as defined herein, in which these groups include only carbon and hydrogen atoms. The hydrocarbyl group can be substituted or unsubstituted. For example, the hydrocarbyl group can be substituted with one or more substitution groups, as described herein for alkyl. In other embodiments, any alkyl or aryl group herein can be replaced with a hydrocarbyl group, as defined herein.

By “hydroxyl” is meant —OH.

By “hydroxyalkyl” is meant an alkyl group, as defined herein, substituted by one to three hydroxyl groups, with the proviso that no more than one hydroxyl group may be attached to a single carbon atom of the alkyl group and is exemplified by hydroxymethyl, dihydroxypropyl, and the like.

By “hydroxyaryl” is meant an aryl group, as defined herein, substituted by one to three hydroxyl groups, with the proviso that no more than one hydroxyl group may be attached to a single carbon atom of the aryl group and is exemplified by hydroxyphenyl, dihydroxyphenyl, and the like.

By “isocyanato” is meant —NCO.

By “oxido” is meant an —$O^-$ group.

By “oxo” is meant an ═O group.

By “phosphine” is meant a trivalent or tetravalent phosphorous having hydrocarbyl moieties. In some embodiments, phosphine is a —$PR^P_3$ group, where each $R^P$ is, independently, H, optionally substituted alkyl, or optionally substituted aryl. The phosphine group can be substituted or unsubstituted. For example, the phosphine group can be substituted with one or more substitution groups, as described herein for alkyl.

By "selenol" is meant an —SeH group.

By "tellurol" is meant an —TeH group.

By "thioisocyanato" is meant —NCS.

By "thiol" is meant an —SH group.

As used herein, the term "about" means +/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION

Figure 1A:
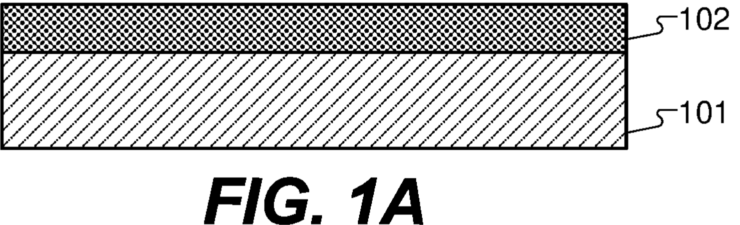
FIG. 1A-1C presents schematic diagrams of non-limiting stacks. Provided are (A) a stack including a non-limiting sensitized film 102; (B) a schematic of a non-limiting precursor to provide a resist material that incorporates an EUV sensitizer; and (C) a schematic of a non-limiting system to form a sensitized film.

This disclosure relates generally to the field of semiconductor processing. In particular aspects, the disclosure is directed to methods and apparatuses that employ EUV photoresists in combination with an EUV sensitizer. In some embodiments, processing of EUV photoresists (e.g., EUV-sensitive metal and/or metal oxide-containing resist films) can include EUV patterning and EUV patterned film development to form a patterning mask.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

EUV lithography makes use of EUV resists that are patterned to form masks for use in etching underlying layers. EUV resists may be polymer-based chemically amplified resists (CARs) produced by liquid-based spin-on techniques. An alternative to CARs are directly photopatternable metal oxide-containing films, such as those available from Inpria Corp. (Corvallis, OR), and described, for example, in U.S. Pat Pub. Nos. US 2017/0102612, US 2016/0216606, and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in International Appl. No. PCT/US19/31618, filed May 9, 2019, published as International Pub. No. WO2019/217749 and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

Directly photopatternable EUV resists may be composed of or contain metals and/or metal oxides mixed within organic components. The metals/metal oxides are highly promising in that they can enhance the EUV photon adsorption, generate secondary electrons, and/or show increased etch selectivity to an underlying film stack and device layers. Up to date, these resists have been developed using a wet (solvent) approach, which requires the wafer to move to the track, where it is exposed to developing solvent, dried, and then baked. This wet development step does not only limit productivity but can also lead to line collapse due to surface tension effects during the evaporation of solvent between fine features.

Sensitized Films and Stacks Thereof

The present disclosure relates to use of sensitized films and describes various compounds for depositing such a film. In particular embodiments, the sensitized film is disposed on a top surface of a substrate, in which the film includes two components: an EUV resist material and an EUV sensitizer. In particular embodiments, the EUV sensitizer is dispersed throughout the film. In some embodiments, the EUV sensitizer is incorporated into the metal-containing precursor that provides the EUV resist material.

Such an incorporation can include a bond (e.g., a covalent bond) between the EUV sensitizer and the metal-containing precursor. In other embodiments, the concentration gradient of the EUV sensitizer within the film is constant or varied. Such sensitized films can be deposited in any useful manner, and details of such methods are also described herein.

FIG. 1A provides a non-limiting stack including a substrate 101 (e.g., a semiconductor substrate) having a top surface and a sensitized film 102 disposed on the top surface of the substrate 101. The film can include any useful EUV-sensitive material (e.g., any described herein) or photoresist (PR) in combination with any useful EUV sensitizer.

Figure 1B:
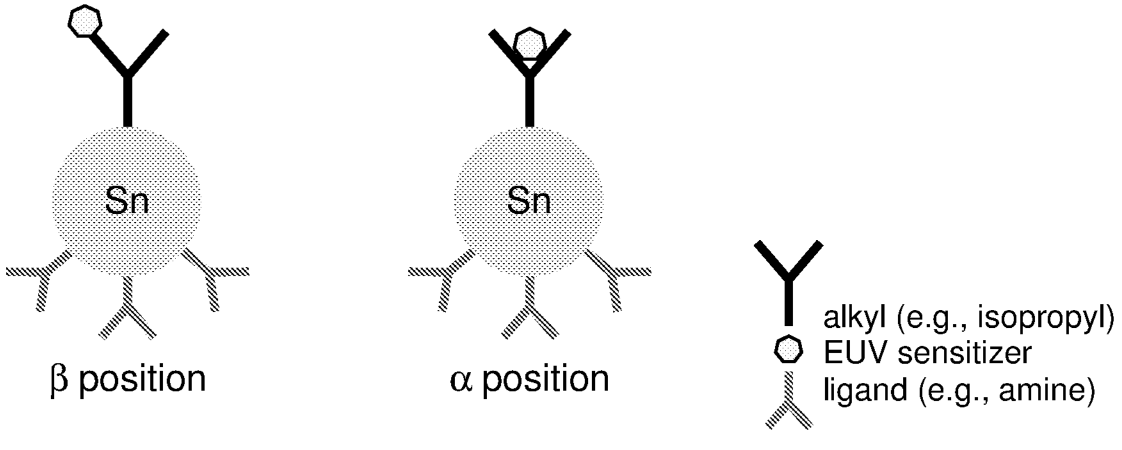

The sensitized film can be formed using any useful precursor to provide the EUV resist material and the EUV sensitizer. FIG. 1B provides a non-limiting precursor having an EUV resist material (or a precursor thereof) that incorporates an EUV sensitizer. As can be seen, the precursor can include an organometallic material having an alkyl group (black) and a plurality of ligands (gray). In addition, the alkyl group can incorporate an EUV sensitizer in the β-position (left in FIG. 1B) or in the α-position (right in FIG. 1B). In some embodiments, upon EUV exposure, the alkyl group can be released by way of an elimination reaction. Additional precursors for EUV sensitizers and EUV resist materials are described herein.

The sensitized film can include any useful amount of sensitizer. In one embodiment, the amount of sensitizer provides a sensitized film that, during patterning, results in a reduced EUV dose, as compared to patterning in a film without the sensitizer. Without wishing to be limited by mechanism, the sensitized film can generate a directional flux of primary and/or secondary photoelectrons into the film, thereby providing additional radiation to pattern the film. In one instance, the thickness of the sensitized film can be, e.g., of from about 5 nm to about 200 nm.

The sensitized film can be deposited in any useful manner, as described herein. Non-limiting deposition techniques include atomic layer deposition (ALD) (e.g., thermal ALD and plasma-enhanced ALD (PE-ALD)), spin-coat deposition, physical vapor deposition (PVD) including PVD co-sputtering, chemical vapor deposition (CVD), plasma enhanced CVD (PE-CVD), low pressure CVD (LP-CVD), sputter deposition, electron-beam (e-beam) deposition including e-beam co-evaporation, etc., or a combination thereof.

Figure 1C:
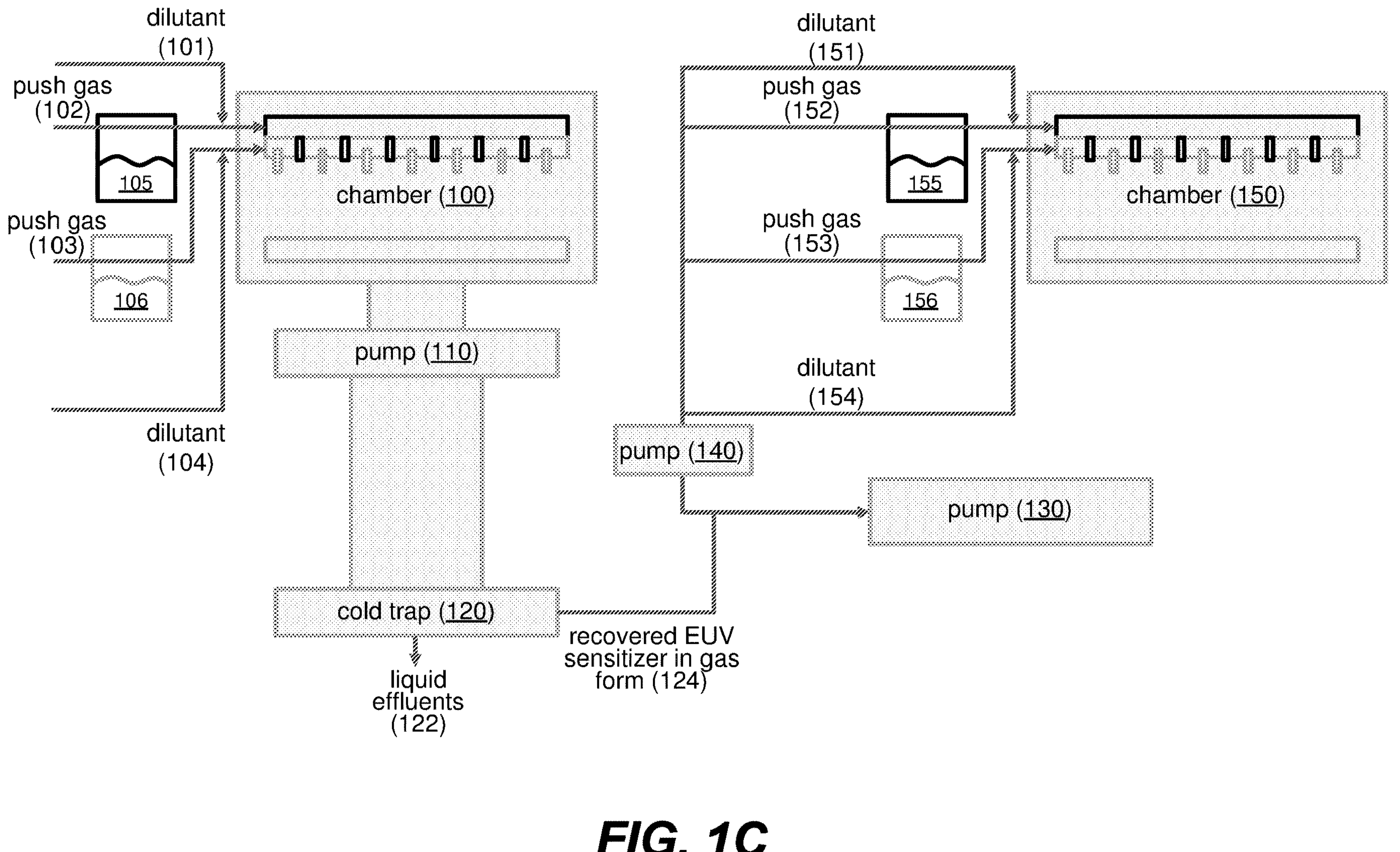

FIG. 1C provides a non-limiting system for depositing a sensitized film layer. As can be seen, the system can include a first deposition chamber 100 and a vapor delivery system for delivering a precursor 105 for an EUV resist material (e.g., any described herein) and delivering an optional counter-reactant 106 (e.g., any described herein). Such delivery can be accomplished in any useful manner. In one instance, a first push gas 102 is passed over the precursor 105, and a second push gas 103 is passed over the counter-reactant 106 to provide the compounds in vapor form. Alternatively, a bubbler gas can be passed through the liquid precursor 105 or the liquid counter-reactant 106, and the bubbler gas having the precursor or counter-reactant in vapor form is delivered into the chamber 100. Furthermore, the vapor delivery system can employ of one or more dilutants, in which a first dilutant 101 is provided in gas form to dilute the gas stream delivering the precursor and in which a second dilutant 104 is provided in gas form to dilute the gas stream delivering the counter-reactant. Thus, as can be seen, the EUV sensitizer (or a precursor for the EUV sensitizer) can be provided as a push gas 102, 103, a bubbler gas, and/or a dilutant 101, 104.

As also seen in FIG. 1C, after or during deposition, the effluent gas within the chamber 100 can be evacuated with a pump 110 and collected by use of a cold trap 120. The temperature of the cold trap can be optimized to separate the EUV sensitizer in gas form 124 from the effluent 122 having the remaining compounds in liquid form. In this way, the unreacted sensitizer can be recovered for possible reuse or storage. In one embodiment, the temperature of the trap is above the boiling point of the EUV sensitizer to be trapped and below the boiling point of other compounds within the effluent. For instance, the boiling point of xenon is about −108° C., and the trap temperature is above −108° C. (e.g., from −60° C. to −40° C.), thereby recovering xenon in a gas phase.

The recovered sensitizer can be stored for reuse immediately or at a later time. In one embodiment, the system can include use of a first pump 130 to liquify the EUV sensitizer from a gas form and store the EUV sensitizer as a liquid. In another embodiment, the system can include use of a second pump 140 to deliver the recovered EUV sensitizer to a second stage deposition chamber 150. Similar to the reagents provided in the first stage deposition chamber 100, the system can include a vapor delivery system for delivering a precursor 155 for an EUV resist material (e.g., any described herein) and delivering a counter-reactant 156 (e.g., any described herein) to the chamber 150. In one instance, a third push gas 152 is passed over the precursor 155, and a fourth push gas 153 is passed over the counter-reactant 156 to provide the compounds in vapor form. Alternatively, a bubbler gas can be passed through the liquid precursor 155 or the liquid counter-reactant 156, and the bubbler gas having the precursor or counter-reactant in vapor form is delivered into the chamber 150. Furthermore, the vapor delivery system can employ a third dilutant 151 to dilute the gas stream delivering the precursor, as well as a fourth dilutant 154 to dilute the gas stream delivering the counter-reactant. The EUV sensitizer (or a precursor for the EUV sensitizer) can be provided as a push gas 152, 153, a bubbler gas, and/or a dilutant 151, 154.

Methods for Forming a Sensitized Film

A non-limiting method for forming a sensitized film can include the following operations: depositing a film having an EUV sensitizer, patterning the film through the film to provide EUV exposed areas and EUV unexposed areas, and developing the film. Alternatively, a film can be deposited using only a EUV resist material or a precursor thereof, and then an EUV sensitizer (or a precursor thereof) is implanted during or after resist deposition. Such methods can include any useful lithography processes, deposition processes, EUV exposure processes, development processes, and post-application processes, as described herein.

Figure 2A:
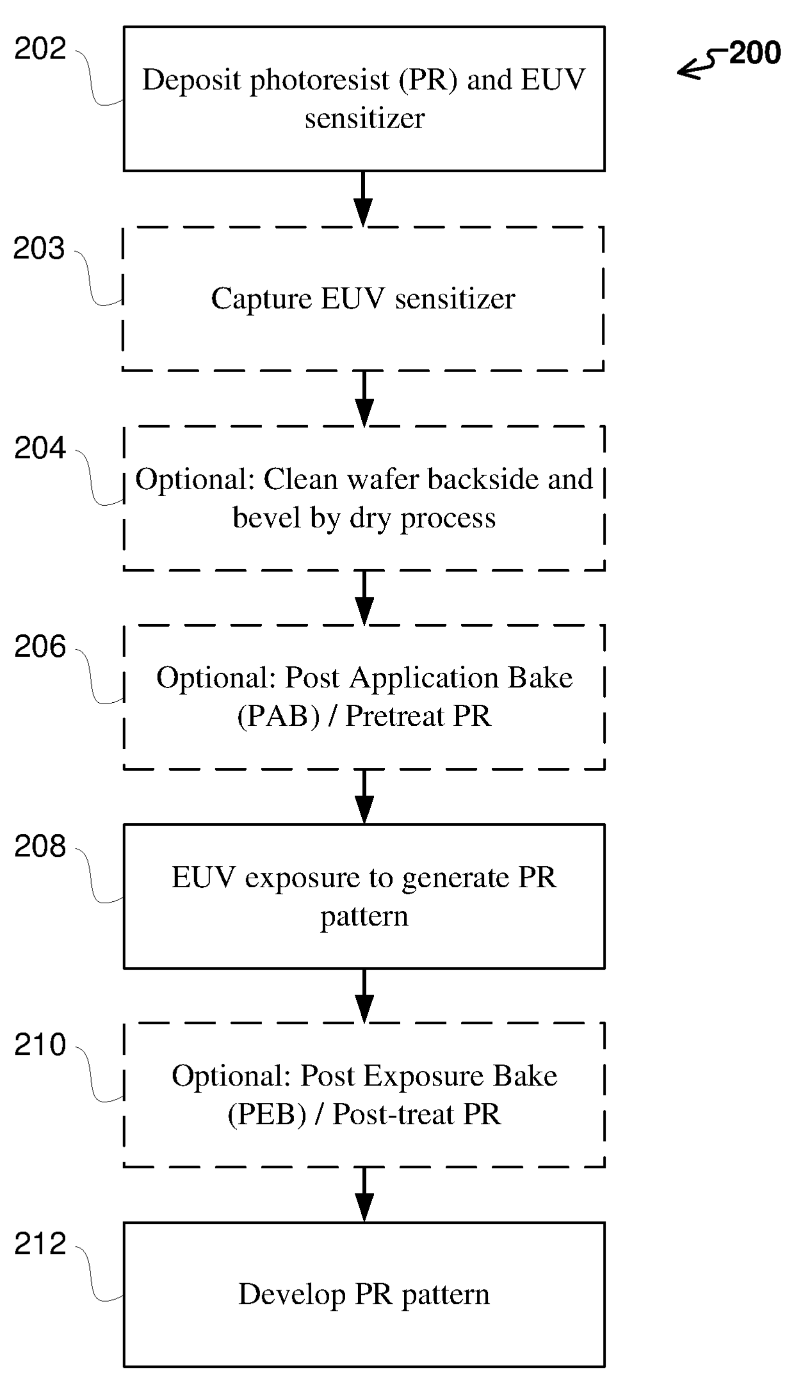
FIG. 2A-2C presents flow diagrams of non-limiting methods using a sensitized film. Provided are (A) a first non-limiting method 200 including depositing 202 a photoresist (PR) with an EUV sensitizer; (B) a second non-limiting method 220 including depositing 222 a PR and baking/pretreating 226 the PR layer in the presence of an EUV sensitizer; and (C) a third non-limiting method 240 including providing 242 a chamber with residual EUV sensitizer and depositing 244 a PR in the presence of said EUV sensitizer.

FIG. 2A provides a non-limiting method 200 for forming a sensitized film, in which the method includes depositing 202 a photoresist and an EUV sensitizer as a sensitized film on a top surface of a substrate, wherein the film also includes an EUV resist material. In some embodiments, the EUV resist material and/or the EUV sensitizer is provided in gas form.

The method can further include patterning 208 the film by an EUV exposure to generate a PR pattern and developing 212 the film, thereby providing a PR pattern within the film. In various embodiments of development, the exposed regions are removed (positive tone) or the unexposed regions are removed (negative tone). In some embodiments, development may include a selective deposition on either the exposed or unexposed regions of the PR, followed by an etching operation.

Optional steps may be conducted to further treat the substrate and/or film. In one instance, the method can include an optional step 204 of cleaning the backside surface or bevel of the substrate or removing an edge bead of the photoresist that was deposited in the prior step. Such cleaning or removing steps can be useful for removing particles that may be present after depositing a photoresist layer. In another instance, the method can include an optional step 206 of performing a post application bake (PAB) of the deposited photoresist layer, thereby removing residual moisture from the layer to form a film; or pretreating the photoresist layer in any useful manner. In yet another instance, the method can include an optional step 210 of performing a post exposure bake (PEB) of the exposed photoresist layer, thereby further removing residual moisture from the layer or promoting chemical condensation within the film; or post-treating the photoresist layer in any useful manner. In another instance, the method can include an optional step 203 of capturing the EUV sensitizer after the deposition step 202. Additional post-application processes are described herein, and any of these processes can be conducted as an optional step for any method described herein.

The EUV sensitizer can be introduced at any useful phase before, during, or after deposition. In one instance, deposition can include the use of precursors for both the EUV resist material and the EUV sensitizer within the deposition chamber. Such precursors can be provided in the chamber, in which the EUV sensitizer is provided as a push gas, a bubbler gas, or a dilutant. In yet another instance, the deposition chamber is provided with an existing level of an EUV sensitizer, which can then be embedded within the film while depositing the EUV resist material. In particular embodiments, the EUV sensitizer is incorporated into a precursor for the EUV resist material, such as by a covalent bond; and the resultant compound is provided in vapor form that is carried by the push gas or the bubbler gas.

In another instance, the EUV sensitizer is provided after resist deposition, such as by using a post treatment step of a photoresist layer in the presence of the EUV sensitizer or a precursor thereof. Such post treatment can include baking the PR layer in the presence of the EUV sensitizer (e.g., provided in gas form).

Figure 2B:
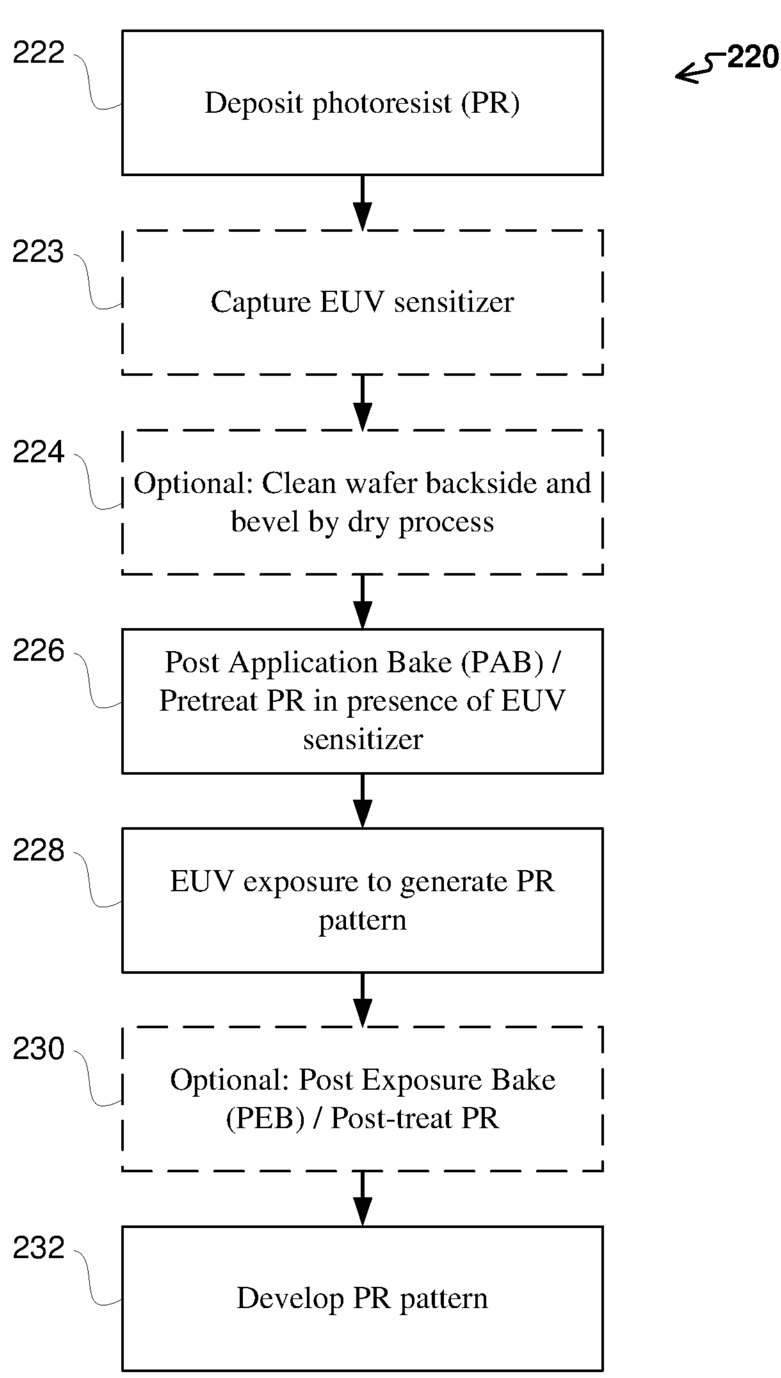

FIG. 2B provides a non-limiting method 220 for forming a sensitized film, in which the method includes depositing 222 a PR as a resist film on a top surface of a substrate and performing 226 a PAB or pretreatment in the presence of an EUV sensitizer or a precursor thereof. In this way, the EUV sensitizer can be used to dope the underlying film, thereby providing a sensitized film. The method can further include patterning 228 the film by an EUV exposure to provide a PR pattern and developing 232 the film, thereby providing a PR pattern within the film.

Figure 2C:
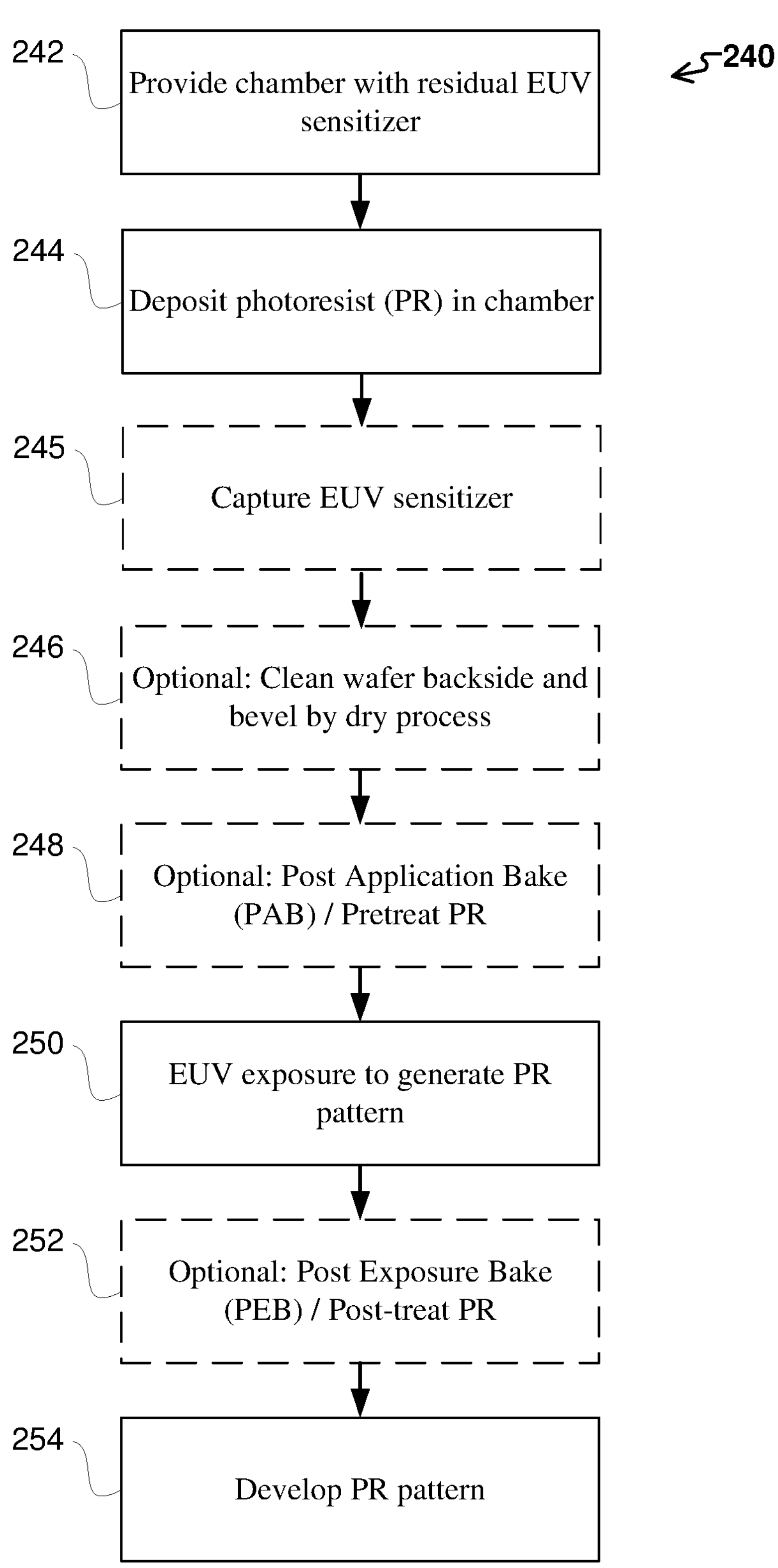

FIG. 2C provides another non-limiting method 240 for forming a sensitized film, in which the method includes providing 242 a chamber with residual EUV sensitizer or a precursor thereof and depositing 244 a PR as a resist film on a top surface of a substrate, thereby allowing residual EUV sensitizer to be included within the film during deposition to provide a sensitized film. The method can further include patterning 250 the film by an EUV exposure to provide a PR pattern and developing 254 the film, thereby providing a PR pattern within the film.

As seen in FIG. 2B-2C, optional steps may be conducted, including a step 224, 246 of cleaning the backside surface or bevel of the substrate or removing an edge bead of the PR that was deposited in the prior step; a step 248 of performing a PAB of the deposited PR layer, thereby removing residual moisture from the layer to form a film or pretreating the PR layer in any useful manner; a step 230, 252 of performing a PEB of the exposed PR layer, thereby further removing residual moisture from the layer or promoting chemical condensation within the film or post-treating the PR layer in any useful manner; and/or a step 223, 245 of capturing unreacted EUV sensitizer after deposition 222, 244.

Any useful type of chemistry can be employed during the depositing and/or developing steps. Such steps may be based on dry processes employing chemistry in a gaseous phase or wet processes employing chemistry in a wet phase. Various embodiments include combining all dry operations of film formation by vapor deposition, (EUV) lithographic photopatterning, dry stripping, and dry development. Various other embodiments include dry processing operations described herein advantageously combined with wet processing operations, for example, spin-on EUV photoresists (wet process), such as available from Inpria Corp., may be combined with dry development or other wet or dry processes as described herein. In various embodiments, the wafer clean may be a wet process as described herein, while other processes are dry processes. In yet other embodiments, a wet development process may be used.

EUV Sensitizers

The EUV sensitizer can be any useful compound having enhanced photoabsorption. In some embodiments, the compound has a photoabsorption cross-section of from about 9E+04 $cm^2/g$ to about 1.2E+05 $cm^2/g$ (e.g., at 93.4 eV or at 92 eV, which relates to absorption of EUV light at about 13.5 nm).

In one embodiment, the EUV sensitizer is provided in a gas form. In other embodiments, the compound is characterized by a density that provides a gas at standard temperature and pressure, e.g., a density of less than about 5 $g/cm^3$ or a density of from about 0.002 $g/cm^3$ to about 5 $g/cm^3$. In particular embodiments, the EUV sensitizer has a photoabsorption cross-section of from about 9E+04 $cm^2/g$ to about 1.2E+05 $cm^2/g$ (e.g., at 93.4 eV) and a density of from about 0.002 $g/cm^3$ to about 5 $g/cm^3$ at standard temperature and pressure.

Non-limiting EUV sensitizers can include any compound having or being Xe or I. Any useful isotopes of Xe and I can be employed. In particular embodiments, the EUV sensitizer is $^{133}Xe$, $^{136}Xe$, or $^{129}Xe$. In other embodiments, two or more isotopes are employed in combination. In other embodiments, the EUV sensitizer is formed by using an iodine-containing precursor, such as $R_1Sn(NR_2)_3$, wherein $R_1$ is an optionally substituted alkyl including one or more iodo and each R is independently alkyl. In some embodiment, the iodine-containing precursor is (1-iodo iso propyl) tris (dimethyl amino) tin, (2-iodo iso propyl) tris (dimethyl amino) tin, (2-iodo iso propyl) tris (dimethyl amino) tin, (2-iodo butyl, 1-(tris (dimethyl amino) tin)), or (3-iodo butyl, 1-(tris (dimethyl amino) tin)).

In some embodiments, the EUV sensitizer is formed by using an iodine-containing precursor, such as $I_2$, HI, an organometallic precursor comprising an iodo-substituted alkyl group, or any metal-containing precursor described herein that further includes an iodo substitution. In particular embodiments, the metal-containing precursor having iodine can include any formula described herein (e.g., formula (I), (II), (IIa), (III), (IV), (V), (VI), (VII), or (VIII), in which at least one X is I, at least one R is an iodo-substituted alkyl (e.g., α-substituted alkyl or β-substituted alkyl), and/or at least one L includes an iodo atom. In some embodiments, the iodo-substituted alkyl (e.g., for R or as employed in L) can be methyl, ethyl, n-propyl, i-propyl, t-butyl, t-pentyl, t-hexyl, cyclohexyl, i-propyl, i-butyl, sec-butyl, n-butyl, n-pentyl, or n-hexyl or derivatives thereof having one or more iodo substitutions. The iodo-substituted alkyl can be a $C_{1-10}$ alkyl including one, two, three, four, or more iodo substitutions. In other embodiments, L can be iodo, an iodo-substituted alkyl (e.g., any described herein), an amino (e.g., —$NR^1R^2$, in which each of $R^1$ and $R^2$ can be H or alkyl, such as any described herein, and in which at least one of $R^1$ or $R^2$ includes an iodo-substituted alkyl), alkoxy (e.g., —OR, in which R is an iodo-substituted alkyl), or any organic moiety including one or more iodo substitutions.

Yet additional metal-containing precursors including iodine can be $SnI_4$, $(CH_3)_3SnI$, triisopropyl(methyl(iodo) ethyl)stannane, tris(dimethylamino)(methyl(iodo)ethyl) stannane, or tris(dimethylamino)(1-methyl-2-iodo-ethyl) stannane. In other embodiments, the metal-containing precursor can be $Sn(NR_2)_4$, $SnR(NR_2)_3$, $SnR_2(NR_2)_2$, or $SnR_3(NR_2)$, wherein each of R is independently methyl, ethyl, n-propyl, or i-propyl, and at least one R is an iodo-substituted methyl, ethyl, n-propyl, or i-propyl (e.g., having one or more iodo substitutions).

The EUV sensitizer or a precursor thereof can be provided in any useful form. In one embodiment, the EUV sensitizer or its precursor is provided in gas form. In particular embodiments, the EUV sensitizer or its precursor is provided as a vapor in an inert carrier gas (e.g., a flow of iodine vapor or xenon vapor in $N_2$). Non-limiting carrier gases include, e.g., $H_2$, He, Ar, or $N_2$. In other embodiments, the EUV sensitizer or its precursor itself is provided as a gas (e.g., as $I_2$ or Xe). The EUV sensitizer or its precursor can also be provided as a plasma (e.g., an RF plasma or any other plasma condition described herein), which can be used to create a reactive species (e.g., reactive $I_2$, reactive atomic I species, reactive Xe, or a reactive atomic Xe species).

EUV Resist Materials

The methods herein can include any useful EUV resist material to provide a sensitized film (e.g., an imaging layer). The EUV resist material can be composed or of include a metal (e.g., tin (Sn), tellurium (Te), bismuth (Bi), antimony (Sb), or indium (In)); a metal oxide, such as tin oxide (e.g., $SnO_2$), tellurium oxide (e.g., $TeO_2$), bismuth oxide (e.g., $Bi_2O_3$), antimony oxide (e.g., $Sb_2O_3$), or indium oxide (e.g., $In_2O_3$); an alloy, such as tin alloys (e.g., a tin telluride alloy, an antimony telluride alloy (e.g., $Sb_2Te_3$), a bismuth telluride alloy (e.g., $Bi_2Te_3$), or a tin bismuth alloy, including an alloy having 60% tin or above); or a combination thereof. In some embodiments, the EUV resist material includes an organometal oxide (e.g., $RM(MO)_n$, in which M is a metal and R is an organic moiety having one or more carbon atoms, such as in alkyl, alkylamino, or alkoxy).

The EUV resist material can be formed by using one or more metal-containing precursors, optionally in the presence of one or more counter-reactants. In particular embodiments, the metal-containing precursor includes one or more ligands (e.g., labile ligands) that can be removed or cleaved by EUV radiation. Furthermore, the precursor can be deposited (e.g., using any deposition process described herein) and optionally processed (e.g., baked, treated, annealed, exposed to plasma, etc.) to provide a metal oxide layer (e.g., a layer including a network of metal oxide bonds, which may include other non-metal and non-oxygen groups).

Non-limiting metal-containing precursors can include a metal halide, a capping agent, or an organometallic agent. In a precursor, the metal (or M) can be any metal with a high EUV absorption cross-section (e.g., equal to or greater than $1\times10^7$ $cm^2/mol$).

The layers herein (e.g., an imaging layer, a resist film, and/or a sensitized film) may include an element (e.g., a metal atom or a non-metal atom) having a high photoabsorption cross-section, such as equal to or greater than $1\times10^7$ $cm^2/mol$. Such elements can be provided by depositing one or more precursor(s) to provide the layer.

The layers, either alone or together, can be considered a film. In some embodiments, the film is a radiation-sensitive film (e.g., an EUV-sensitive film). This film, in turn, can serve as an EUV resist, as further described herein. In particular embodiments, the layer or film can include one or more ligands (e.g., EUV labile ligands) that can be removed, cleaved, or cross-linked by radiation (e.g., EUV or DUV radiation).

The precursor can provide a patternable film that is sensitive to radiation (or a patterning radiation-sensitive film or a photopatternable film). Such radiation can include EUV radiation, DUV radiation, or UV radiation that is provided by irradiating through a patterned mask, thereby being a patterned radiation. The film itself can be altered by being exposed to such radiation, such that the film is radiation-sensitive or photosensitive. In particular embodiments, the precursor is an organometallic compound, which includes at least one metal center.

The precursor can have any useful number and type of ligand(s). In some embodiments, the ligand can be characterized by its ability to react in the presence of a counter-reactant or in the presence of patterned radiation. For instance, the precursor can include a ligand that reacts with a counter-reactant, which can introduce linkages between metal centers (e.g., an —O— linkage). In another instance, the precursor can include a ligand that eliminates in the presence of patterned radiation. Such an EUV labile ligand can include branched or linear alkyl groups having a beta-hydrogen, as well as any described herein for R in formula (I) or (II). In some embodiments, the EUV labile ligand (e.g., R in formula (I) or (II)) includes iodo.

The precursor can be any useful metal-containing precursor, such as an organometallic agent, a metal halide, or a capping agent (e.g., as described herein). In a non-limiting instance, the precursor includes a structure having formula (I):

$$M_aR_b \quad \text{(I)},$$

wherein:

- M is a metal or an atom having a high EUV absorption cross-section;
- each R is, independently, H, halo, optionally substituted alkyl, optionally substituted cycloalkyl, optionally substituted cycloalkenyl, optionally substituted alkenyl, optionally substituted alkynyl, optionally substituted alkoxy, optionally substituted alkanoyloxy, optionally substituted aryl, optionally substituted amino, optionally substituted bis(trialkylsilyl)amino, optionally substituted trialkylsilyl, oxo, an anionic ligand, a neutral ligand, or a multidentate ligand;
- $a\geq1$; and $b\geq1$.

In another non-limiting instance, the precursor includes a structure having formula (II):

$$M_aR_bL_c \quad \text{(II)},$$

wherein:

- M is a metal or an atom having a high EUV absorption cross-section;
- each R is, independently, halo, optionally substituted alkyl, optionally substituted aryl, optionally substituted amino, optionally substituted alkoxy, or L;
- each L is, independently, a ligand, an anionic ligand, a neutral ligand, a multidentate ligand, ion, or other moiety that is reactive with a counter-reactant, in which R and L with M, taken together, can optionally form a heterocyclyl group or in which R and L, taken together, can optionally form a heterocyclyl group;

a≥1; b≥1; and c≥1.

In some embodiments, each ligand within the precursor can be one that is reactive with a counter-reactant. In one instance, the precursor includes a structure having formula (II), in which each R is, independently, L. In another instance, the precursor includes a structure having formula (IIa):

$$M_aL_c \quad \text{(IIa)},$$

wherein:

M is a metal or an atom having a high EUV absorption cross-section;

each L is, independently, a ligand, ion, or other moiety that is reactive with a counter-reactant, in which two L, taken together, can optionally form a heterocyclyl group;

a≥1; and c≥1.

In particular embodiments of formula (IIa), a is 1. In further embodiments, c is 2, 3, or 4.

For any formula herein, M can be a metal or a metalloid or an atom with a high patterning radiation-absorption cross-section (e.g., an EUV absorption cross-section that is equal to or greater than $1\times10^7$ $cm^2$/mol). In some embodiments, M is tin (Sn), bismuth (Bi), tellurium (Te), cesium (Cs), antimony (Sb), indium (In), molybdenum (Mo), hafnium (Hf), iodine (I), zirconium (Zr), iron (Fe), cobalt (Co), nickel (Ni), copper (Cu), zinc (Zn), silver (Ag), platinum (Pt), and lead (Pb). In further embodiments, M is Sn, a is 1, and c is 4 in formula (I), (II), or (IIa). In other embodiments, M is Sn, a is 1, and c is 2 in formula (I), (II), or (IIa). In particular embodiments, M is Sn(II) (e.g., in formula (I), (II), or (IIa)), thereby providing a precursor that is a Sn(II)-based compound. In other embodiments, M is Sn(IV) (e.g., in formula (I), (II), or (IIa)), thereby providing a precursor that is a Sn(IV)-based compound. In particular embodiments, the precursor includes iodine (e.g., as in periodate, an iodo-substituted alkyl, or an iodo-substituted amino).

For any formula herein, each R is, independently, H, halo, optionally substituted alkyl, optionally substituted cycloalkyl, optionally substituted cycloalkenyl, optionally substituted alkenyl, optionally substituted alkynyl, optionally substituted alkoxy (e.g., —$OR^1$, in which $R^1$ can be optionally substituted alkyl), optionally substituted alkanoyloxy, optionally substituted aryl, optionally substituted amino, optionally substituted bis(trialkylsilyl)amino, optionally substituted trialkylsilyl, oxo, an anionic ligand (e.g., oxido, chlorido, hydrido, acetate, iminodiacetate, propanoate, butanoate, benzoate, etc.), a neutral ligand, or a multidentate ligand. In some embodiments, R is iodo or substituted with iodo.

In some embodiments, the optionally substituted amino is —$NR^1R^2$, in which each $R^1$ and $R^2$ is, independently, H or alkyl; or in which $R^1$ and $R^2$, taken together with the nitrogen atom to which each are attached, form a heterocyclyl group, as defined herein. In other embodiments, the optionally substituted bis(trialkylsilyl)amino is —$N(SiR^1R^2R^3)_2$, in which each $R^1$, $R^2$, and $R^3$ is, independently, optionally substituted alkyl. In yet other embodiments, the optionally substituted trialkylsilyl is —$SiR^1R^2R^3$, in which each $R^1$, $R^2$, and $R^3$ is, independently, optionally substituted alkyl. In some embodiments, $R^1$ and/or $R^2$ is iodo or substituted with iodo.

In other embodiments, the formula includes a first R (or first L) that is —$NR^1R^2$ and a second R (or second L) that is —$NR^1R^2$, in which each $R^1$ and $R^2$ is, independently, H or optionally substituted alkyl; or in which $R^1$ from a first R (or first L) and $R^1$ from a second R (or second L), taken together with the nitrogen atom and the metal atom to which each are attached, form a heterocyclyl group, as defined herein. In yet other embodiments, the formula includes a first R that is —$OR^1$ and a second R that is —$OR^1$, in which each $R^1$ is, independently, H or optionally substituted alkyl; or in which $R^1$ from a first R and $R^1$ from a second R, taken together with the oxygen atom and the metal atom to which each are attached, form a heterocyclyl group, as defined herein.

In some embodiments, at least one of R or L (e.g., in formula (I), (II), or (IIa)) is optionally substituted alkyl. Non-limiting alkyl groups include, e.g., $C_nH_{2n+1}$, where n is 1, 2, 3, or greater, such as methyl, ethyl, n-propyl, isopropyl, n-butyl, isobutyl, s-butyl, or t-butyl. In various embodiments, R or L has at least one beta-hydrogen or beta-fluorine or beta-iodine. In other embodiments, at least one of R or L is a halo-substituted alkyl (e.g., a fluoro-substituted alkyl and/or an iodo-substituted alkyl).

In some embodiments, each R or L or at least one R or L (e.g., in formula (I), (II), or (IIa)) is halo. In particular, the precursor can be a metal halide. Non-limiting metal halides include $SnBr_4$, $SnCl_4$, $SnI_4$, and $SbCl_3$.

In some embodiments, each R or L or at least one R or L (e.g., in formula (I), (II), or (IIa)) can include a nitrogen atom. In particular embodiments, one or more R or L can be optionally substituted amino, an optionally substituted monoalkylamino (e.g., —$NR^1H$, in which $R^1$ is optionally substituted alkyl), an optionally substituted dialkylamino (e.g., —$NR^1R^2$, in which each $R^1$ and $R^2$ is, independently, optionally substituted alkyl), or optionally substituted bis(trialkylsilyl)amino. Non-limiting R and L substituents can include, e.g., —$NMe_2$, —NHMe, —$NEt_2$, —NHEt, —NMeEt, —N(t-Bu)-$[CHCH_3]_2$—N(t-Bu)-(tbba), —$N(SiMe_3)_2$, and —$N(SiEt_3)_2$.

In some embodiments, each R or L or at least one R or L (e.g., in formula (I), (II), or (IIa)) can include a silicon atom. In particular embodiments, one or more R or L can be optionally substituted trialkylsilyl or optionally substituted bis(trialkylsilyl)amino. Non-limiting R or L substituents can include, e.g., —$SiMe_3$, —$SiEt_3$, —$N(SiMe_3)_2$, and —$N(SiEt_3)_2$.

In some embodiments, each R or L or at least one R or L (e.g., in formula (I), (II), or (IIa)) can include an oxygen atom. In particular embodiments, one or more R or L can be optionally substituted alkoxy or optionally substituted alkanoyloxy. Non-limiting R or L substituents include, e.g., methoxy, ethoxy, isopropoxy (i-PrO), t-butoxy (t-BuO), acetate (—OC(O)—$CH_3$), and —O═C($CH_3$)—CH═C($CH_3$)—O— (acac).

Any formulas herein can include one or more neutral ligands. Non-limiting neutral ligands include an optionally substituted amine (e.g., $NR_3$ or $R_2$N-Ak-$NR_2$, in which each R can be, independently, H, optionally substituted alkyl, optionally substituted hydrocarbyl, or optionally substituted aryl, and Ak is optionally substituted alkylene), an optionally substituted phosphine (e.g., $PR_3$ or $R_2$P-Ak-$PR_2$, in which each R can be, independently, H, optionally substituted alkyl, optionally substituted hydrocarbyl, or optionally substituted aryl, and Ak is optionally substituted alkylene), an optionally substituted ether (e.g., $OR_2$, in which each R can be, independently, H, optionally substituted alkyl, optionally substituted hydrocarbyl, or optionally substituted aryl), an optionally substituted alkyl, an optionally substituted alkene, an optionally substituted alkyne, an optionally substituted benzene, oxo, or carbon monoxide.

Any formulas herein can include one or more multidentate (e.g., bidentate) ligands. Non-limiting multidentate ligand include a diketonate (e.g., acetylacetonate (acac) or —OC($R^1$)-Ak-($R^1$)CO— or —OC($R^1$)—C($R^2$)—($R^1$)CO—), a bidentate chelating dinitrogen (e.g., —N($R^1$)-Ak-N($R^1$)— or —N($R^3$)—$CR^4$—$CR^2$═N($R^1$)—), an aromatic (e.g., —Ar—), an amidinate (e.g., —N($R^1$)—C($R^2$)—N($R^1$)—), an aminoalkoxide (e.g., —N($R^1$)-Ak-O— or —N($R^1$)$_2$-Ak-O—), a diazadienyl (e.g., —N($R^1$)—C($R^2$)—C($R^2$)—N($R^1$)—), a cyclopentadienyl, a pyrazolate, an optionally substituted heterocyclyl, an optionally substituted alkylene, or an optionally substituted heteroalkylene. In particular embodiments, each $R^1$ is, independently, H, optionally substituted alkyl, optionally substituted haloalkyl, or optionally substituted aryl; each $R^2$ is, independently, H or optionally substituted alkyl; $R^3$ and $R^4$, taken together, forms an optionally substituted heterocyclyl; Ak is optionally substituted alkylene; and Ar is optionally substituted arylene.

In particular embodiments, the precursor includes tin. In some embodiments, the tin precursor includes SnR or $SnR_2$ or $SnR_4$ or $R_3SnSnR_3$, wherein each R is, independently, H, halo, optionally substituted $C_{1-12}$ alkyl, optionally substituted $C_{1-12}$ alkoxy, optionally substituted amino (e.g., —$NR^1R^2$), optionally substituted $C_{2-12}$ alkenyl, optionally substituted $C_{2-12}$ alkynyl, optionally substituted $C_{3-8}$ cycloalkyl, optionally substituted aryl, cyclopentadienyl, optionally substituted bis(trialkylsilyl)amino (e.g., —N($SiR^1R^2R^3$)$_2$), optionally substituted alkanoyloxy (e.g., acetate), a diketonate (e.g., —OC($R^1$)-Ak-($R^2$)CO—), or a bidentate chelating dinitrogen (e.g., —N($R^1$)-Ak-N($R^1$)—). In particular embodiments, each $R^1$, $R^2$, and $R^3$ is, independently, H or $C_{1-12}$ alkyl (e.g., methyl, ethyl, isopropyl, t-butyl, or neopentyl); and Ak is optionally substituted $C_{1-6}$ alkylene. In particular embodiments, each R is, independently, halo, optionally substituted $C_{1-12}$ alkoxy, optionally substituted amino, optionally substituted aryl, cyclopentadienyl, or a diketonate. Non-limiting tin precursors include $SnF_2$, $SnH_4$, $SnBr_4$, $SnCl_4$, $SnI_4$, tetramethyl tin ($SnMe_4$), tetraethyl tin ($SnEt_4$), trimethyl tin chloride ($SnMe_3Cl$), dimethyl tin dichloride ($SnMe_2Cl_2$), methyl tin trichloride ($SnMeCl_3$), tetraallyltin, tetravinyl tin, hexaphenyl ditin (IV) ($Ph_3Sn$—$SnPh_3$, in which Ph is phenyl), dibutyldiphenyltin ($SnBu_2Ph_2$), trimethyl(phenyl) tin ($SnMe_3Ph$), trimethyl (phenylethynyl) tin, tricyclohexyl tin hydride, tributyl tin hydride ($SnBu_3H$), dibutyltin diacetate ($SnBu_2(CH_3COO)_2$), tin(II) acetylacetonate (Sn(acac)$_2$), $SnBu_3$(OEt), $SnBu_2$(OMe)$_2$, $SnBu_3$(OMe), Sn(t-BuO)$_4$, Sn(n-Bu)(t-BuO)$_3$, tetrakis(dimethylamino)tin (Sn($NMe_2$)$_4$), tetrakis (ethylmethylamino)tin (Sn(NMeEt)$_4$), tetrakis (diethylamino)tin(IV) (Sn($NEt_2$)$_4$), (dimethylamino) trimethyl tin(IV) Sn(Me)$_3$($NMe_2$), Sn(i-Pr)($NMe_2$)$_3$, Sn(n-Bu)($NMe_2$)$_3$, Sn(s-Bu)($NMe_2$)$_3$, Sn(i-Bu)($NMe_2$)$_3$, Sn(t-Bu)($NMe_2$)$_3$, Sn(t-Bu)$_2$($NMe_2$)$_2$, Sn(t-Bu)($NEt_2$)$_3$, Sn(tbba), Sn(II) (1,3-bis(1,1-dimethylethyl)-4,5-dimethyl-(4R,5R)-1,3,2-diazastannolidin-2-ylidene), or bis[bis(trimethylsilyl) amino] tin (Sn[N($SiMe_3$)$_2$]$_2$).

In other embodiments, the precursor includes bismuth, such as in $BiR_3$, wherein each R is, independently, halo, optionally substituted $C_{1-12}$ alkyl, mono-$C_{1-12}$ alkylamino (e.g., —$NR^1H$), di-$C_{1-12}$ alkylamino (e.g., —$NR^1R^2$), optionally substituted aryl, optionally substituted bis(trialkylsilyl)amino (e.g., —N($SiR^1R^2R^3$)$_2$), or a diketonate (e.g., —OC($R^4$)-Ak-($R^5$)CO—). In particular embodiments, each $R^1$, $R^2$, and $R^3$ is, independently, $C_{1-12}$ alkyl (e.g., methyl, ethyl, isopropyl, t-butyl, or neopentyl); and each $R^4$ and $R^5$ is, independently, H or optionally substituted $C_{1-12}$ alkyl (e.g., methyl, ethyl, isopropyl, t-butyl, or neopentyl). Non-limiting bismuth precursors include $BiCl_3$, $BiMe_3$, $BiPh_3$, Bi($NMe_2$)$_3$, Bi[N($SiMe_3$)$_2$]$_3$, and Bi(thd)$_3$, in which thd is 2,2,6,6-tetramethyl-3,5-heptanedionate.

In other embodiments, the precursor includes tellurium, such as $TeR_2$ or $TeR_4$, wherein each R is, independently, halo, optionally substituted $C_{1-12}$ alkyl (e.g., methyl, ethyl, isopropyl, t-butyl, and neopentyl), optionally substituted $C_{1-12}$ alkoxy, optionally substituted aryl, hydroxyl, oxo, or optionally substituted trialkylsilyl. Non-limiting tellurium precursors include dimethyl tellurium ($TeMe_2$), diethyl tellurium ($TeEt_2$), di(n-butyl) tellurium (Te(n-Bu)$_2$), di(isopropyl) tellurium (Te(i-Pr)$_2$), di(t-butyl) tellurium (Te(t-Bu)$_2$), t-butyl tellurium hydride (Te(t-Bu)(H)), Te(OEt)$_4$, bis(trimethylsilyl)tellurium (Te($SiMe_3$)$_2$), and bis(triethylsilyl) tellurium (Te($SiEt_3$)$_2$).

Yet other precursors and non-limiting substituents are described herein. For instance, precursors can be any having a structure of formulas (I), (II), and (IIa), as described above; or formulas (III), (IV), (V), (VI), (VII), or (VIII), as described below. Any of the substituents M, R, X, or L, as described herein, can be employed in any of formulas (I), (II), (IIa), (III), (IV), (V), (VI), (VII), or (VIII).

A non-limiting precursor includes a metal halide having the following formula (III):

$$MX_n, \quad \text{(III)}$$

in which M is a metal, X is halo (e.g., fluoro, chloro, bromo, or iodo), and n is 2 to 4, depending on the selection of M. Non-limiting metals for M include Sn, Te, Bi, Sb, or In. Non-limiting metal halides include $SnBr_4$, $SnCl_4$, $SnI_4$, and $SbCl_3$.

Another non-limiting precursor includes the following formula (IV):

$$MR_n, \quad \text{(IV)}$$

in which M is a metal; each R is independently H, an optionally substituted alkyl, amino (e.g., —$NR_2$, in which each R is independently alkyl), optionally substituted (trialkylsilyl)amido (e.g., —N($SiR_3$), in which each R is independently alkyl), or an optionally substituted trialkylsilyl (e.g., —$SiR_3$, in which each R is independently alkyl); and n is 2 to 4, depending on the selection of M. Non-limiting metals for M include Sn, Te, Bi, Sb, or In. The alkyl group may be $C_nH_{2n+1}$, where n is 1, 2, 3, or greater. Non-limiting organometallic agents include Sn(Me)$_4$, Sn(Et)$_4$, $TeR_n$, RTeR, RTeH, t-butyl tellurium hydride (Te(t-Bu)(H)), dimethyl tellurium ($TeMe_2$), di(t-butyl) tellurium (Te(t-Bu)$_2$), di(isopropyl)tellurium (Te(i-Pr)$_2$), bis(trimethylsilyl)tellurium (Te($SiMe_3$)$_2$), bis(triethylsilyl) tellurium (Te($SiEt_3$)$_2$), tris(bis(trimethylsilyl)amido) bismuth (Bi[N($SiMe_3$)$_2$]$_3$), Sb($NMe_2$)$_3$, and the like.

A metal-containing precursor can include a capping agent having the following formula (V):

$$ML_n, \quad \text{(V)}$$

in which M is a metal; each L is independently an optionally substituted alkyl, amino (e.g., —$NR^1R^2$, in which each of $R^1$ and $R^2$ can be H or alkyl, such as any described herein), alkoxy (e.g., —OR, in which R is alkyl, such as any described herein), halo, or other organic substituent; and n is 2 to 4, depending on the selection of M. Non-limiting metals for M include Sn, Te, Bi, Sb, or In. Non-limiting ligands include dialkylamino (e.g., dimethylamino, methylethylamino, and diethylamino), alkoxy (e.g., t-butoxy and isopropoxy), halo (e.g., F, Cl, Br, and I), or other organic substituents (e.g., acetylacetone or $N^2$,$N^3$-di-tertbutyl-butane-2,3-diamino). Non-limiting capping agents include $SnCl_4$; $SnI_4$; $Sn(NR_2)_4$, wherein each of R is independently methyl or ethyl; or $Sn(t\text{-}BuO)_4$. In some embodiments, multiple types of ligands are present.

A metal-containing precursor can include a hydrocarbyl-substituted capping agent having the following formula (VI):

$$R_nMX_m, \quad \text{(VI)}$$

wherein M is a metal, R is a $C_{2\text{-}10}$ alkyl or substituted alkyl having a beta-hydrogen, and X is a suitable leaving group upon reaction with a hydroxyl group of the exposed hydroxyl groups. In various embodiments, n=1 to 3, and m=4−n, 3−n, or 2−n, so long as m>0 (or m≥1). For example, R may be t-butyl, t-pentyl, t-hexyl, cyclohexyl, isopropyl, isobutyl, sec-butyl, n-butyl, n-pentyl, n-hexyl, or derivatives thereof having a heteroatom substituent in the beta position. Suitable heteroatoms include halogen (F, Cl, Br, or I), or oxygen (—OH or —OR). X may be dialkylamino (e.g., dimethylamino, methylethylamino, or diethylamino), alkoxy (e.g., t-butoxy, isopropoxy), halo (e.g., F, Cl, Br, or I), or another organic ligand. Examples of hydrocarbyl-substituted capping agents include t-butyltris(dimethylamino)tin ($Sn(t\text{-}Bu)(NMe_2)_3$), n-butyltris(dimethylamino)tin ($Sn(n\text{-}Bu)(NMe_2)_3$), t-butyltris(diethylamino)tin ($Sn(t\text{-}Bu)(NEt_2)_3$), di(t-butyl)di(dimethylamino)tin ($Sn(t\text{-}Bu)_2(NMe_2)_2$), sec-butyltris(dimethylamino)tin ($Sn(s\text{-}Bu)(NMe_2)_3$), n-pentyltris(dimethylamino)tin ($Sn(n\text{-}pentyl)(NMe_2)_3$), i-butyltris(dimethylamino) tin ($Sn(i\text{-}Bu)(NMe_2)_3$), i-propyltris (dimethylamino)tin ($Sn(i\text{-}Pr)(NMe_2)_3$), t-butyltris(t-butoxy)tin ($Sn(t\text{-}Bu)(t\text{-}BuO)_3$), n-butyl(tris(t-butoxy)tin ($Sn(n\text{-}Bu)(t\text{-}BuO)_3$), or isopropyltris(t-butoxy)tin ($Sn(i\text{-}Pr)(t\text{-}BuO)_3$).

In various embodiments, a metal-containing precursor includes at least one alkyl group on each metal atom that can survive the vapor-phase reaction, while other ligands or ions coordinated to the metal atom can be replaced by the counter-reactants. Accordingly, another non-limiting metal-containing precursor includes an organometallic agent having the formula (VII):

$$M_aR_bL_c, \quad \text{(VII)}$$

in which M is a metal; R is an optionally substituted alkyl; L is a ligand, ion, or other moiety which is reactive with the counter-reactant; a≥1; b≥1; and c≥1. In particular embodiments, a=1, and b+c=4. In some embodiments, M is Sn, Te, Bi, Sb, or In. In particular embodiments, each L is independently amino (e.g., $—NR^1R^2$, in which each of $R^1$ and $R^2$ can be H or alkyl, such as any described herein), alkoxy (e.g., —OR, in which R is alkyl, such as any described herein), or halo (e.g., F, Cl, Br, or I). Non-limiting agents include $SnMe_3Cl$, $SnMe_2Cl_2$, $SnMeCl_3$, $SnMe(NMe_2)_3$, $SnMe_3(NMe_2)$, and the like.

In other embodiments, the non-limiting metal-containing precursor includes an organometallic agent having the formula (VIII):

$$M_aL_c, \quad \text{(VIII)}$$

in which M is a metal; L is a ligand, ion, or other moiety which is reactive with the counter-reactant; a≥1; and c≥1. In particular embodiments, c=n−1, and n is 2, 3, or 4. In some embodiments, M is Sn, Te, Bi, Sb, or In. Counter-reactants preferably have the ability to replace the reactive moieties ligands or ions (e.g., L in formulas herein) so as to link at least two metal atoms via chemical bonding.

In any embodiment herein, R can be an optionally substituted alkyl (e.g., $C_{1\text{-}10}$ alkyl). In one embodiment, alkyl is substituted with one or more halo (e.g., halo-substituted $C_{1\text{-}10}$ alkyl, including one, two, three, four, or more halo, such as F, Cl, Br, or I). Non-limiting R substituents include $C_nH_{2n+1}$, preferably wherein n≥3; and $C_nF_xH_{(2n+1-x)}$, wherein 2n+1≤x≤1 and n≥1; and $C_nI_xH_{(2n+1-x)}$, wherein 2n+1≤x≤1 and n≥1. In various embodiments, R has at least one beta-hydrogen or beta-fluorine or beta-iodine. For example, R may be selected from the group consisting of i-propyl, n-propyl, t-butyl, i-butyl, n-butyl, sec-butyl, n-pentyl, i-pentyl, t-pentyl, sec-pentyl, and mixtures thereof.

In any embodiment herein, L may be any moiety readily displaced by a counter-reactant to generate an M-OH moiety, such as a moiety selected from the group consisting of an amino (e.g., $—NR^1R^2$, in which each of $R^1$ and $R^2$ can be H or alkyl, such as any described herein), alkoxy (e.g., —OR, in which R is alkyl, such as any described herein), carboxylates, halo (e.g., F, Cl, Br, or I), and mixtures thereof.

Yet other non-limiting organometallic agents include $SnMeCl_3$, ($N^2$,$N^3$-di-t-butyl-butane-2,3-diamido) tin(II) (Sn (tbba)), bis(bis(trimethylsilyl)amido) tin(II), tetrakis(dimethylamino) tin(IV) ($Sn(NMe_2)_4$), t-butyl tris(dimethylamino) tin ($Sn(t\text{-}butyl)(NMe_2)_3$), i-butyl tris (dimethylamino) tin ($Sn(i\text{-}Bu)(NMe_2)_3$), n-butyl tris (dimethylamino) tin ($Sn(n\text{-}Bu)(NMe_2)_3$), sec-butyl tris (dimethylamino) tin ($Sn(s\text{-}Bu)(NMe_2)_3$), i-propyl(tris) dimethylamino tin ($Sn(i\text{-}Pr)(NMe_2)_3$), n-propyl tris (diethylamino) tin ($Sn(n\text{-}Pr)(NEt_2)_3$), and analogous alkyl (tris)(t-butoxy) tin compounds, such as t-butyl tris(t-butoxy) tin ($Sn(t\text{-}Bu)(t\text{-}BuO)_3$), t-butyl tellurium hydride, di(t-butyl) tellurium, di(i-propyl)tellurium, or bis(trimethylsilyl)tellurium. In some embodiments, the organometallic agents are partially fluorinated.

Such precursors can be employed alone to form an EUV resist material or can be used in combination with one or more counter-reactants. Counter-reactants preferably have the ability to replace the reactive moieties ligands or ions (e.g., L in formulas herein) so as to link at least two metal atoms via chemical bonding. Exemplary counter-reactants include oxygen-containing counter-reactants, such as $O_2$, $O_3$, water, peroxides (e.g., hydrogen peroxide), oxygen plasma, water plasma, alcohols, dihydroxy alcohols, polyhydroxy alcohols, fluorinated dihydroxy alcohol, fluorinated polyhydroxy alcohols, fluorinated glycols, formic acid, and other sources of hydroxyl moieties, as well as combinations thereof. In various embodiments, a counter-reactant reacts with the organometallic precursor by forming oxygen bridges between neighboring metal atoms. Other potential counter-reactants include hydrogen sulfide and hydrogen disulfide, which can crosslink metal atoms via sulfur bridges, and bis(trimethylsilyl)tellurium, which can crosslink metal atoms via tellurium bridges. In addition, hydrogen iodide may be utilized to incorporate iodine into the film.

Furthermore, two or more different precursors can be employed within the sensitized film. For instance, two or more of any metal-containing precursors herein can be employed, in which one precursor includes an EUV sensitizer and the other does not. In one non-limiting instance, tin telluride can be formed by employing tin precursor including an $NR_2$ ligand with RTeH, RTeD, or $R_2Te$ precursors, in which R is an alkyl, particularly t-butyl or i-propyl. In another instance, a metal telluride can be formed by using a first metal precursor including an alkoxy or a halo ligand (e.g., $SbCl_3$) with a tellurium-containing precursor including a trialkylsilyl ligand (e.g., bis(trimethylsilyl)tellurium).

The EUV resist material or a precursor thereof can be provided in any useful form. In one embodiment, the EUV resist material or its precursor is provided in gas form. In particular embodiments, the EUV resist material or its precursor is provided as a vapor in an inert carrier gas (e.g., $H_2$, He, Ar, or $N_2$). In other embodiments, the EUV resist material or its precursor is provided as a gas. The EUV resist material or its precursor can also be provided as a plasma (e.g., an RF plasma or any other plasma condition described herein), which can be used to create reactive species.

Yet other non-limiting EUV resist materials, as well as processing methods and apparatuses, are described in U.S. Pat. No. 9,996,004; Int. Pat. Pub. No. WO 2020/102085; and Int. Pat. Pub. No. WO 2019/217749, each of which is incorporated herein by reference in its entirety.

Lithographic Processes

EUV lithography makes use of EUV resists, which may be polymer-based chemically amplified resists produced by liquid-based spin-on techniques or metal oxide-based resists produced by dry vapor-deposited techniques. Lithographic methods can include patterning the resist, e.g., by exposure of the EUV resist with EUV radiation to form a photo pattern, followed by developing the pattern by removing a portion of the resist according to the photo pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. Such methods include those where a substrate (e.g., optionally having exposed hydroxyl groups) is contacted with a metal-containing precursor (e.g., any described herein) to form a metal oxide (e.g., a layer including a network of metal oxide bonds, which may include other non-metal and non-oxygen groups) film as the imaging/PR layer on the surface of the substrate. The specific methods may depend on the particular materials and applications used in the semiconductor substrate and ultimate semiconducting device. Thus, the methods described in this application are merely an example of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. To date, these resists have been developed using a wet (solvent) approach, which requires the wafer to move to the track, where it is exposed to developing solvent, dried and baked. Wet development does not only limit productivity but can also lead to line collapse due to surface tension effects during the evaporation of solvent between fine features.

Dry development techniques have been proposed to overcome these issues by eliminating substrate delamination and interface failures. Dry development has its own challenges, including etch selectivity between unexposed and EUV exposed resist material which can lead to a higher dose to size requirement for effective resist exposure when compared to wet development. Suboptimal selectivity can also cause PR corner rounding due to longer exposures under etching gas, which may increase line CD variation in the following transfer etch step. Additional processes employed during lithography are described in detail below.

Deposition Processes, Including Dry Deposition

As discussed above, the present disclosure provides methods for making imaging layers on semiconductor substrates, which may be patterned using EUV or other next generation lithographic techniques. Methods include those where polymerized organometallic materials are produced in a vapor and deposited on a substrate. In some embodiments, dry deposition can employ any useful metal-containing precursor (e.g., metal halides, capping agents, or organometallic agents described herein). In other embodiments, a spin-on formulation may be used. Deposition processes can include applying a EUV resist material as a resist film and/or as a sensitized film having one or more EUV sensitizers The present technology includes methods by which EUV resist thin films are deposited on a substrate, such films being operable as resists for subsequent EUV lithography and processing. Such EUV resist films comprise materials which, upon exposure to EUV, undergo changes, such as the loss of bulky pendant ligands bonded to metal atoms in low density M-OH rich materials, allowing their crosslinking to denser M-O-M bonded metal oxide materials. Through EUV patterning, areas of the film are created that have altered physical or chemical properties relative to unexposed areas.

These properties may be exploited in subsequent processing, such as to dissolve either unexposed or exposed areas, or to selectively deposit materials on either the exposed or unexposed areas. In some embodiments, the unexposed film has a hydrophobic surface, and the exposed film has a hydrophilic surface (it being recognized that the hydrophilic properties of exposed and unexposed areas are relative to one another) under the conditions at which such subsequent processing is performed. For example, the removal of material may be performed by leveraging differences in chemical composition, density and cross-linking of the film. Removal may be by wet processing or dry processing, as further described herein.

The thickness of the EUV-patternable film formed on the surface of the substrate may vary according to the surface characteristics, materials used, and processing conditions. In various embodiments, the film thickness may range from about 0.5 nm to about 100 nm. Preferably, the film has a sufficient thickness to absorb most of the EUV light under the conditions of EUV patterning. For example, the overall absorption of the resist film may be 30% or less (e.g., 10% or less, or 5% or less), so that the resist material at the bottom of the resist film is sufficiently exposed. In some embodiments, the film thickness is from 10 nm to 20 nm. Without limiting the mechanism, function, or utility of the present disclosure, it is believed that, unlike wet, spin-coating processes of the art, the processes of the present disclosure have fewer restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

The film (e.g., imaging layer) may be composed of a metal oxide layer deposited in any useful manner. Such a metal oxide layer can be deposited or applied by using any EUV resist material described herein, such as a metal-containing precursor (e.g., a metal halide, a capping agent, or an organometallic agent). In non-limiting processes, a polymerized organometallic material is formed in vapor phase or in situ on the surface of the substrate in order to provide the metal oxide layer. The metal oxide layer may be employed as the film or as an adhesion layer (e.g., between the substrate and the film).

Optionally, the metal oxide layer can include a hydroxyl-terminated metal oxide layer, which can be deposited by employing a capping agent (e.g., any described herein) with an oxygen-containing counter-reactant. Such a hydroxyl-terminated metal oxide layer can be employed, e.g., as an adhesion layer between two other layers, such as between the substrate and the film.

Non-limiting deposition techniques (e.g., for a film) include any described herein, such as ALD (e.g., thermal ALD and plasma-enhanced ALD), spin-coat deposition, PVD including PVD co-sputtering, CVD (e.g., PE-CVD or LP-CVD), sputter deposition, e-beam deposition including e-beam co-evaporation, etc., or a combination thereof, such as ALD with a CVD component, such as a discontinuous, ALD-like process in which metal-containing precursors and counter-reactants are separated in either time or space.

In general, depositing can include mixing a vapor stream of a metal-containing precursor (e.g., any described herein, such as a metal halide, a capping agent, or an organometallic agent) with a vapor stream of a counter-reactant and depositing the organometallic material onto the surface of the semiconductor substrate. In some embodiments, mixing the metal-containing precursor with the counter-reactant forms a polymerized organometallic material. As will be understood by one of ordinary skill in the art, the mixing and depositing aspects of the process may be concurrent, in a substantially continuous process.

In some embodiments, the deposition is ALD, in a cyclical process of depositing a metal-containing precursor (e.g., any described herein, such as a metal halide, a capping agent, or an organometallic agent) and depositing a counter-reactant (e.g., an oxygen-containing counter-reactant). Materials and processes among those useful herein for depositing metal oxide layers are described in Nazarov D V et al., "Atomic layer deposition of tin dioxide nanofilms: a review," 40 *Rev. Adv. Mater. Sci.* 262-275 (2015).

In a non-limiting continuous CVD process, two or more gas streams, in separate inlet paths, of a metal-containing precursor (e.g., any described herein, such as a metal halide, a capping agent, or an organometallic agent) and source of counter-reactant are introduced to the deposition chamber of a CVD apparatus, where they mix and react in the gas phase, to form a film on the substrate. The streams may be introduced, for example, using a dual plenum showerhead. The apparatus is configured so that the streams of metal-containing precursor and counter-reactant are mixed in the chamber, allowing the agent and the counter-reactant to react to form a film (e.g., a metal oxide coating or agglomerated polymeric materials, such as via metal-oxygen-metal bond formation).

For depositing metal oxide, the CVD process is generally conducted at reduced pressures, such as from 0.1 Torr to 10 Torr. In some embodiments, the process is conducted at pressures from 1 Torr to 2 Torr. The temperature of the substrate is preferably below the temperature of the reactant streams. For example, the substrate temperature may be from 0° C. to 250° C., or from ambient temperature (e.g., 23° C.) to 150° C.

For depositing agglomerated polymeric materials, the CVD process is generally conducted at reduced pressures, such as from 10 mTorr to 10 Torr. In some embodiments, the process is conducted at from 0.5 to 2 Torr. The temperature of the substrate is preferably at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature. Without limiting the mechanism, function, or utility of present technology, it is believed that the product from such vapor-phase reaction becomes heavier in molecular weight as metal atoms are crosslinked by counter-reactants, and then the product is then condensed or otherwise deposited onto the substrate. In various embodiments, the steric hindrance of the bulky alkyl groups prevents the formation of densely packed network and produces porous, low density films.

A potential advantage of using dry deposition methods is ease of tuning the composition of the film as it grows. In a CVD process, this may be accomplished by changing the relative flows of the two or more metal-containing precursors during deposition. Deposition may occur between 30° C. and 200° C. at pressures between 0.01 Torr to 100 Torr, but more generally between about 0.1 Torr and 10 Torr.

A film (e.g., a metal oxide coating or agglomerated polymeric materials, such as via metal-oxygen-metal bond formation) may also be deposited by an ALD process. For example, the metal-containing precursor and counter-reactant are introduced at separate times, representing an ALD cycle. The precursors react on the surface, forming up to a monolayer of material at a time for each cycle. This may allow for excellent control over the uniformity of film thickness across the surface. The ALD process is generally conducted at reduced pressures, such as from 0.1 Torr to 10 Torr. In some embodiments, the process is conducted from 1 Torr to 2 Torr. The substrate temperature may be from 0° C. to 250° C., or from ambient temperature (e.g., 23° C.) to 150° C. The process may be a thermal process or, preferably, a plasma-assisted deposition.

Any of the deposition methods herein can be modified to allow for use of two or more different metal-containing precursors. In one embodiment, the precursors can include the same metal but different ligands. In another embodiment, the precursors can include different metal groups. In one non-limiting instance, alternating flows of various volatile metal-containing precursors can provide a mixed metal layer, such as use of a metal precursor having no sensitizer with another metal precursor having an EUV sensitizer (e.g., I).

Furthermore, any of the deposition methods herein can be modified to provide one or more layers within a film. In one instance, different precursors can be employed in each layer. In another instance, the same precursor may be employed for each layer, but the top-most layer can be treated (e.g., by using plasma to remove one or more ligands within the deposited layer) to provide a different chemical composition (e.g., a different density of metal-ligand bonds).

Deposition processes can be employed on any useful surface. As referred to herein, the "surface" is a surface onto which a film of the present technology is to be deposited or that is to be exposed to EUV during processing. Such a surface can be present on a substrate (e.g., upon which a film is to be deposited) or on a film (e.g., upon which further post treatment can be conducted and upon which reactions can be conducted to promote etching within the EUV exposed areas or the EUV unexposed areas).

Any useful substrate can be employed, including any material construct suitable for lithographic processing, particularly for the production of integrated circuits and other semiconducting devices. In some embodiments, substrates are silicon wafers. Substrates may be silicon wafers upon which features have been created ("underlying topographical features"), having an irregular surface topography.

Such underlying topographical features may include regions in which material has been removed (e.g., by etching) or regions in which materials have been added (e.g., by deposition) during processing prior to conducting a method of this technology. Such prior processing may include methods of this technology or other processing methods in an iterative process by which two or more layers of features are formed on the substrate. Without limiting the mechanism, function, or utility of the present technology, it is believed that, in some embodiments, methods of the present technology offer advantages relative to methods among those known in the art in which photolithographic films are deposited on the surface of substrates using spin casting methods. Such advantages may derive from the conformance of the films of the present technology to underlying features without "filling in" or otherwise planarizing such features, and the ability to deposit films on a wide variety of material surfaces.

In some embodiments, an incoming wafer can be prepared with a substrate surface of a desired material, with the uppermost material being the layer into which the resist pattern is transferred. While the material selection may vary depending on integration, it is generally desired to select a material that can be etched with high selectivity to (i.e., much faster than) the EUV resist or imaging layer. Suitable substrate materials can include various carbon-based films (e.g., ashable hard mask (AHM)), silicon-based films (e.g., silicon, silicon oxide, silicon nitride, silicon oxynitride, or silicon oxycarbonitride, as well as doped forms thereof, including $SiO_x$, $SiO_xN_y$, $SiO_xC_yN_z$, a-Si:H, poly-Si, or SiN), or any other (generally sacrificial) film applied to facilitate the patterning process.

In some embodiments, the substrate is a hard mask, which is used in lithographic etching of an underlying semiconductor material. The hard mask may comprise any of a variety of materials, including amorphous carbon (a-C), $SnO_x$, $SiO_2$, $SiO_xN_y$, $SiO_xC$, $Si_3N_4$, $TiO_2$, TiN, W, W-doped C, WOx, $HfO_2$, $ZrO_2$, and $Al_2O_3$. For example, the substrate may preferably comprise $SnO_x$, such as $SnO_2$. In various embodiments, the layer may be from 1 nm to 100 nm thick, or from 2 nm to 10 nm thick.

In some non-limiting embodiments, a substrate comprises an underlayer. An underlayer may be deposited on a hard mask or other layer and is generally underneath an imaging layer (or film), as described herein. An underlayer may be used to improve the sensitivity of a PR, increase EUV absorptivity, and/or increase the patterning performance of the PR. In cases where there are device features present on the substrate to be patterned which create significant topography, another important function of the underlayer can be to overcoat and planarize the existing topography so that the subsequent patterning step may be performed on a flat surface with all areas of the pattern in focus. For such applications, the underlayer (or at least one of multiple underlayers) may be applied using spin-coating techniques. When the PR material being employed possesses a significant inorganic component, for example it exhibits a predominately metal oxide framework, the underlayer may advantageously be a carbon-based film, applied either by spin-coating or by dry vacuum-based deposition processes. The layer may include various ashable hard mask (AHM) films with carbon- and hydrogen-based compositions and may be doped with additional elements, such as tungsten, boron, nitrogen, or fluorine.

In some embodiments, a surface activation operation may be used to activate the surface (e.g., of the substrate and/or a film) for future operations. For example, for a $SiO_x$ surface, a water or oxygen/hydrogen plasma may be used to create hydroxyl groups on the surface. For a carbon- or hydrocarbon-based surface, various treatment (e.g., a water, hydrogen/oxygen, $CO_2$ plasma, or ozone treatment) may be used to create carboxylic acids/or hydroxyl groups. Such approaches can prove critical for improving the adhesion of resist features to the substrate, which might otherwise delaminate or lift off during handling or within the solvent during development.

Adhesion may also be enhanced by inducing roughness in the surface to increase the surface area available for interaction, as well as directly improve mechanical adhesion. For example, first a sputtering process using Ar or other non-reactive ion bombardment can be used to produce rough surfaces. Then, the surface can be terminated with a desired surface functionality as described above (e.g., hydroxyl and/or carboxylic acid groups). On carbon, a combination approach can be employed, in which a chemically reactive oxygen-containing plasma such as $CO_2$, $O_2$, or $H_2O$ (or mixtures of $H_2$ and $O_2$) can be used to etch away a thin layer of film with local non-uniformity and simultaneously terminate with —OH, —OOH, or —COOH groups. This may be done with or without bias. In conjunction with the surface modification strategies mentioned above, this approach could serve the dual purpose of surface roughening and chemical activation of the substrate surface, either for direct adhesion to an inorganic metal-oxide based resist or as an intermediate surface modification for further functionalization.

In various embodiments, the surface (e.g., of the substrate and/or the film) comprises exposed hydroxyl groups on its surface. In general, the surface may be any surface that comprises, or has been treated to produce, an exposed hydroxyl surface. Such hydroxyl groups may be formed on the surface by surface treatment of a substrate using oxygen plasma, water plasma, or ozone. In other embodiments, the surface of the film can be treated to provide exposed hydroxyl groups. In various embodiments, the hydroxyl-terminated metal oxide layer has a thickness of from 0.1 nm to 20 nm, or from 0.2 nm to 10 nm, or from 0.5 nm to 5 nm.

EUV Exposure Processes

EUV exposure of the film can provide EUV exposed areas having activated reactive centers including a metal atom (M), which are produced by EUV-mediated cleavage events. Such reactive centers can include dangling metal bonds, M-H groups, cleaved M-ligand groups, or dimerized M-M bonds. In particular embodiments, upon EUV exposure, the ligands of the modified interface can undergo a β-hydride elimination, resulting in the formation of M-H bonds at the interface. At this stage, or during the post exposure bake, the M-H bonds may react within the resist to form M-O-M bridges across the interface, effectively increasing the adhesion of the film in the exposed region.

EUV exposure can have a wavelength in the range of about 10 nm to about 20 nm in a vacuum ambient, such as a wavelength of from 10 nm to 15 nm, e.g., 13.5 nm. In particular, patterning can provide EUV exposed areas and EUV unexposed areas to form a pattern.

The present technology can include patterning using EUV, as well as DUV or e-beam. In such patterning, the radiation is focused on one or more regions of the imaging layer. The exposure is typically performed such that imaging layer film comprises one or more regions that are not exposed to the radiation. The resulting imaging layer may comprise a plurality of exposed and unexposed regions, creating a pattern consistent with the creation of transistor or other features of a semiconductor device, formed by addition or removal of material from the substrate in subsequent processing of the substrate. EUV, DUV and e-beam radiation methods and equipment among useful herein include methods and equipment known in the art.

In some EUV lithography techniques, an organic hardmask (e.g., an ashable hardmask of PECVD amorphous hydrogenated carbon) is patterned using a conventional photoresist process. During photoresist exposure, EUV radiation is absorbed in the resist and in the substrate below, producing highly energetic photoelectrons (e.g., about 100 eV) and in turn a cascade of low-energy secondary electrons (e.g., about 10 eV) that diffuse laterally by several nanometers. These electrons increase the extent of chemical reactions in the resist which increases its EUV dose sensitivity. However, a secondary electron pattern that is random in nature is superimposed on the optical image. This unwanted secondary electron exposure results in loss of resolution, observable line edge roughness (LER) and linewidth variation in the patterned resist. These defects are replicated in the material to be patterned during subsequent pattern transfer etching.

Unlike an insulator such as photoresist, a metal is less susceptible to secondary electron exposure effects since the secondary electrons can quickly lose energy and thermalize by scattering with conduction electrons. Suitable metal elements for this process may include but are not limited to aluminum, silver, palladium, platinum, rhodium, ruthenium, iridium, cobalt, ruthenium, manganese, nickel, copper, hafnium, tantalum, tungsten, gallium, germanium, tin, antimony, or any combination thereof. However, electron scattering in the photoresist used to pattern a blanket metal film into a mask would still lead to unacceptable effects such as LER.

A vacuum-integrated metal hardmask process and related vacuum-integrated hardware that combines film formation (deposition/condensation) and optical lithography with the result of greatly improved EUV lithography (EUVL) performance—e.g., reduced line edge roughness—is disclosed herein.

In various embodiments described herein, a deposition (e.g., condensation) process (e.g., ALD or MOCVD carried out in a PECVD tool, such as the Lam Vector®) can be used to form a thin film of a metal-containing film, such a photosensitive metal salt or metal-containing organic compound (organometallic compound), with a strong absorption in the EUV (e.g., at wavelengths on the order of 10 nm to 20 nm), for example at the wavelength of the EUVL light source (e.g., 13.5 nm=91.8 eV). This film photo-decomposes upon EUV exposure and forms a metal mask that is the pattern transfer layer during subsequent etching (e.g., in a conductor etch tool, such as the Lam 2300® Kiyo®).

Following deposition, the EUV-patternable thin film is patterned by exposure to a beam of EUV light, typically under relatively high vacuum. For EUV exposure, the metal-containing film can then be deposited in a chamber integrated with a lithography platform (e.g., a wafer stepper such as the TWINSCAN NXE: 3300B® platform supplied by ASML of Veldhoven, NL) and transferred under vacuum so as not to react before exposure. Integration with the lithography tool is facilitated by the fact that EUVL also requires a greatly reduced pressure given the strong optical absorption of the incident photons by ambient gases such as $H_2O$, $O_2$, etc. In other embodiments, the photosensitive metal film deposition and EUV exposure may be conducted in the same chamber.

Development Processes, Including Dry Development

Any useful development process can be employed to remove EUV exposed areas or to remove EUV unexposed areas. In one embodiment, the EUV exposed area can have M-H groups that can be selectively removed by employing one or more dry development processes (e.g., halide chemistry). In another embodiment, the EUV exposed area can undergo further crosslinking, and the EUV unexposed area can be selectively removed by employing one or more dry development processes (e.g., halide chemistry).

Dry development processes can include use of halides, such as HCl- or HBr-based processes. While this disclosure is not limited to any particular theory or mechanism of operation, the approach is understood to leverage the chemical reactivity of the dry-deposited EUV photoresist films with the clean chemistry (e.g., HCl, HBr, and $BCl_3$) to form volatile products using vapors or plasma. The dry-deposited EUV photoresist films can be removed with etch rates of up to 1 nm/s. The quick removal of dry-deposited EUV photoresist films by these chemistries is applicable to chamber cleaning, backside clean, bevel clean, and PR developing. Although the films can be removed using vapors at various temperatures (e.g., HCl or HBr at a temperature greater than −10° C., or $BCl_3$ at a temperature greater than 80° C., for example), a plasma can also be used to further accelerate or enhance the reactivity.

Plasma processes include transformer coupled plasma (TCP), inductively coupled plasma (ICP) or capacitively coupled plasma (CCP), employing equipment and techniques among those known in the art. For example, a process may be conducted at a pressure of >5 mTorr (e.g., >15 mTorr, such as from 20 mTorr to 100 mTorr), at a power level of <1000 W (e.g., <500 W). Temperatures may be from 30° C. to 300° C. (e.g., 30° C. to 120° C.), at flow rate of 100 to 1000 standard cubic centimeters per minute (sccm), e.g., about 500 sccm, for from 1 to 3000 seconds (e.g., 10 seconds to 600 seconds).

Where the halide reactant flows are of hydrogen gas and halide gas, a remote plasma/UV radiation is used to generate radicals from the $H_2$ and $Cl_2$ and/or $Br_2$, and the hydrogen and halide radicals are flowed to the reaction chamber to contact the patterned EUV photoresist on the substrate layer of the wafer. Suitable plasma power may range from 100 W to 500 W, with no bias. It should be understood that while these conditions are suitable for some processing reactors, e.g., a Kiyo etch tool available from Lam Research Corporation, Fremont, CA, a wider range of process conditions may be used according to the capabilities of the processing reactor.

In thermal development processes, the substrate is exposed to dry development chemistry (e.g., a Lewis Acid) in a vacuum chamber (e.g., oven). Suitable chambers can include a vacuum line, a dry development hydrogen halide chemistry gas (e.g., HBr, HCl) line, and heaters for temperature control. In some embodiments, the chamber interior can be coated with corrosion resistant films, such as organic polymers or inorganic coatings. One such coating is polytetrafluoroethylene ((PTFE), e.g., Teflon 1M). Such materials can be used in thermal processes of this disclosure without risk of removal by plasma exposure.

The process conditions for the dry development may be reactant flow of 100 sccm to 500 sccm (e.g., 500 sccm HBr or HCl), temperature of −10° C. to 120° C. (e.g., -10° C.), pressure of 20 mTorr to 500 mTorr (e.g., 300 mTorr) with no plasma and for a time of about 10 sec to 1 min, dependent on the photoresist film and their composition and properties.

In various embodiments, methods of the present disclosure combine all dry steps of film formation by vapor deposition, (EUV) lithographic photopatterning, and dry development. In such processes, a substrate may directly go to a dry development/etch chamber following photopatterning in an EUV scanner. Such processes may avoid material and productivity costs associated with a wet development. A dry process can also provide more tunability and give further CD control and/or scum removal.

In various embodiments, the EUV photoresist, containing some amount of metal, metal oxide and organic components, can be dry developed by a thermal, plasma (e.g., including possibly photoactivated plasma, such as lamp-heated or UV lamp heated), or a mixture of thermal and plasma methods while flowing a dry development gas including a compound of formula RxZy, where R=B, Al, Si, C, S, SO with x>0 and Z=Cl, H, Br, F, $CH_4$ and y>0. The dry development can result in a positive tone, in which the RxZy species selectively removes the exposed material, leaving behind the unexposed counterpart as a mask. In some embodiments, the exposed portions of organotin oxide-based photoresist films are removed by dry development in accordance with this disclosure. Positive tone dry development may be achieved by the selective dry development (removal) of EUV exposed regions exposed to flows comprising hydrogen halides or hydrogen and halides, including HCl and/or HBr without striking a plasma, or flows of $H_2$ and $Cl_2$ and/or $Br_2$ with a remote plasma or UV radiation generated from plasma to generate radicals.

Post-Application Processes

The methods herein can include any useful post-application processes, as described below.

For the backside and bevel clean process, the vapor and/or the plasma can be limited to a specific region of the wafer to ensure that only the backside and the bevel are removed, without any film degradation on the frontside of the wafer. The dry-deposited EUV photoresist films being removed are generally composed of Sn, O and C, but the same clean approaches can be extended to films of other metal oxide resists and materials. In addition, this approach can also be used for film strip and PR rework.

Suitable process conditions for a dry bevel edge and backside clean may be a reactant flow of 100 sccm to 500 sccm (e.g., 500 sccm HCl, HBr, or $H_2$ and $Cl_2$ or $Br_2$, $BCl_3$ or $H_2$), temperature of −10° C. to 120° C. (e.g., 20° C.), pressure of 20 mTorr to 500 mTorr (e.g., 300 mTorr), plasma power of 0 to 500 W at high frequency (e.g., 13.56 MHz), and for a time of about 10 sec to 20 sec, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

Photolithography processes typically involve one or more bake steps, to facilitate the chemical reactions required to produce chemical contrast between exposed and unexposed areas of the photoresist. For high volume manufacturing (HVM), such bake steps are typically performed on tracks where the wafers are baked on a hot plate at a pre-set temperature under ambient air or in some cases $N_2$ flow. More careful control of the bake ambient as well as introduction of additional reactive gas component in the ambient during these bake steps can help further reduce the dose requirement and/or improve pattern fidelity.

According to various aspects of this disclosure, one or more post treatments to metal and/or metal oxide-based photoresists after deposition (e.g., post-application bake (PAB)) and/or exposure (e.g., post-exposure bake (PEB)) and/or development (e.g., post-development bake (PDB)) are capable of increasing material property differences between exposed and unexposed photoresist and therefore decreasing dose to size (DtS), improving PR profile, and improving line edge and width roughness (LER/LWR) after subsequent dry development. Such processing can involve a thermal process with the control of temperature, gas ambient, and moisture, resulting in improved dry development performance in processing to follow. In some instances, a remote plasma might be used.

In the case of post-application processing (e.g., PAB), a thermal process with control of temperature, gas ambient (e.g., air, $H_2O$, $CO_2$, CO, $O_2$, $O_3$, $CH_4$, $CH_3OH$, $N_2$, $H_2$, $NH_3$, $N_2O$, NO, Ar, He, or their mixtures) or under vacuum, and moisture can be used after deposition and before exposure to change the composition of unexposed metal and/or metal oxide photoresist. The change can increase the EUV sensitivity of the material and thus lower dose to size and edge roughness can be achieved after exposure and dry development.

In the case of post-exposure processing (e.g., PEB), a thermal process with the control of temperature, gas atmosphere (e.g., air, $H_2O$, $CO_2$, CO, $O_2$, $O_3$, $CH_4$, $CH_3OH$, $N_2$, $H_2$, $NH_3$, $N_2O$, NO, Ar, He, or their mixtures) or under vacuum, and moisture can be used to change the composition of both unexposed and exposed photoresist. The change can increase the composition/material properties difference between the unexposed and exposed photoresist and the etch rate difference of dry development etch gas between the unexposed and exposed photoresist. A higher etch selectivity can thereby be achieved. Due to the improved selectivity, a squarer PR profile can be obtained with improved surface roughness, and/or less photoresist residual/scum.

In the case of post-development processing (e.g., post development bake or PDB), a thermal process with the control of temperature, gas atmosphere (e.g., air, $H_2O$, $CO_2$, CO, $O_2$, $O_3$, $CH_4$, $CH_3OH$, $N_2$, $H_2$, $NH_3$, $N_2O$, NO, Ar, He, or their mixtures) or under vacuum (e.g., with UV), and moisture can be used to change the composition of the unexposed photoresist. In particular embodiments, the condition also includes use of plasma (e.g., including $O_2$, $O_3$, Ar, He, or their mixtures). The change can increase the hardness of material, which can be beneficial if the film will be used as a resist mask when etching the underlying substrate.

In these cases, in alternative implementations, the thermal process could be replaced by a remote plasma process to increase reactive species to lower the energy barrier for the reaction and increase productivity. Remote plasma can generate more reactive radicals and therefore lower the reaction temperature/time for the treatment, leading to increased productivity.

Accordingly, one or multiple processes may be applied to modify the photoresist itself to increase dry development selectivity. This thermal or radical modification can increase the contrast between unexposed and exposed material and thus increase the selectivity of the subsequent dry development step. The resulting difference between the material properties of unexposed and exposed material can be tuned by adjusting process conditions including temperature, gas flow, moisture, pressure, and/or RF power. The large process latitude enabled by dry development, which is not limited by material solubility in a wet developer solvent, allows more aggressive conditions to be applied further enhancing the material contrast that can be achieved. The resulting high material contrast feeds back a wider process window for dry development and thus enables increased productivity, lower cost, and better defectivity performance.

A substantial limitation of wet-developed resist films is limited temperature bakes. Since wet development relies on material solubility, heating to or beyond 220° C., for example, can greatly increase the degree of cross-linking in both exposed and unexposed regions of a metal-containing PR film such that both become insoluble in the wet development solvents, so that the film can no longer by reliably wet developed. For dry-developed resist films, in which the etch rate difference (i.e., selectivity) between the exposed and unexposed regions of the PR is relied upon for removal of just the exposed or unexposed portion of the resist, the treatment temperature in a PAB, PEB, or PDB can be varied across a much broader window to tune and optimize the treatment process, for example from about 90° C. to 250° C., such as 90° C. to 190° C., for PAB, and about 170° C. to 250° C. or more, such as 190° C. to 240° C., for PEB and/or PDB. Decreasing etch rate and greater etch selectivity has been found to occur with higher treatment temperatures in the noted ranges.

In particular embodiments, the PAB, PEB, and/or PDB treatments may be conducted with gas ambient flow in the range of 100 sccm to 10000 sccm, moisture content in the amount of a few percent up to 100% (e.g., 20%-50%), at a pressure between atmospheric and vacuum, and for a duration of about 1 to 15 minutes, for example about 2 minutes.

These findings can be used to tune the treatment conditions to tailor or optimize processing for particular materials and circumstances. For example, the selectivity achieved for a given EUV dose with a 220° C. to 250° C. PEB thermal treatment in air at about 20% humidity for about 2 minutes can be made similar to that for about a 30% higher EUV dose with no such thermal treatment. So, depending on the selectivity requirements/constraints of the semiconductor processing operation, a thermal treatment such as described herein can be used to lower the EUV dose needed. Or, if higher selectivity is required and higher dose can be tolerated, much higher selectivity, up to 100 times exposed vs. unexposed, can be obtained than would be possible in a wet development context.

Apparatuses

The present disclosure also includes any apparatus configured to perform any methods described herein. In one embodiment, the apparatus for depositing a sensitized film includes a deposition module comprising a chamber for depositing an EUV resist material and/or an EUV sensitizer as a film; a patterning module comprising an EUV photolithography tool with a source of sub-30 nm wavelength radiation; and a development module comprising a chamber for developing the film.

The apparatus can further include a controller having instructions for such modules. In one embodiment, the controller includes one or more memory devices, one or more processors, and system control software coded with instructions for conducting film deposition. Such instructions can include for, in the deposition module, depositing the sensitized film on a top surface of a substrate; in the patterning module, patterning the film with sub-30 nm resolution directly by EUV exposure, thereby forming a pattern within the film; and in the development module, developing the film. In particular embodiments, the development module provides for removal of the EUV exposed areas or EUV unexposed areas, thereby providing a pattern within the film.

Figure 3:
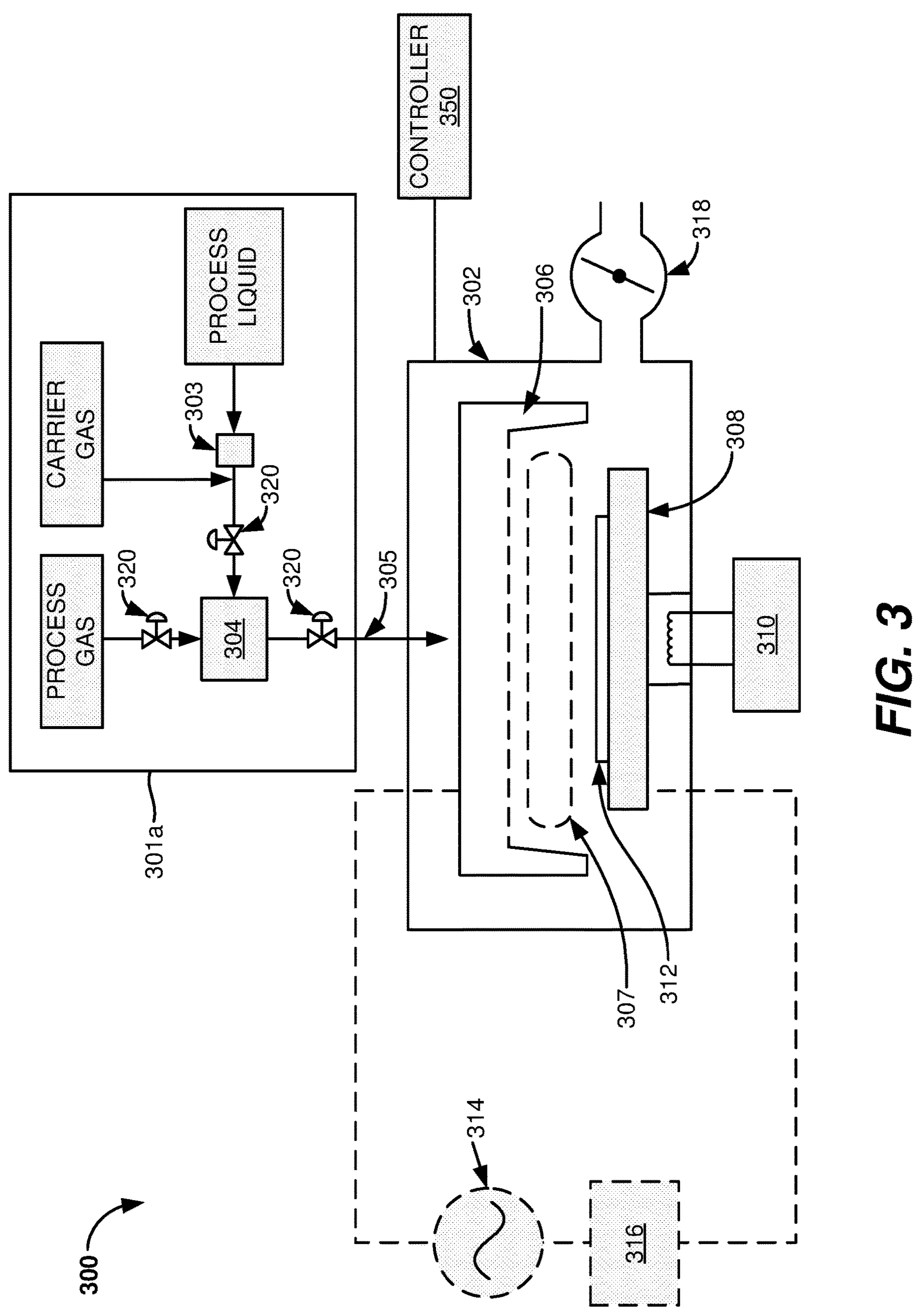
FIG. 3 presents a schematic illustration of an embodiment of a process station 300 for dry development.
Figure 4:
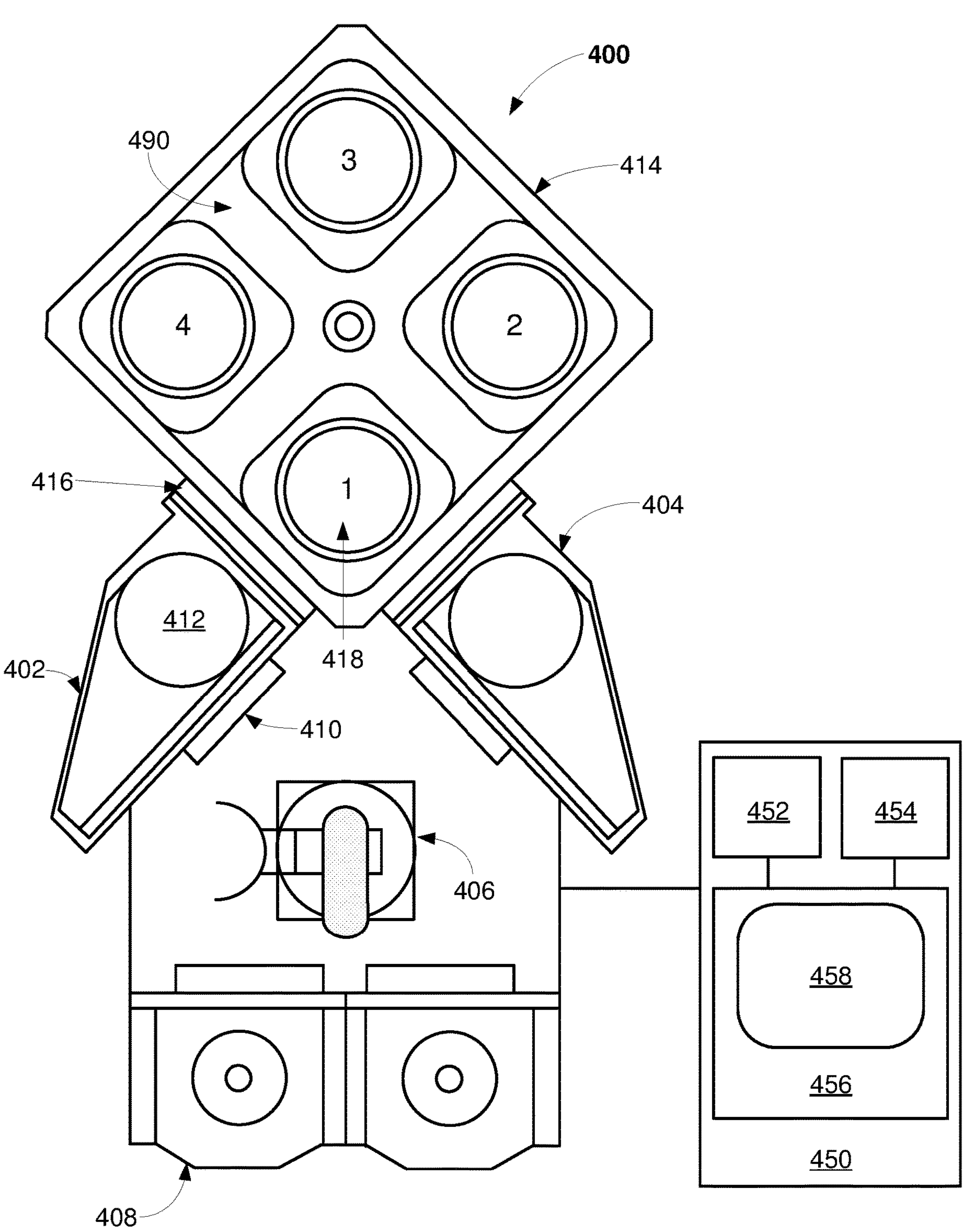
FIG. 4 presents a schematic illustration of an embodiment of a multi-station processing tool 400.

FIG. 3 depicts a schematic illustration of an embodiment of process station 300 having a process chamber body 302 for maintaining a low pressure environment that is suitable for implementation of described dry stripping and development embodiments. A plurality of process stations 300 may be included in a common low pressure process tool environment. For example, FIG. 4 depicts an embodiment of a multi-station processing tool 400, such as a VECTOR® processing tool available from Lam Research Corporation, Fremont, CA. In some embodiments, one or more hardware parameters of the process station 300 including those discussed in detail below may be adjusted programmatically by one or more computer controllers 350.

A process station may be configured as a module in a cluster tool. FIG. 6 depicts a semiconductor process cluster tool architecture with vacuum-integrated deposition and patterning modules suitable for implementation of the embodiments described herein. Such a cluster process tool architecture can include resist deposition, resist exposure (EUV scanner), resist dry development and etch modules, as described herein with reference to FIG. 5 and FIG. 6.

In some embodiments, certain of the processing functions can be performed consecutively in the same module, for example dry development and etch. And embodiments of this disclosure are directed to methods and apparatus for receiving a wafer, including a photopatterned EUV resist thin film layer disposed on a layer or layer stack to be etched, to a dry development/etch chamber following photopatterning in an EUV scanner; dry developing photopatterned EUV resist thin film layer; and then etching the underlying layer using the patterned EUV resist as a mask, as described herein.

Returning to FIG. 3, process station 300 fluidly communicates with reactant delivery system 301*a* for delivering process gases to a distribution showerhead 306 by a connection 305. Reactant delivery system 301*a* optionally includes a mixing vessel 304 for blending and/or conditioning process gases, for delivery to showerhead 306. One or more mixing vessel inlet valves 320 may control introduction of process gases to mixing vessel 304. Where plasma exposure is used, plasma may also be delivered to the showerhead 306 or may be generated in the process station 300.

FIG. 3 includes an optional vaporization point 303 for vaporizing liquid reactant to be supplied to the mixing vessel 304. In some embodiments, a liquid flow controller (LFC) upstream of vaporization point 303 may be provided for controlling a mass flow of liquid for vaporization and delivery to process station 300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 306 distributes process gases toward substrate 312. In the embodiment shown in FIG. 3, the substrate 312 is located beneath showerhead 306 and is shown resting on a pedestal 308. Showerhead 306 may have any suitable shape and may have any suitable number and arrangement of ports for distributing process gases to substrate 312.

In some embodiments, pedestal 308 may be raised or lowered to expose substrate 312 to a volume between the substrate 312 and the showerhead 306. It will be appreciated that, in some embodiments, pedestal height may be adjusted programmatically by a suitable computer controller 350.

In some embodiments, pedestal 308 may be temperature controlled via heater 310. In some embodiments, the pedestal 308 may be heated to a temperature of greater than 0° C. and up to 300° C. or more, for example 50° C. to 120° C., such as about 65° C. to 80° C., during non-plasma thermal exposure of a photopatterned resist to dry development chemistry, such as HBr, HCl, or $BCl_3$, as described in disclosed embodiments.

Further, in some embodiments, pressure control for process station 300 may be provided by a butterfly valve 318. As shown in the embodiment of FIG. 3, butterfly valve 318 throttles a vacuum provided by a downstream vacuum pump (not shown). However, in some embodiments, pressure control of process station 300 may also be adjusted by varying a flow rate of one or more gases introduced to the process station 300.

In some embodiments, a position of showerhead 306 may be adjusted relative to pedestal 308 to vary a volume between the substrate 312 and the showerhead 306. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers 350.

Where plasma may be used, for example in gentle plasma-based deposition embodiments and/or dry development embodiments and/or etch operations conducted in the same chamber, showerhead 306 and pedestal 308 electrically communicate with a radio frequency (RF) power supply 314 and matching network 316 for powering a plasma 307. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are up to about 500 W.

In some embodiments, instructions for a controller 350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of a dry development chemistry reactant gas, such as HBr or HCl, and time delay instructions for the recipe phase. In some embodiments, the controller 350 may include any of the features described below with respect to system controller 450 of FIG. 4.

As described above, one or more process stations may be included in a multi station processing tool. FIG. 4 shows a schematic view of an embodiment of a multi station processing tool 400 with an inbound load lock 402 and an outbound load lock 404, either or both of which may include a remote plasma source. A robot 406 at atmospheric pressure is configured to move wafers from a cassette loaded through a pod 408 into inbound load lock 402 via an atmospheric port 410. A wafer is placed by the robot 406 on a pedestal 412 in the inbound load lock 402, the atmospheric port 410 is closed, and the load lock is pumped down. Where the inbound load lock 402 includes a remote plasma source, the wafer may be exposed to a remote plasma treatment to treat the silicon nitride surface in the load lock prior to being introduced into a processing chamber 414. Further, the wafer also may be heated in the inbound load lock 402 as well, for example, to remove moisture and adsorbed gases. Next, a chamber transport port 416 to processing chamber 414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 414 includes four process stations, numbered from 1 to 4 in the embodiment shown in FIG. 4. Each station has a heated pedestal (shown at 418 for station 1), and gas line inlets. It will be appreciated that in some embodiments, each process station may have different or multiple purposes. For example, in some embodiments, a process station may be switchable between dry development and etch process modes. Additionally or alternatively, in some embodiments, processing chamber 414 may include one or more matched pairs of dry development and etch process stations. While the depicted processing chamber 414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 depicts an embodiment of a wafer handling system 490 for transferring wafers within processing chamber 414. In some embodiments, wafer handling system 490 may transfer wafers between various process stations and/or between a process station and a load lock. It will be appreciated that any suitable wafer handling system may be employed. Non limiting examples include wafer carousels and wafer handling robots. FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog, and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 400. System control software 458 may be configured in any suitable way. For example, various process tool component subroutines or control objects may be written to control operation of the process tool components used to carry out various process tool processes. System control software 458 may be coded in any suitable computer readable programming language.

In some embodiments, system control software 458 may include input/output control (IOC) sequencing instructions for controlling the various parameters described above. Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 418 and to control the spacing between the substrate and other parts of process tool 400.

A process gas control program may include code for controlling various gas compositions (e.g., HBr or HCl gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 450 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 450 may provide program instructions for implementing the above-described deposition processes. The program instructions may control a variety of process parameters, such as DC power level, RF bias power level, pressure, temperature, etc. The instructions may control the parameters to operate dry development and/or etch processes according to various embodiments described herein.

The system controller 450 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 450.

In some implementations, the system controller 450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 450, in some implementations, may be a part of or coupled to a computer that is integrated with, coupled to the system, otherwise networked to the system, or a combination thereof. For example, the system controller 450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 450 receives instructions in the form of data, which specify parameters for each of the processing steps to be performed during one or more operations. It should be understood that the parameters may be specific to the type of process to be performed and the type of tool that the system controller 450 is configured to interface with or control. Thus, as described above, the system controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the system controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 5:
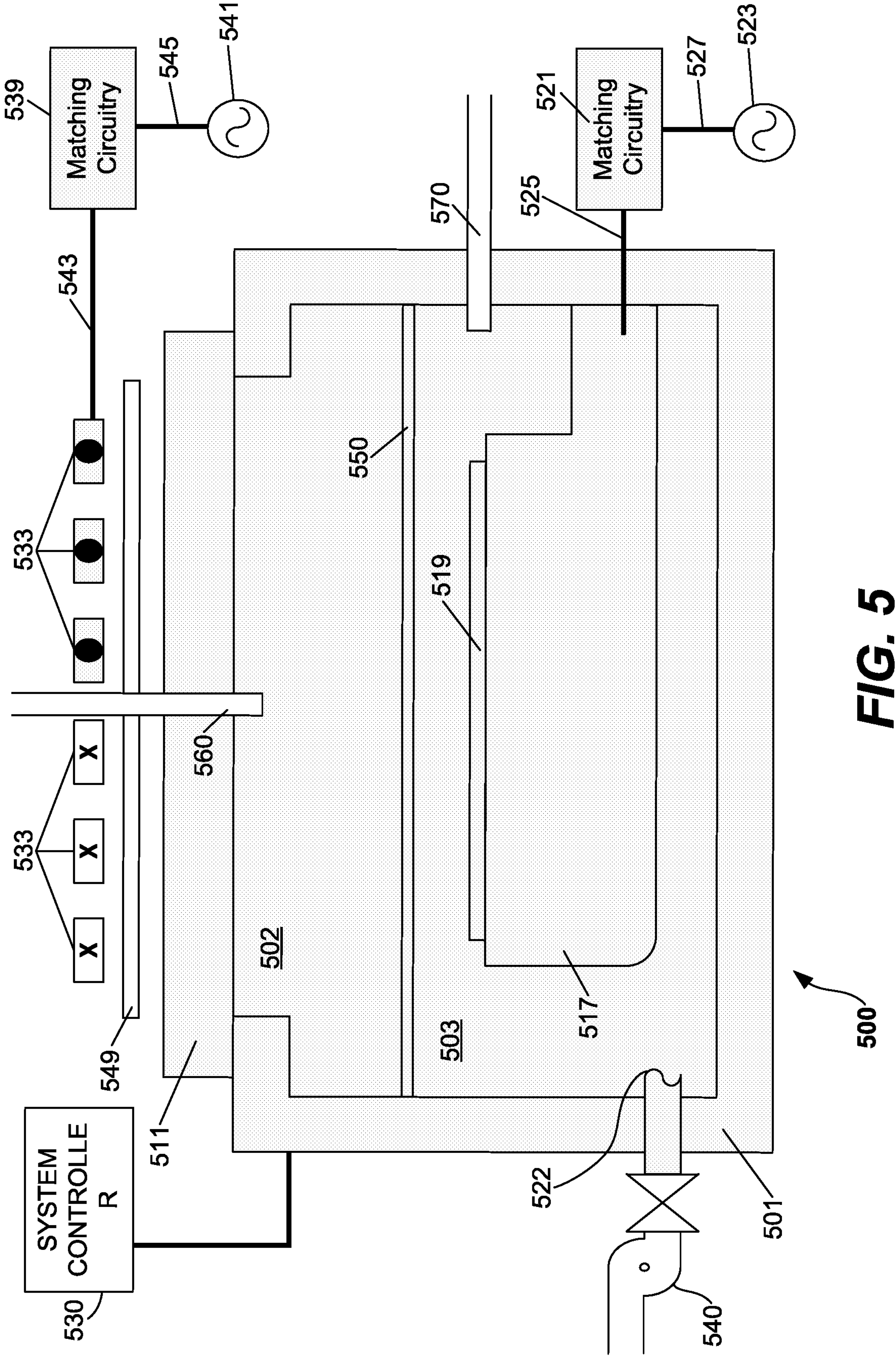
FIG. 5 presents a schematic illustration of an embodiment of an inductively coupled plasma apparatus 500.
Figure 6:
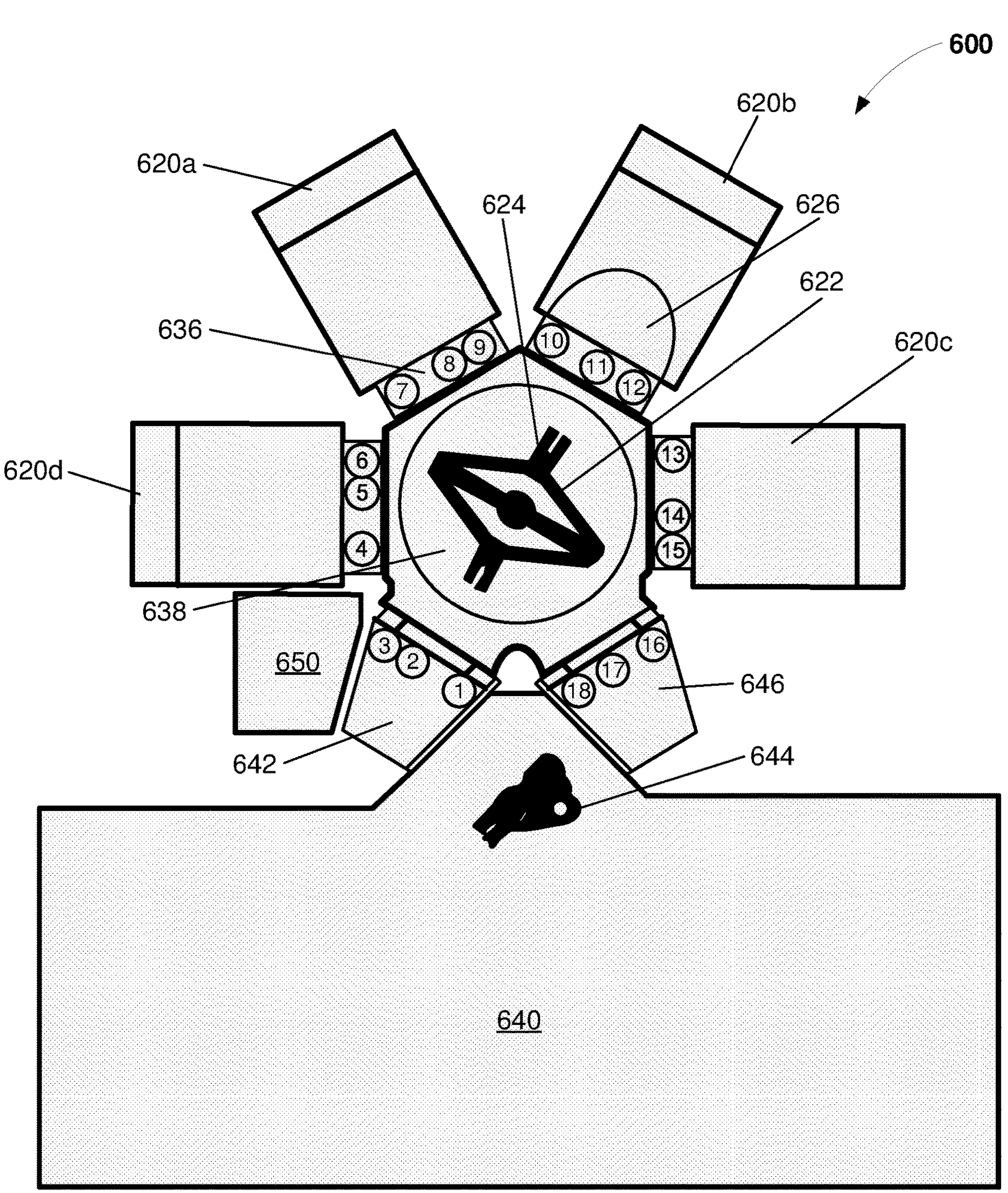
FIG. 6 presents a schematic illustration of an embodiment of a semiconductor process cluster tool architecture 600.

FIG. 5 schematically shows a cross-sectional view of an inductively coupled plasma apparatus 500 appropriate for implementing certain embodiments or aspects of embodiments such as dry development and/or etch, an example of which is a Kiyo® reactor, produced by Lam Research Corp. of Fremont, CA. In other embodiments, other tools or tool types having the functionality to conduct the dry development and/or etch processes described herein may be used for implementation.

The inductively coupled plasma apparatus 500 includes an overall process chamber structurally defined by chamber walls 501 and a window 511. The chamber walls 601 may be fabricated from stainless steel or aluminum. The window 511 may be fabricated from quartz or other dielectric material. An optional internal plasma grid 550 divides the overall process chamber into an upper sub-chamber 502 and a lower sub-chamber 503. In most embodiments, plasma grid 550 may be removed, thereby utilizing a chamber space made of sub-chambers 502 and 503. A chuck 517 is positioned within the lower sub-chamber 503 near the bottom inner surface. The chuck 517 is configured to receive and hold a semiconductor wafer 519 upon which the etching and deposition processes are performed. The chuck 517 can be an electrostatic chuck for supporting the wafer 519 when present. In some embodiments, an edge ring (not shown) surrounds the chuck 517 and has an upper surface that is approximately planar with a top surface of the wafer 519, when present over the chuck 517. The chuck 517 also includes electrostatic electrodes for chucking and dechucking the wafer 519. A filter and DC clamp power supply (not shown) may be provided for this purpose.

Other control systems for lifting the wafer 519 off the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517. In various embodiments, a bias power of the electrostatic chuck may be set at about 50 V or may be set at a different bias power depending on the process performed in accordance with disclosed embodiments. For example, the bias power may be between about 20 V and about 100 V, or between about 30 V and about 150 V.

Elements for plasma generation include a coil 533 positioned above window 511. In some embodiments, a coil is not used in disclosed embodiments. The coil 533 is fabricated from an electrically conductive material and includes at least one complete turn. The example of a coil 533 shown in FIG. 5 includes three turns. The cross sections of coil 533 are shown with symbols, and coils having an "X" extend rotationally into the page, while coils having a "e" extend rotationally out of the page. Elements for plasma generation also include an RF power supply 541 configured to supply RF power to the coil 533. In general, the RF power supply 541 is connected to matching circuitry 539 through a connection 545. The matching circuitry 539 is connected to the coil 533 through a connection 543. In this manner, the RF power supply 541 is connected to the coil 533. An optional Faraday shield 549 is positioned between the coil 533 and the window 511. The Faraday shield 549 may be maintained in a spaced apart relationship relative to the coil 533. In some embodiments, the Faraday shield 549 is disposed immediately above the window 511. In some embodiments, a Faraday shield is between the window 511 and the chuck 517. In some embodiments, the Faraday shield is not maintained in a spaced apart relationship relative to the coil 533. For example, a Faraday shield may be directly below the window without a gap. The coil 533, the Faraday shield 549, and the window 511 are each configured to be substantially parallel to one another. The Faraday shield 549 may prevent metal or other species from depositing on the window 511 of the process chamber.

Process gases may be flowed into the process chamber through one or more main gas flow inlets 560 positioned in the upper sub-chamber 502 and/or through one or more side gas flow inlets 570. Likewise, though not explicitly shown, similar gas flow inlets may be used to supply process gases to a capacitively coupled plasma processing chamber. A vacuum pump, e.g., a one or two stage mechanical dry pump and/or turbomolecular pump 540, may be used to draw process gases out of the process chamber and to maintain a pressure within the process chamber. For example, the vacuum pump may be used to evacuate the lower sub-chamber 503 during a purge operation of ALD. A valve-controlled conduit may be used to fluidically connect the vacuum pump to the process chamber so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 500, one or more process gases may be supplied through the gas flow inlets 560 and/or 570. In certain embodiments, process gas may be supplied only through the main gas flow inlet 560, or only through the side gas flow inlet 570. In some cases, the gas flow inlets shown in the figure may be replaced by more complex gas flow inlets, one or more showerheads, for example. The Faraday shield 549 and/or optional grid 550 may include internal channels and holes that allow delivery of process gases to the process chamber. Either or both of Faraday shield 549 and optional grid 550 may serve as a showerhead for delivery of process gases. In some embodiments, a liquid vaporization and delivery system may be situated upstream of the process chamber, such that once a liquid reactant or precursor is vaporized, the vaporized reactant or precursor is introduced into the process chamber via a gas flow inlet 560 and/or 570.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The physical and chemical interactions of various generated ions and radicals with the wafer 519 etch features of and selectively deposit layers on the wafer 519.

If the plasma grid 550 is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the amount of hot electrons in the lower sub-chamber 503. In some embodiments, the apparatus 600 is designed and operated such that the plasma present in the lower sub-chamber 503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 503 through port 522. The chuck 517 disclosed herein may operate at elevated temperatures ranging between about 10° C. and about 250° C. The temperature will depend on the process operation and specific recipe.

Apparatus 500 may be coupled to facilities (not shown) when installed in a clean room or a fabrication facility. Facilities include plumbing that provide processing gases, vacuum, temperature control, and environmental particle control. These facilities are coupled to apparatus 500, when installed in the target fabrication facility. Additionally, apparatus 500 may be coupled to a transfer chamber that allows robotics to transfer semiconductor wafers into and out of apparatus 500 using typical automation.

In some embodiments, a system controller 530 (which may include one or more physical or logical controllers) controls some or all of the operations of a process chamber. The system controller 530 may include one or more memory devices and one or more processors. In some embodiments, the apparatus 500 includes a switching system for controlling flow rates and durations when disclosed embodiments are performed. In some embodiments, the apparatus 500 may have a switching time of up to about 600 ms, or up to about 750 ms. Switching time may depend on the flow chemistry, recipe chosen, reactor architecture, and other factors.

In some implementations, the system controller 530 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 530, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 530 receives instructions in the form of data, which specify parameters for each of the processing steps to be performed during one or more operations. It should be understood that the parameters may be specific to the type of process to be performed and the type of tool that the controller is configured to interface with or control. Thus, as described above, the system controller 530 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWINSCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 6 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some implementations.

FIG. 6 depicts a semiconductor process cluster tool architecture with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 638 interfaces with four processing modules 620*a*-620*d*, which may be individually optimized to perform various fabrication processes. By way of example, processing modules 620*a*-620*d* may be implemented to perform deposition, evaporation, ELD, dry development, etch, strip, and/or other semiconductor processes. For example, module 620*a* may be an ALD reactor that may be operated to perform in a non-plasma, thermal atomic layer depositions as described herein, such as a Vector tool, available from Lam Research Corporation, Fremont, CA. And module 620*b* may be a PECVD tool, such as the Lam Vector®. It should be understood that the figure is not necessarily drawn to scale.

Airlocks 642 and 646, also known as a loadlocks or transfer modules, interface with the VTM 638 and a patterning module 640. For example, as noted above, a suitable patterning module may be the TWINSCAN NXE: 3300B® platform supplied by ASML of Veldhoven, NL. This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 6 but without the integrated patterning module.

Airlock 642 may be an "outgoing" loadlock, referring to the transfer of a substrate out from the VTM 638 serving a deposition module 620*a* to the patterning module 640, and airlock 646 may be an "ingoing" loadlock, referring to the transfer of a substrate from the patterning module 640 back in to the VTM 638. The ingoing loadlock 646 may also provide an interface to the exterior of the tool for access and egress of substrates. Each process module has a facet that interfaces the module to VTM 638. For example, deposition process module 620*a* has facet 636. Inside each facet, sensors, for example, sensors 1-18 as shown, are used to detect the passing of wafer 626 when moved between respective stations. Patterning module 640 and airlocks 642 and 646 may be similarly equipped with additional facets and sensors, not shown.

Main VTM robot 622 transfers wafer 626 between modules, including airlocks 642 and 646. In one embodiment, robot 622 has one arm, and in another embodiment, robot 622 has two arms, where each arm has an end effector 624 to pick wafers such as wafer 626 for transport. Front-end robot 644, in is used to transfer wafers 626 from outgoing airlock 642 into the patterning module 640, from the patterning module 640 into ingoing airlock 646. Front-end robot 644 may also transport wafers 626 between the ingoing loadlock and the exterior of the tool for access and egress of substrates. Because ingoing airlock module 646 has the ability to match the environment between atmospheric and vacuum, the wafer 626 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 642 may provide this function by holding the transferred wafers at a lower pressure, no higher than the pressure in the patterning module 640, for a period of time and exhausting any off-gassing, so that the optics of the patterning tool 640 are not contaminated by off-gassing from the substrate. A suitable pressure for the outgoing, off-gassing airlock is no more than 1E-8 Torr.

In some embodiments, a system controller 650 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 650 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, dry developing the photopatterned resist, and etching the underlying layer or layer stack using the patterned resist as a mask.

It should be noted that the computer controlling the wafer movement can be local to the cluster architecture or can be located external to the cluster architecture in the manufacturing floor, or in a remote location and connected to the cluster architecture via a network.

EXAMPLES

Example 1: Inclusion of Xenon as a Sensitizer

Xenon possesses a high photoabsorption cross-section, e.g., about 1.16E+05 $cm^2/g$. Xenon is a gas under standard pressure and temperature conditions, having a density of about 0.01 $g/cm^3$. Thus, the inclusion of xenon as a sensitizer within a film can employ xenon in gas form.

As an inert gas, xenon would not interfere in the gas phase polymerization reactions needed for deposition of the EUV resist material. However, any xenon that is physically trapped within the PR film in the solid phase may produce primary and secondary photoelectrons. In this way, use of xenon as the sensitizer provides a sensitized film having enhanced harvesting of EUV photons for bond cleavage. Exemplar embodiments for including xenon are provided herein.

In one embodiment, xenon is employed within a vapor delivery system. In particular, xenon can be employed as a push gas for the EUV resist material (or its precursor) in a vapor delivery system and/or as the push gas for a counter-reactant (e.g., $H_2O$ or other hydroxyl sources such as alcohols). The push gas, in turn, can be directed into the deposition chamber.

In another embodiment, xenon is employed as a bubbler gas within a vapor delivery system. For instance, the xenon can be bubbled through the EUV resist material (or its precursor) in liquid form, and the xenon vapor can be directed into the deposition chamber. In another instance, the xenon can be bubbled through the counter-reactant in liquid form, and the resultant xenon vapor can be directed into the deposition chamber.

In one embodiment, the xenon is employed as a dilutant gas, which can be employed to dilute any gas stream employed within a vapor delivery system connected to a deposition chamber. The gas stream can include any useful compound, such as a EUV resist material, a precursor of the EUV resist material, or the counter-reactant in vapor form; and the dilutant can be used to dilute any of these gas streams.

In one embodiment, the deposition process is fractured into smaller increments within the deposition chamber. For instance, the first increment can include delivery with an EUV resist material or a precursor thereof, and the second increment can include exposure to xenon. The deposition process can then include alternating the first increment and the second increment until the desired film is deposited. In some embodiments, the second increment can include providing the xenon at a higher pressure than the pressure employed during deposition, e.g., a higher pressure that is 10 times to 100 times the pressure of the deposition process. In particular embodiments, the second increment includes providing xenon at a pressure of about 100 mTorr to 1000 Torr, such as about 100 mTorr to 100 Torr.

In another embodiment, a PR layer including an EUV resist material is treated with a PAB in the presence of xenon. In some embodiments, the PAB step is performed at high temperatures under a Xe rich ambient. Non-limiting temperatures include from about 90° C. to 250° C., such as 90° C. to 190° C., for PAB, and about 170° C. to 250° C. or more, such as 190° C. to 240° C. In other embodiments, the PAB step can be performed under a downstream discharge devoid of photons but rich in Xe ions and radicals by striking a plasma in xenon.

In one embodiment, the EUV resist material (or its precursor) is outgassed, and then xenon is infused into the deposition chamber. Outgassing can occur by employing a PAB step and/or by applying vacuum to provide a lower pressure. Xenon infusion can occur under any useful condition to promote infusion efficiency and density, such as infusion under high pressure and/or lower temperature. In some embodiments, infusion of xenon occurs under high pressure and then temperature is lowered.

In another embodiments, deposition of the resist material can be tuned to promote enhanced incorporation of xenon. For instance, in one embodiment, deposition can include conditions (e.g., a low temperature deposition) that provide a lower density of the EUV resist material within the PR film, thus allowing increased incorporation of xenon into the film (e.g., by any method herein, such as providing xenon as a push gas, bubbler gas, dilutant, ambient gas, infusion, etc.).

In one embodiment, xenon can be provided at a residual level within the deposition chamber, thereby providing a background level of xenon during deposition of the EUV resist material. Such a residual level can be implemented by employing xenon-admixed plasma chemistry in a post-deposition process to clean the deposition chamber. In this way, the cleaning operation deliberately provides a background level of xenon in the deposition chamber for the next product wafer that enters the chamber for deposition.

In another embodiment, the xenon gas can be reused and recycled. For instance, unreacted xenon can be collected before, after, or during deposition or post-application bake processes; and the collected xenon gas can be reused in any process described herein.

In one embodiment, xenon possesses a graded density within the sensitized film. In one embodiment, the density of xenon is graded from heavier at the bottom of the film to lighter at the top of the film. In general, a film possesses lower EUV absorption at the bottom of the film, and inclusion of additional xenon at the bottom of the film have provide additional EUV absorption, as compared to a film lacking xenon. By controlling the density gradient of xenon with the film, the sensitized film can have a uniform EUV absorption throughout its thickness.

Such a gradient can be implemented in any useful way. For instance, increased xenon can be deposited by increasing the flow of xenon within the vapor delivery system (e.g., as a push gas, bubbler gas, or dilutant), and decreased xenon can be deposited by decreased the flow of xenon or diluting the xenon gas stream with an inert carrier gas or an inert non-photoactive carrier gas (e.g., any described herein, such as He or Ar).

In another embodiment, any useful form of xenon can be delivered during deposition or the PAB. In one instance, heavier (but radioactively stable) isotopes of xenon can be employed, such as $^{133}$Xe or $^{136}$Xe. Without wishing to be limited by mechanism, use of heavier isotopes can increase its incorporation into the PR film when used as a push gas during deposition, as a bubbler gas during deposition, as a dilutant during deposition, or as an interlaced exposure gas during deposition. In another instance, lighter isotopes of xenon can be employed, such as $^{129}$Xe. Without wishing to be limited by mechanism, use of lighter isotopes can increase its diffusion into a deposited PR film when used as an ambient gas during PAB.

In further embodiments, any of the processes described herein (e.g., within this Example) can be combined to provide a sensitized film.

Example 2: Inclusion of Iodine as a Sensitizer

Iodine possesses a high photoabsorption cross-section, e.g., about 1.10E+05 cm$^2$/g. Iodine is a gas under standard pressure and temperature conditions, having a density of about 4.93 g/cm$^3$. Furthermore, iodine can be included as a heteroatom within a EUV resist material or a precursor thereof. Thus, the inclusion of iodine as a sensitizer within a film can employ an iodine-containing compound in gas form or an iodine-containing compound provided in vapor form that is carried in an inert carrier gas.

In one embodiment, the deposition process is fractured into smaller increments within the deposition chamber. For instance, the first increment can include delivery with an EUV resist material or a precursor thereof, and the second increment can include exposure to iodine-containing compounds (e.g., HI or $I_2$). The deposition process can then include alternating the first increment and the second increment until the desired film is deposited. In some embodiments, the second increment can include providing the iodine-containing compound at a higher pressure than the pressure employed during deposition, e.g., a higher pressure that is 10 times to 100 times the pressure of the deposition process. In particular embodiments, the second increment includes providing the iodine-containing compound at a pressure of about 100 mTorr to 1000 Torr, such as about 100 mTorr to 100 Torr.

In another embodiment, a PR layer including an EUV resist material is treated with a PAB in the presence of an iodine-containing compound. In some embodiments, the PAB step is performed at high temperatures under an iodine rich ambient. Non-limiting temperatures include from about 90° C. to 250° C., such as 90° C. to 190° C., for PAB, and about 170° C. to 250° C. or more, such as 190° C. to 240° C. In other embodiments, the PAB step can be performed under a downstream discharge devoid of photons but rich in I ions and radicals by striking a plasma in iodine.

In one embodiment, iodine can be provided at a residual level within the deposition chamber, thereby providing a background level of iodine during deposition of the EUV resist material. Such a residual level can be implemented by employing iodine-admixed plasma chemistry (e.g., HI-based plasma chemistry) in a post-deposition process to clean the deposition chamber. In this way, the cleaning operation deliberately provides a background level of iodine in the deposition chamber for the next product wafer that enters the chamber for deposition.

In one embodiment, the EUV resist material (or its precursor) is outgassed, and then iodine-containing compound (e.g., $I_2$ or HI) is infused into the deposition chamber. Outgassing can occur by employing a PAB step and/or by applying vacuum to provide a lower pressure. Infusion can occur under any useful condition to promote infusion efficiency and density, such as infusion under high pressure and/or lower temperature. In some embodiments, infusion of the iodine-containing compound occurs under high pressure and then temperature is lowered.

In another embodiment, deposition of the resist material can be tuned to promote enhanced incorporation of an iodine-containing compound (e.g., HI). For instance, in one embodiment, deposition can include conditions (e.g., a low temperature deposition) that provide a lower density of the EUV resist material within the PR film, thus allowing increased incorporation of an iodine-containing compound into the film (e.g., by any method herein, such as providing xenon as a push gas, bubbler gas, dilutant, ambient gas, infusion, etc.).

In one embodiment, the iodine-containing compound is an EUV resist material or a precursor thereof including one or more iodo substitutions. In one embodiment, the precursor includes an iodo substitution in the β-position of an alkyl group included in the precursor. In another embodiment, the precursor includes an iodo substitution in the α-position of an alkyl group included in the precursor.

In one embodiment, the iodine-containing compound possesses a graded density within the sensitized film. In one embodiment, the density of the iodine is graded from heavier at the bottom of the film to lighter at the top of the film. In general, a film possesses lower EUV absorption at the bottom of the film, and inclusion of additional iodine at the bottom of the film have provide additional EUV absorption, as compared to a film lacking iodine. By controlling the density gradient of iodine with the film, the sensitized film can have a uniform EUV absorption throughout its thickness.

Such a gradient can be implemented in any useful way. For instance, increased iodine can be deposited by increasing the flow of the iodine-containing compound within the vapor delivery system (e.g., as a push gas, bubbler gas, or dilutant), and decreased xenon can be deposited by decreased the flow of the iodine-containing compound or diluting the iodine-containing gas stream with an inert carrier gas or an inert non-photoactive carrier gas (e.g., any described herein, such as He or Ar).

In another embodiment, the iodine-containing compound (e.g., $I_2$ or HI) can be reused and recycled. For instance, unreacted iodine-containing compound can be collected before, after, or during deposition or post-application bake processes; and the collected iodine-containing compound can be reused in any process described herein.

In further embodiments, any of the processes described herein (e.g., within this Example) can be combined to provide a sensitized film.

CONCLUSION

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A stack comprising:

a semiconductor substrate having a top surface; and a sensitized film disposed on the top surface of the semiconductor substrate, wherein the film comprises an Extreme Ultraviolet (EUV) resist material and an EUV sensitizer dispersed throughout the film, and wherein the EUV resist material comprises organometallic material, wherein the organometallic material comprises an iodo-substituted alkyl group.

2. The stack of claim 1, wherein the EUV sensitizer comprises iodine or xenon.

3. The stack of claim 2, wherein the EUV sensitizer is $I_2$, HI, a precursor thereof, $^{133}$Xe, $^{136}$Xe, $^{129}$Xe, or a combination of any of these isotopes for xenon.

* * * * *